(12) United States Patent
Atwater et al.

(10) Patent No.: US 11,362,228 B2
(45) Date of Patent: Jun. 14, 2022

(54) LARGE-SCALE SPACE-BASED SOLAR POWER STATION: EFFICIENT POWER GENERATION TILES

(71) Applicant: California Institute of Technology, Pasadena, CA (US)

(72) Inventors: Harry A. Atwater, South Pasadena, CA (US); Sergio Pellegrino, Pasadena, CA (US); Seyed Ali Hajimiri, La Canada, CA (US); Jeffrey P. Bosco, Los Angeles, CA (US); Dennis Callahan, Los Angeles, CA (US); Emily C. Warmann, Riverside, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/728,985

(22) Filed: Jun. 2, 2015

(65) Prior Publication Data
US 2016/0056321 A1 Feb. 25, 2016

Related U.S. Application Data

(60) Provisional application No. 62/006,604, filed on Jun. 2, 2014, provisional application No. 62/120,650, filed on Feb. 25, 2015.

(51) Int. Cl.
*H01L 31/054* (2014.01)
*H01L 31/052* (2014.01)
(Continued)

(52) U.S. Cl.
CPC .......... *H01L 31/0547* (2014.12); *B64G 1/222* (2013.01); *B64G 1/42* (2013.01);
(Continued)

(58) Field of Classification Search
CPC ......... H01L 31/0547; H01L 31/022433; H01L 31/052; H01L 31/0304; H02S 40/22;
(Continued)

(56) References Cited

U.S. PATENT DOCUMENTS 2,599,944 A 6/1952 Salisbury et al.
3,152,260 A 10/1964 Cummiogs et al.
(Continued)

FOREIGN PATENT DOCUMENTS

CA 2833826 A1 11/2012
CA 2833862 A1 5/2014
(Continued)

OTHER PUBLICATIONS

US 10,291,030 B2, 05/2019, Pellegrino et al. (withdrawn)
(Continued)

*Primary Examiner* — Niki Bakhtiari
(74) *Attorney, Agent, or Firm* — KPPB LLP

(57) ABSTRACT

A space-based solar power station, a power generating satellite module and/or a method for collecting solar radiation and transmitting power generated using electrical current produced therefrom is provided. Each solar power station includes a plurality of satellite modules. The plurality of satellite modules each include a plurality of modular power generation tiles including a photovoltaic solar radiation collector, a power transmitter and associated control electronics. Numerous embodiments relate to efficient power generation tiles. In one embodiment, an efficient power generation tile includes: at least one photovoltaic material; and at least one concentrator that redirects incident solar radiation towards a photovoltaic material such that the photovoltaic material experiences a greater solar flux relative to the case where the photovoltaic material experiences unaltered solar radiation.

18 Claims, 33 Drawing Sheets

(51) Int. Cl.
| | |
|---|---|
| *H02S 40/22* | (2014.01) |
| *H02S 40/42* | (2014.01) |
| *H02S 50/00* | (2014.01) |
| *H02S 30/20* | (2014.01) |
| *B64G 1/42* | (2006.01) |
| *B64G 1/44* | (2006.01) |
| *B64G 1/22* | (2006.01) |
| *H02S 20/30* | (2014.01) |
| *H01L 31/0224* | (2006.01) |
| *H01L 31/0304* | (2006.01) |
| *H01L 31/0687* | (2012.01) |
| *H01L 31/0693* | (2012.01) |

(52) U.S. Cl.
CPC ........... *B64G 1/428* (2013.01); *B64G 1/44* (2013.01); *H01L 31/022433* (2013.01); *H01L 31/0304* (2013.01); *H01L 31/052* (2013.01); *H01L 31/0687* (2013.01); *H01L 31/0693* (2013.01); *H02S 20/30* (2014.12); *H02S 30/20* (2014.12); *H02S 40/22* (2014.12); *H02S 40/42* (2014.12); *H02S 50/00* (2013.01); *Y02E 10/52* (2013.01)

(58) Field of Classification Search
CPC ......... H02S 40/42; H02S 30/20; B64G 1/222; B64G 1/42; B64G 1/428; B64G 1/44; Y02E 10/52
USPC .................................. 136/243–265
See application file for complete search history.

(56) References Cited

U.S. PATENT DOCUMENTS

| | | | |
|---|---|---|---|
| 3,419,433 A | 12/1968 | Slifer, Jr. | |
| 3,427,200 A | 2/1969 | Philip et al. | |
| 3,433,677 A | 3/1969 | Robinson et al. | |
| 3,437,527 A | 4/1969 | Iles | |
| 3,457,427 A | 7/1969 | Tarneja et al. | |
| 3,489,915 A | 1/1970 | Richard et al. | |
| 3,530,009 A | 9/1970 | Dick et al. | |
| 3,532,299 A | 10/1970 | Baker et al. | |
| 3,562,020 A | 2/1971 | Blevins | |
| 3,611,652 A | 10/1971 | Rabenhorst et al. | |
| 3,616,528 A | 11/1971 | Goldsmith et al. | |
| 3,627,585 A | 12/1971 | Neville et al. | |
| 3,636,539 A | 1/1972 | Gaddy | |
| 3,698,958 A | 10/1972 | Baker et al. | |
| 3,730,457 A | 5/1973 | Williams et al. | |
| 3,735,943 A | 5/1973 | Fayet et al. | |
| 3,758,051 A | 9/1973 | Williams | |
| 3,781,647 A | 12/1973 | Glaser et al. | |
| 3,785,590 A | 1/1974 | Wentworth | |
| 3,793,082 A | 2/1974 | Roger | |
| 3,805,622 A | 4/1974 | Kinard | |
| 3,809,337 A | 5/1974 | Andrews et al. | |
| 3,817,477 A | 6/1974 | Okumura et al. | |
| 3,848,821 A | 11/1974 | Scheel et al. | |
| 3,863,870 A | 2/1975 | Andrews | |
| 3,952,324 A | 4/1976 | Wolff et al. | |
| 3,989,994 A | 11/1976 | Brown et al. | |
| 4,078,747 A | 3/1978 | Minovitch et al. | |
| 4,116,258 A | 9/1978 | Slysh et al. | |
| 4,133,501 A | 1/1979 | Pentlicki | |
| 4,151,872 A | 5/1979 | Slysh et al. | |
| 4,153,474 A * | 5/1979 | Rex | H01L 31/0547 136/246 |
| 4,155,524 A | 5/1979 | Marello et al. | |
| 4,166,919 A | 9/1979 | Carlson | |
| 4,234,856 A | 11/1980 | Jung et al. | |
| 4,282,394 A | 8/1981 | Nordwall et al. | |
| 4,328,389 A | 5/1982 | Peterson et al. | |
| 4,415,759 A | 11/1983 | Copeland et al. | |
| 4,416,052 A | 11/1983 | Stern et al. | |
| 4,419,532 A | 12/1983 | Severns et al. | |
| 4,687,880 A | 8/1987 | Morris et al. | |
| 4,735,488 A | 4/1988 | Rancourt et al. | |
| 4,780,726 A | 10/1988 | Archer et al. | |
| 4,784,700 A | 11/1988 | Mildice et al. | |
| 4,789,989 A | 12/1988 | Stern et al. | |
| 4,850,031 A | 7/1989 | Allsop et al. | |
| 4,947,825 A | 8/1990 | Moriarty | |
| 4,953,190 A | 8/1990 | Kukoleck et al. | |
| 5,013,128 A | 5/1991 | Stern et al. | |
| 5,114,101 A | 5/1992 | Stern et al. | |
| 5,131,955 A | 7/1992 | Lawrence et al. | |
| 5,154,777 A | 10/1992 | Stone et al. | |
| 5,177,396 A | 1/1993 | Gielen et al. | |
| 5,180,441 A | 1/1993 | Cornwall et al. | |
| 5,226,107 A | 7/1993 | Stern et al. | |
| 5,280,441 A | 1/1994 | Wada et al. | |
| 5,309,925 A | 5/1994 | Policastro | |
| 5,310,141 A | 5/1994 | Grob et al. | |
| 5,337,980 A | 8/1994 | Homer et al. | |
| 5,344,496 A * | 9/1994 | Stern | H01L 31/0547 136/246 |
| 5,404,868 A | 4/1995 | Sankrithi | |
| 5,428,483 A | 6/1995 | Sato et al. | |
| 5,487,791 A | 1/1996 | Everman et al. | |
| 5,496,414 A | 3/1996 | Harvey et al. | |
| 5,502,451 A | 3/1996 | Rainville et al. | |
| 5,512,913 A | 4/1996 | Staney | |
| 5,520,747 A | 5/1996 | Marks et al. | |
| 5,569,332 A | 10/1996 | Glatfelter et al. | |
| 5,623,119 A | 4/1997 | Yater et al. | |
| 5,653,222 A | 8/1997 | Newman | |
| 5,666,127 A | 9/1997 | Kochiyama et al. | |
| 5,785,280 A | 7/1998 | Baghdasarian | |
| 5,885,367 A | 3/1999 | Whalen et al. | |
| 5,909,299 A | 6/1999 | Sheldon, Jr. et al. | |
| 5,909,860 A | 6/1999 | Lee et al. | |
| 5,969,695 A | 10/1999 | Bassily et al. | |
| 5,984,484 A | 11/1999 | Kruer | |
| 6,017,002 A | 1/2000 | Stribling, Jr. et al. | |
| 6,031,178 A | 2/2000 | Kester | |
| 6,043,425 A * | 3/2000 | Assad | H01L 31/0547 136/246 |
| 6,050,526 A | 4/2000 | Stribling et al. | |
| 6,060,790 A | 5/2000 | Craig, Jr. et al. | |
| 6,091,017 A | 7/2000 | Stern et al. | |
| 6,118,067 A | 9/2000 | Lashley et al. | |
| 6,150,995 A | 11/2000 | Gilger et al. | |
| 6,188,012 B1 | 2/2001 | Ralph et al. | |
| 6,194,790 B1 | 2/2001 | Griffin et al. | |
| 6,195,067 B1 | 2/2001 | Gilger et al. | |
| 6,284,967 B1 | 9/2001 | Seifert et al. | |
| 6,300,558 B1 * | 10/2001 | Takamoto | H01L 31/0735 136/249 |
| 6,343,442 B1 | 2/2002 | Marks et al. | |
| 6,366,255 B1 | 4/2002 | Chiang et al. | |
| 6,366,256 B1 | 4/2002 | Ramanujam et al. | |
| 6,369,545 B1 | 4/2002 | Williams et al. | |
| 6,394,395 B1 | 5/2002 | Poturalski et al. | |
| 6,423,895 B1 | 7/2002 | Foster et al. | |
| 6,429,368 B1 | 8/2002 | Summers et al. | |
| 6,528,716 B2 | 3/2003 | Collette et al. | |
| 6,534,705 B2 | 3/2003 | Berrios et al. | |
| 6,541,916 B2 | 4/2003 | Decker et al. | |
| 6,547,190 B1 | 4/2003 | Lim et al. | |
| 6,555,740 B2 | 4/2003 | Roth et al. | |
| 6,557,804 B1 | 5/2003 | Carroll et al. | |
| 6,560,942 B2 | 5/2003 | Warren et al. | |
| 6,565,044 B1 | 5/2003 | Johnson et al. | |
| 6,577,130 B1 | 6/2003 | Adamo et al. | |
| 6,587,263 B1 | 7/2003 | Chen et al. | |
| 6,590,150 B1 | 7/2003 | Kiefer et al. | |
| 6,635,507 B1 | 10/2003 | Karam et al. | |
| 6,655,638 B2 | 12/2003 | Deel et al. | |
| 6,660,927 B2 | 12/2003 | Zwanenburg | |
| 6,660,928 B1 | 12/2003 | Sinharoy et al. | |
| 6,689,952 B2 | 2/2004 | Kawaguchi et al. | |
| 6,690,252 B2 | 2/2004 | Scoltock, Jr. et al. | |
| 6,713,670 B2 | 3/2004 | Stern et al. | |

(56) References Cited

U.S. PATENT DOCUMENTS

| | | |
|---|---|---|
| 6,735,838 B1 | 5/2004 | Triller et al. |
| 6,735,920 B1 | 5/2004 | Cadogan et al. |
| 6,768,048 B2 | 7/2004 | Woll et al. |
| 6,784,359 B2 | 8/2004 | Zuckermandel et al. |
| 6,799,742 B2 | 10/2004 | Nakamura et al. |
| 6,882,072 B2 | 4/2005 | Wingett et al. |
| 6,897,730 B2 | 5/2005 | Dupuis et al. |
| 6,903,261 B2 | 6/2005 | Collette et al. |
| 6,904,749 B2 | 6/2005 | Joshi et al. |
| 6,909,042 B2 | 6/2005 | Viale et al. |
| 6,936,760 B2 | 8/2005 | Spirnak et al. |
| 6,983,914 B2 | 1/2006 | Stribling et al. |
| 7,006,039 B2 | 2/2006 | Miyamoto et al. |
| 7,053,294 B2 | 5/2006 | Tuttle et al. |
| 7,077,361 B1 | 7/2006 | Rabinowitz |
| 7,138,960 B2 | 11/2006 | Carroll et al. |
| 7,163,179 B1 | 1/2007 | Taylor et al. |
| 7,211,722 B1 | 5/2007 | Murphy |
| 7,271,333 B2 | 9/2007 | Yehle et al. |
| 7,301,095 B2 | 11/2007 | Murphy et al. |
| 7,303,166 B2 | 12/2007 | Geery et al. |
| 7,319,189 B2 | 1/2008 | Collette et al. |
| 7,354,033 B1 | 4/2008 | Murphey et al. |
| 7,392,011 B1 | 6/2008 | Jacomb-Hood |
| 7,464,895 B2 | 12/2008 | Palmer et al. |
| 7,474,249 B1 | 1/2009 | Williams et al. |
| 7,486,431 B2 | 2/2009 | Rabinowitz et al. |
| 7,564,149 B2 | 7/2009 | Weinbrenner et al. |
| 7,564,628 B2 | 7/2009 | Barth et al. |
| 7,568,479 B2 | 8/2009 | Rabinowitz et al. |
| 7,612,284 B2 | 11/2009 | Spirnak et al. |
| 7,736,007 B2 | 6/2010 | Rabinowitz et al. |
| 7,866,836 B2 | 1/2011 | Rabinowitz et al. |
| 7,878,667 B2 | 2/2011 | Rabinowitz et al. |
| 7,895,795 B1 | 3/2011 | Murphey et al. |
| 7,960,641 B2 | 6/2011 | Rabinowitz |
| 8,071,873 B2 | 12/2011 | Rabinowitz |
| 8,146,867 B2 | 4/2012 | Jordan et al. |
| 8,215,298 B2 | 7/2012 | Klotz |
| 8,308,111 B2 | 11/2012 | Lu et al. |
| 8,432,224 B1 | 4/2013 | Woo et al. |
| 8,439,511 B2 | 5/2013 | Stern et al. |
| 8,616,502 B1 | 12/2013 | Stribling et al. |
| 8,636,253 B1 | 1/2014 | Schmid et al. |
| 8,683,755 B1 | 4/2014 | Spence et al. |
| 8,872,018 B1 | 10/2014 | Breen et al. |
| 9,004,410 B1 | 4/2015 | Stern et al. |
| 9,079,673 B1 | 7/2015 | Stern et al. |
| 9,120,583 B1 | 9/2015 | Spence et al. |
| 9,156,568 B1 | 10/2015 | Spence et al. |
| 9,248,922 B1 | 2/2016 | Baghdasarian et al. |
| 9,276,148 B2 | 3/2016 | Jaffe et al. |
| 9,346,566 B2 | 5/2016 | Spence et al. |
| 9,444,394 B1 | 9/2016 | Thomas et al. |
| 9,709,349 B2 | 7/2017 | Raman et al. |
| 10,144,533 B2 | 12/2018 | Atwater et al. |
| 10,340,698 B2 | 7/2019 | Pellegrino et al. |
| 10,454,565 B2 | 10/2019 | Pellegrino et al. |
| 10,696,428 B2 | 6/2020 | Pellegrino et al. |
| 10,749,593 B2 | 8/2020 | Hajimiri et al. |
| 10,992,253 B2 | 4/2021 | Atwater et al. |
| 11,128,179 B2 | 9/2021 | Hajimiri et al. |
| 2002/0007845 A1 | 1/2002 | Collette et al. |
| 2002/0029796 A1 | 3/2002 | Mikami et al. |
| 2002/0029797 A1 | 3/2002 | Mikami et al. |
| 2002/0032992 A1 | 3/2002 | Roth et al. |
| 2002/0134423 A1 | 9/2002 | Eller et al. |
| 2003/0098057 A1 | 5/2003 | Mizuno et al. |
| 2003/0098058 A1 | 5/2003 | Takada et al. |
| 2003/0192586 A1 | 10/2003 | Takada et al. |
| 2003/0196298 A1 | 10/2003 | Hinkley et al. |
| 2004/0011395 A1 | 1/2004 | Nicoletti et al. |
| 2004/0140930 A1 | 7/2004 | Harles |
| 2004/0187912 A1 | 9/2004 | Takamoto et al. |
| 2004/0231718 A1 | 11/2004 | Umeno et al. |
| 2005/0046977 A1* | 3/2005 | Shifman .................. F24J 2/12 359/853 |
| 2005/0178921 A1 | 8/2005 | Stribling et al. |
| 2005/0241691 A1 | 11/2005 | Wakefield et al. |
| 2005/0257823 A1 | 11/2005 | Zwanenburg et al. |
| 2006/0038083 A1 | 2/2006 | Criswell |
| 2006/0109053 A1 | 5/2006 | Kim et al. |
| 2006/0157103 A1 | 7/2006 | Sheats et al. |
| 2006/0186274 A1 | 8/2006 | Wang et al. |
| 2006/0234694 A1 | 10/2006 | Kawasaki et al. |
| 2007/0029446 A1 | 2/2007 | Mosher et al. |
| 2007/0087704 A1 | 4/2007 | Gilberton |
| 2007/0137690 A1* | 6/2007 | Bruning .................. F24S 23/00 136/246 |
| 2008/0000232 A1 | 1/2008 | Rogers et al. |
| 2008/0055177 A1 | 3/2008 | Dixon |
| 2008/0088409 A1 | 4/2008 | Okada |
| 2008/0149162 A1 | 6/2008 | Martinelli et al. |
| 2008/0173349 A1 | 7/2008 | Liu et al. |
| 2008/0185039 A1 | 8/2008 | Chan |
| 2008/0251113 A1 | 10/2008 | Horne et al. |
| 2008/0283109 A1 | 11/2008 | Mankins et al. |
| 2009/0126792 A1 | 5/2009 | Gruhlke et al. |
| 2009/0133738 A1 | 5/2009 | Shiao et al. |
| 2009/0151769 A1 | 6/2009 | Corbin |
| 2009/0199893 A1 | 8/2009 | Bita et al. |
| 2009/0223554 A1 | 9/2009 | Sharps et al. |
| 2009/0250094 A1 | 10/2009 | Robison et al. |
| 2009/0301544 A1 | 12/2009 | Minelli et al. |
| 2009/0308451 A1 | 12/2009 | Oesterle et al. |
| 2010/0170560 A1 | 7/2010 | Sapienza et al. |
| 2010/0180946 A1 | 7/2010 | Gruhlke et al. |
| 2010/0224231 A1 | 9/2010 | Hoke |
| 2010/0263709 A1 | 10/2010 | Norman et al. |
| 2010/0269885 A1 | 10/2010 | Benitez et al. |
| 2010/0276547 A1 | 11/2010 | Rubenchik et al. |
| 2010/0289342 A1 | 11/2010 | Maness |
| 2010/0300507 A1 | 12/2010 | Heng et al. |
| 2010/0319774 A1 | 12/2010 | Schwartz et al. |
| 2011/0041894 A1 | 2/2011 | Liao |
| 2011/0049992 A1 | 3/2011 | Sant'Anselmo et al. |
| 2011/0061718 A1 | 3/2011 | Fork et al. |
| 2011/0080135 A1 | 4/2011 | Bland |
| 2011/0100425 A1* | 5/2011 | Osamura ............... H01L 31/048 136/246 |
| 2011/0120524 A1 | 5/2011 | Wares et al. |
| 2011/0122016 A1 | 5/2011 | Lomes et al. |
| 2011/0203574 A1* | 8/2011 | Harding .................. F24J 2/055 126/595 |
| 2011/0210209 A1 | 9/2011 | Taylor et al. |
| 2011/0232718 A1 | 9/2011 | Nawab |
| 2011/0300664 A1 | 12/2011 | Chung et al. |
| 2011/0315192 A1 | 12/2011 | Swatek et al. |
| 2012/0019942 A1 | 1/2012 | Morgan et al. |
| 2012/0024362 A1 | 2/2012 | Gossman |
| 2012/0031393 A1 | 2/2012 | Linderman et al. |
| 2012/0041122 A1 | 2/2012 | Hidaka et al. |
| 2012/0125415 A1 | 5/2012 | Tischler et al. |
| 2012/0138749 A1 | 6/2012 | Ellinghaus et al. |
| 2012/0138997 A1* | 6/2012 | Tasaki .................. G02B 5/0808 257/98 |
| 2012/0160299 A1 | 6/2012 | Reid et al. |
| 2012/0243252 A1 | 9/2012 | Kim |
| 2013/0009851 A1 | 1/2013 | Danesh |
| 2013/0032673 A1 | 2/2013 | Kobayashi et al. |
| 2013/0093287 A1* | 4/2013 | Biso ...................... F03G 7/005 310/330 |
| 2013/0099599 A1 | 4/2013 | Jaffe et al. |
| 2013/0133730 A1 | 5/2013 | Pan et al. |
| 2013/0220399 A1 | 8/2013 | Gruhlke et al. |
| 2013/0233974 A1 | 9/2013 | Maiboroda et al. |
| 2013/0234645 A1 | 9/2013 | Goei et al. |
| 2013/0319504 A1 | 12/2013 | Yang et al. |
| 2013/0319505 A1 | 12/2013 | Yang et al. |
| 2013/0332093 A1 | 12/2013 | Adest et al. |
| 2014/0041705 A1 | 2/2014 | Kang et al. |
| 2014/0083479 A1 | 3/2014 | Takayama et al. |
| 2014/0102686 A1 | 4/2014 | Yu et al. |
| 2014/0131023 A1 | 5/2014 | Raman et al. |

(56) References Cited

U.S. PATENT DOCUMENTS

| | | | |
|---|---|---|---|
| 2014/0148197 A1 | 5/2014 | Shields et al. | |
| 2014/0150865 A1* | 6/2014 | Kwon | H01L 31/0549 |
| | | | 136/259 |
| 2014/0158197 A1 | 6/2014 | Rubenstein et al. | |
| 2014/0159636 A1 | 6/2014 | Yang et al. | |
| 2014/0261621 A1 | 9/2014 | Gruhlke et al. | |
| 2014/0261622 A1 | 9/2014 | Floyd et al. | |
| 2014/0263844 A1 | 9/2014 | Cook, Jr. et al. | |
| 2014/0263847 A1 | 9/2014 | Eskenazi et al. | |
| 2014/0326833 A1 | 11/2014 | Spence et al. | |
| 2014/0356613 A1 | 12/2014 | Weisenberger et al. | |
| 2015/0022909 A1 | 1/2015 | O'Neill | |
| 2015/0053253 A1 | 2/2015 | O'Neill | |
| 2015/0130293 A1 | 5/2015 | Hajimiri et al. | |
| 2015/0144740 A1 | 5/2015 | Richardson et al. | |
| 2015/0155413 A1 | 6/2015 | Pokharna et al. | |
| 2015/0217876 A1 | 8/2015 | Halsband | |
| 2015/0244304 A1 | 8/2015 | Ozeki et al. | |
| 2015/0270426 A1 | 9/2015 | Funo et al. | |
| 2016/0065006 A1 | 3/2016 | Woods | |
| 2016/0122041 A1 | 5/2016 | Abrams et al. | |
| 2016/0164451 A1 | 6/2016 | McEnaney et al. | |
| 2016/0376037 A1 | 12/2016 | Pellegrino et al. | |
| 2016/0380486 A1 | 12/2016 | Hajimiri et al. | |
| 2016/0380580 A1 | 12/2016 | Atwater et al. | |
| 2017/0021947 A1 | 1/2017 | Pellegrino et al. | |
| 2017/0025992 A1 | 1/2017 | Atwater et al. | |
| 2017/0047463 A1 | 2/2017 | Hajimiri et al. | |
| 2017/0047886 A1 | 2/2017 | Atwater et al. | |
| 2017/0047889 A1 | 2/2017 | Atwater et al. | |
| 2017/0047987 A1 | 2/2017 | Pellegrino et al. | |
| 2017/0063296 A1 | 3/2017 | Cruijssen et al. | |
| 2018/0315877 A1 | 11/2018 | Kelzenberg et al. | |

FOREIGN PATENT DOCUMENTS

| | | |
|---|---|---|
| CN | 104158471 A | 11/2014 |
| EP | 0541052 A1 | 5/1993 |
| EP | 977273 A1 | 2/2000 |
| EP | 0977273 A1 | 2/2000 |
| EP | 0996170 A2 | 4/2000 |
| EP | 1501132 A2 | 1/2005 |
| EP | 976655 B1 | 9/2005 |
| EP | 1852919 A2 | 11/2007 |
| EP | 1852919 A3 | 2/2009 |
| EP | 2318045 A1 | 5/2011 |
| EP | 3149777 A1 | 4/2017 |
| EP | 3325347 A1 | 5/2018 |
| EP | 3334655 A1 | 6/2018 |
| EP | 3334655 B | 3/2021 |
| EP | 3334655 B1 | 3/2021 |
| EP | 3325347 B1 | 6/2021 |
| FR | 2956774 A1 | 8/2011 |
| GB | 2247564 A | 3/1992 |
| JP | 6298781 A | 5/1987 |
| JP | 63254772 A | 10/1988 |
| JP | 0369258 U | 7/1991 |
| JP | 05107328 A | 4/1993 |
| JP | 06253477 A | 9/1994 |
| JP | H06327173 A | 11/1994 |
| JP | 082500 A | 9/1996 |
| JP | 2000114571 A | 4/2000 |
| JP | 2001088799 A | 4/2001 |
| JP | 2001309581 A | 11/2001 |
| JP | 2002095189 A | 3/2002 |
| JP | 2002362500 A | 12/2002 |
| JP | 2003164077 A | 6/2003 |
| JP | 2003164078 A | 6/2003 |
| JP | 2003191899 A | 7/2003 |
| JP | 2004090817 A | 3/2004 |
| JP | 2004196051 A | 7/2004 |
| JP | 2004253471 A | 9/2004 |
| JP | 2004296658 A | 10/2004 |
| JP | 2009184603 A | 8/2009 |
| JP | 2010259301 A | 11/2010 |
| JP | 6640116 B2 | 1/2020 |
| JP | 6693889 B2 | 4/2020 |
| JP | 6715317 B2 | 6/2020 |
| JP | 6918776 B2 | 7/2021 |
| WO | 2004049538 A2 | 6/2004 |
| WO | WO2008-073905 A2 * | 6/2008 |
| WO | 2009124098 A2 | 10/2009 |
| WO | 2010033632 A2 | 3/2010 |
| WO | 2011006506 A1 | 1/2011 |
| WO | 2011062785 A2 | 5/2011 |
| WO | 2011067772 A1 | 6/2011 |
| WO | 2011109275 A1 | 9/2011 |
| WO | 2011062785 A3 | 11/2011 |
| WO | 2015175839 | 11/2015 |
| WO | 2015175839 A1 | 11/2015 |
| WO | 2015179213 A2 | 11/2015 |
| WO | 2015179214 A2 | 11/2015 |
| WO | 2015187221 A2 | 12/2015 |
| WO | 2015187739 A1 | 12/2015 |
| WO | 2017015508 | 1/2017 |
| WO | 2017015605 | 1/2017 |
| WO | 2017027615 | 2/2017 |
| WO | 2017027617 | 2/2017 |
| WO | 2017027629 | 2/2017 |
| WO | 2017027633 | 2/2017 |

OTHER PUBLICATIONS

International Search Report and Written Opinion for International Application PCT/US2015/030900, Completed Aug. 11, 2015, dated Aug. 13, 2015, 11 pgs.

Arya et al., "Wrapping Thick Membranes with Slipping Folds", American Institute of Aeronautics and Astronautics, date unknown, pp. 1-17.

Delapierre et al., "Spin-Stabilized Membrane Antenna Structures", American Institute of Aeronautics and Astronautics, date unknown, pp. 1-15.

NASA TV, "Solar Power, Origami-Style", printed Aug. 14, 2014 from http://www.nasa.gov/jpl/news/origami-style-power-20140814, 4 pgs.

International Search Report and Written Opinion for International Application PCT/US2015/033841, Report Completed Sep. 10, 2015, dated Sep. 11, 2015, 11 pgs.

International Preliminary Report on Patentability for International Application PCT/US2015/030900, dated Nov. 15, 2016, dated Nov. 24, 2016, 9 Pgs.

International Preliminary Report on Patentability for International Application PCT/US2015/030909, dated Nov. 15, 2016, dated Nov. 24, 2016, 11 Pgs.

International Preliminary Report on Patentability for International Application PCT/US2015/033841, dated Dec. 6, 2016, dated Dec. 15, 2016, 8 Pgs.

International Search Report and Written Opinion for International Application No. PCT/US2015/030895, completed Nov. 27, 2015, dated Nov. 30, 2015, 14 Pgs.

International Search Report and Written Opinion for International Application No. PCT/US2015/030909, completed Nov. 27, 2015, dated Nov. 27, 2015, 13 Pgs.

International Search Report and Written Opinion for International Application No. PCT/US2016/043424, completed Nov. 15, 2016, dated Nov. 15, 2016, 14 Pgs.

International Search Report and Written Opinion for International Application No. PCT/US2016/043677, completed Oct. 21, 2016, dated Oct. 21, 2016, 8 Pgs.

International Search Report and Written Opinion for International Application No. PCT/US2016/046389, completed Nov. 22, 2016, dated Nov. 22, 2016, 11 Pgs.

International Search Report and Written Opinion for International Application No. PCT/US2016/046394, completed Nov. 17, 2016, dated Nov. 17, 2016, 12 Pgs.

International Search Report and Written Opinion for International Application No. PCT/US2016/046415, completed Nov. 17, 2016, dated Nov. 17, 2016, 10 Pgs.

(56) References Cited

OTHER PUBLICATIONS

International Search Report and Written Opinion for International Application No. PCT/US2016/046421, completed Nov. 17, 2016, dated Nov. 17, 2016, 10 Pgs.
Aieta et al., "Multiwavelength achromatic metasurfaces by dispersive phase compensation", Science, vol. 347, Issue 6228, DOI:10.1126/science.aaa2494, Mar. 20, 2015, pp. 1342-1345.
Aoki et al., "A Fully Integrated Quad-Band GSM/GPRS Power Amplifier", IEEE Journal of Solid-State Circuits, vol. 43, Issue 12, Dec. 12, 2008, pp. 2747-2758.
Bakr et al., "Impact of phase and amplitude errors on array performance", UC Berkeley Technical Report No. UCB/EECS-2009-1. Retrieved from http://www.eecs.berkeley.com/Pubs/TechRpts/2009/EECS-2009-1.html, Jan. 1, 2009, 12 pgs.
Bohn et al., "Fully Integrated Frequency and Phase Generation for a 6-18GHz Tunable Multi-Band Phased-Array Receiver in CMOS", Radio Frequency Integrated Circuits Symposium (RFIC), Apr. 17-Jun. 17, 2008. IEEE, pp. 439-442.
Brongersma et al., "Light management for photovoltaics using high-index nanostructures", Nature Materials, vol. 13, No. 25, May 2014, pp. 451-460.
Callahan et al., "Light trapping in ultrathin silicon photonic crystal superlattices with randomly-textured dielectric incouplers", Optics Express, vol. 21, Issue 25, DOI: 10.1364/OE.21.030315, 2013, pp. 30315-30326.
Campbell et al., "A Pixel Readout Chip for Mrad in Standard 0.25um CMOS", IEEE Transactions on Nuclear Science, vol. 46, issue: 3, Jun. 1999, pp. 156-160.
Cao et al., "A 4.5MGy TID-Tolerant CMOS Bandgap Reference Circuit Using a Dynamic Base Leakage Compensation Technique", IEEE Transactions on Nuclear Science, vol. 60, issue 4, Aug. 2013, pp. 2819-2824.
Geisz et al., "Infrared Reflective and Transparent Inverted Metamorphic Triple Junction Solar Cells", AIP Conference Proceedings, vol. 1277, Issue 11, pp. 11-15, Oct. 14, 2010.
Kaltenbrunner et al., "Flexible high power-per-weight perovskite solar cells with chromium oxide-metal contacts for improved stability in air", Nature Materials, vol. 14, doi:10.1038/nmat4388, Aug. 24, 2015, pp. 1032-1039.
Lacoe, R. C., "Improving Integrated Circuit Performance Through the Application of Hardness-by-Design Methodology", IEEE Transactions on Nuclear Science, vol. 55, issue: 4, Aug. 2008, pp. 1903-1925.
Lamoureux et al., "Dynamic kirigami structures for integrated solar tracking", Nature Communications, DOI:10.1038/ncomms9092, Sep. 8, 2015, pp. 1-6.
Lohmeyer et al., "Correlation of GEO communication satellite anomalies and space weather phenomena: Improved satellite performance and risk mitigation", paper presented at 30th AIAA International Communications Satellite Systems Conference (ICSSC), Ottawa, Canada, pp. 1-20, Jul. 13, 2012.
Messenger et al., "Status of Implementation of Displacement Damage Dose Method for Space Solar Cell Degradation Analyses", 2008 Dd EOL Calc via SPENVIS manuscript SRM2, Jan. 2008, 8 pgs.
Narita et al., "Development of high accuracy phase control method for space solar power system", Proc. IEEE International Microwave Workshop Series on Innovative Wireless Power Transmission: Technologies, Systems, and Applications, May 12-13, 2011, p. 227-230.
Nishioka et al., "Evaluation of temperature characteristics of high-efficiency InGaP/InGaAs/Ge triple-junction solar cells under concentration", Solar Energy Materials and Solar Cells, vol. 85, Issue 3, Jan. 31, 2005, pp. 429-436.
O'Brien et al., "The AE9/AP9 Radiation Specification Development", Aerospace Corporation, Sep. 15, 2009, Report No. TOR-2009(3905)-8, 29 pgs.
Petrovic et al., "Design Methodology for Fault Tolerant ASICs", IEEE 15th International Symposium, Design and Diagnostics of Electronic Circuits & Systems (DDECS), Apr. 18-20, 2012, pp. 8-12.

Rephaeli et al., "Ultrabroadband Photonic Structures to Achieve High-Performance Daytime Radiative Cooling", Nano Letters, vol. 13, Mar. 5, 2013, pp. 1457-1461.
Sato et al., "Modeling of degradation behavior of InGaP/GaAs/Ge triple-junction space solar cell exposed to charged particles", Journal of Applied Physics, vol. 105, 2009, pp. 044504-1-044504-6.
Silverman et al., "Outdoor Performance of a Thin-Film Gallium-Arsenide Photovoltaic Module", presented at the 39th IEEE Photovoltaic Specialist Conference, Conference Jun. 16-21, 2013, Tampa, Florida, USA, 6 pgs.
Snoeys et al., "Integrated Circuits for Particle Physics Experiments", IEEE Journal Solid-State Circuits, vol. 35, issue 12, Dec. 2000, pp. 2018-2030.
Wang et al., "A Broadband Self-Healing Phase Synthesis Scheme", Radio Frequency Integrated Circuits Symposium (RFIC), IEEE, Jun. 5-7, 2011, 4 pgs.
ATI Industrial, Multi-Axis Force / Torque Sensor, ATI Industrial Automation, Jul. 23, 2014, pp. 1-44.
Smooth on, Mold Max® XLS® II, Jan. 15, 2016, 2 pgs.
"AZ Technology | Materials, Paint and Coatings: AZ-93 White Thermal Control, Electrically Conductive Paint / Coating (AZ's Z-93P)", Available http://www.aztechnology.com/materials-coatings-az-93.html, Accessed: Dec. 19, 2016, 2 pgs.
"ESA. Composite material structures.", printed Jun. 29, 2017 from http://www.esa.int/Our_Activities/Space_Engineering_Technology/Structures/Composite_Materials_structures, Oct. 20, 2014, 2 pgs.
"Orbital ATK", Coilable Boom Systems. Technical report, Oct. 18, 1989, 2 pgs.
"Space solar power limitless clean energy from space", National Space Society, printed Jun. 29, 2017 from http://www.nss.org/settlement/ssp/, May 2017, 11 pgs.
Aguirre-Martinez et al., "Development of a Continuous Manufacturing Method for a Deployable Satellite Mast in Cfrp", 15th Reinforced Plastics Congress, Sep. 1986, pp. 107-110, 1986.
Aieta et al., "Aberration-Free Ultrathin Flat Lenses and Axicons at Telecom Wavelengths Based on Plasmonic Metasurfaces", Nano Lett., Web publication date Aug. 2, 2012, vol. 12, No. 9, pp. 4932-4936.
Amacher et al., "Thin ply composites: Experimental characterization and modeling of size-effects", Composites Science and Technology, Jul. 11, 2014, vol. 101, pp. 121-132.
Andryieuski et al., "Rough metal and dielectric layers make an even better hyperbolic metamaterial absorber", Optics Express, Jun. 11, 2014, vol. 22, No. 12, pp. 14975-14980.
Arai, "Pitch-based carbon fiber with low modulus and high heat conduction", Nippon Steel Technical Report No. 84, Jul. 11, 2001, pp. 12-17.
Arbabi et al., "Dielectric Metasurfaces for Complete Control of Phase and Polarization with Subwavelength Spatial Resolution and High Transmission", Nature Nanotechnology, Aug. 31, 2015, 27 pgs., doi:10.1038/nnano.2015.186.
Arya, "Packaging and Deployment of Large Planar Spacecraft Structures", Thesis of Manan Arya, May 2, 2016, 131 pgs.
Arya et al., "Ultralight Structures for Space Solar Power Satellites", American Institute of Aeronautics and Astronautics, 2016, pp. 1-18.
Banik et al., "Performance Validation of the Triangular Rollable and Collapsible Mast", Proceedings of the 24th Annual AIAA/USU Conference on Small Satellites, Logan, UT, Aug. 9, 2010, 8 pgs.
Bapanapalli et al., "The Effect of Tool-Part Interactions on the Geometry of Laminated Composites", Washington State University, Jul. 10, 2016.
Biddy et al., "LightSail-1 solar sail design and qualification", Proceedings of the 41st Aerospace Mechanisms Symposium, May 16, 2012, pp. 451-463.
Cahill et al., "Nanoscale thermal transport. II. 2003-2012", Applied Physics Review, Jan. 14, 2014, vol. 1, No. 1, pp. 011305-1-011305-45.
Calladine et al., "The theory of thin shell structures 1888-1988", Proceedings of the Institution of Mechanical Engineers, Part A: Journal of Power and Energy, vol. 202, No. 3, Jan. 7, 1988, pp. 141-149.

(56) References Cited

OTHER PUBLICATIONS

Castle Jr., "Heat conduction in carbon materials", 1st Biennial Conference of the American Carbon Society, pp. 13-19, Nov. 2, 1953.
Chen et al., "Planar Heterojunction Perovskite Solar Cells via Vapor-Assisted Solution Process", Journal of the American Chemical Society 136, Dec. 20, 2013, pp. 622-625.
Cheng et al., "Optical metasurfaces for beam scanning in space", Optics Letters, May 1, 2014, vol. 39, No. 9, pp. 2719-2722.
David, "Extraterrestrial mining could reap riches and spur exploration", http://www.space.com/16273-extraterrestrial-mining-asteroids-moon.html, Jun. 25, 2012, 7 pgs.
Du Toit et al., "Advances in the design of Jaumann absorbers", in Antennas and Propagation Society International Symposium, 1990. AP-S. Merging Technologies for the 90's. Digest., May 7, 1990, vol. 3, pp. 1212-1215.
Elfiky et al., "Study the effects of proton irradiation on GaAs/Ge solar cells", 35th IEEE Photovoltaic Specialist Conference, Jul. 2010, pp. 002528-002532.
Emerson, "Electromagnetic wave absorbers and anechoic chambers through the years", IEEE Trans. Antennas Propag., vol. 21, No. 4, Jul. 1973, pp. 484-490.
Eperon et al., "Morphological Control for High Performance, Solution-Processed Planar Heterojunction Perovskite Solar Cells", Advanced Functional Materials 24, first published Sep. 9, 2013, pp. 151-157.
Ersoy et al., "An experimental method to study the frictional processes during composites manufacturing", Composites Part A: Applied Science and Manufacturing, Feb. 19, 2005, vol. 36, No. 11, pp. 1536-1544.
Estvanko et al., "Numerical analysis of a tape spring hinge folded about two axes", Earth and Space 2012 © Engineering, Science, Construction, and Operations in Challenging Environments, ASCE, Jul. 11, 2012, pp. 714-721.
Fallahi et al., "Thin wideband radar absorbers", Transactions on Antennas and Propagation, Nov. 30, 2010, vol. 58, No. 12, pp. 4051-4058.
Fante et al., "Reflection properties of the Salisbury screen", IEEE Transactions on Antennas and Propagation, Oct. 1988, vol. 36, No. 10, pp. 1443-1454.
Fernandez, "Advanced Deployable Shell-Based Composite Booms for Small Satellite Structural Applications Including Solar Sails", International Symposium on Solar Sailing, Jan. 17-20, 2017, Kyoto, Japan, 19 pgs.
Fernlund, "Experimental and numerical study of the effect of cure cycle, tool surface, geometry, and lay-up on the dimensional fidelity of autoclave-processed composite parts", Composites—Part A: Applied Science and Manufacturing, 33(3):341-351, 2002.
Herbeck et al., "Development and test of deployable ultra-lightweight CFRP-booms for a Solar Sail", European Space Agency, (Special Publication) ESA SP, 49(468):107-112, 2001.
Hillebrandt et al., "The Boom Design of the De-Orbit Sail Satellite", European Conference on Spacecraft Structures, Materials and Mechanical Testing, European Conference on Spacecraft Structures, Materials & Environmental Testing, Apr. 1-4, 2014, Braunschweig, Germany, 8 pgs.
Huang et al., "Gate-tunable conducting oxide metasurfaces", Nano Letters, vol. 16, No. 9., web publication date Aug. 26, 2016, pp. 5319-5325.
Irwin et al., "Low-Mass Deployable Spacecraft Booms", AIAA Space 2010 Conference & Exposition, pp. 1-11, Aug. 30, 2010.
Jang et al., "Tunable large resonant absorption in a midinfrared graphene Salisbury screen", Physical Review. B, Oct. 8, 2014, vol. 90, No. 16, pp. 165409-1-165409-5.
Kelly, "On Kirchhoff's law and its generalized application to absorption and emission by cavities", Journal of Research of the National Bureau of Standards—B, Mathematics and Mathematical Physics, Jul.-Sep. 1965, vol. 69B, No. 3, pp. 165-171.
Kildishev et al., "Planar Photonics with Metasurfaces", Science, Mar. 15, 2013, vol. 339, No. 6125, pp. 1232009-1-1232009-6.
Knott et al., "Performance Degradation of Jaumann Absorbers Due to Curvature", IEEE Transactions on Antennas and Propagation, Jan. 1980, vol. AP28, No. 1, pp. 137-139.
Kryder et al., "Heat Assisted Magnetic Recording", Proceeding of the IEEE, current version published Dec. 2, 2008, vol. 96, No. 11, pp. 1810-1835.
Leclerc et al., "Characterization of Ultra-Thin Composite Triangular Rollable and Collapsible Booms", 4th AIAA Spacecraft Structures Conference, AIAA SciTech Forum, Jan. 2017, 15 pgs.
Liang et al., "Additive Enhanced Crystallization of Solution-Processed Perovskite for Highly Efficient Planar-Heterojunction Solar Cells", Advanced Materials, Mar. 14, 2014, vol. 26, pp. 3748-3754.
Luukkonen et al., "A thin electromagnetic absorber for wide incidence angles and both polarizations", IEEE Transactions on Antennas and Propagation, IEEE Transactions on Antennas and Propagation Jul. 28, 2009, pp. 3119-3125.
Mankins, "A technical overview of the "SunTower" solar power satellite concept", Acta Astronautica, 50(6):369-377, Mar. 1, 2002.
Messenger et al., "Quantifying low energy proton damage in multijunction solar cell", in the proceedings of the 19th Space photovoltaic research and technology conference, 2005, NASA/CP-2007-214494, pp. 8-17.
Miyazawa et al., "Evaluation of radiation tolerance of perovskite solar cell for use in space", Photovoltaic Specialist Conference (PVSC), 2015 IEEE 42nd, New Orleans, LA, USA, Dec. 17, 2015, pp. 1-4, published Jun. 1, 2015.
Mizuno et al., "A black body absorber from vertically aligned single-walled carbon nanotubes", Proc. Natl. Acad. Sci., Apr. 14, 2009, vol. 106, No. 15, pp. 6044-6047.
Narimanov et al., "Reduced reflection from roughened hyperbolic metamaterial", Optics Express, Jun. 17, 2013, vol. 21, No. 12, pp. 14956-14961.
Ni et al., "Metasurface holograms for visible light", Nature Communications, Nov. 15, 2013, vol. 4, pp. 1-6.
NTPT, "NTPT Thin prepreg 402", Data sheet, Version 1.6, May 11, 2017, 5 pgs.
O'Hara, "Mechanical properties of silicone rubber in a closed volume", Technical Report, Army Armament Research and Development Center, Dec. 1983, 21 pgs.
Pellegrino, "AAReST telescope architecture", obtained from http://www.pellegrino.caltech.edu/aarest2/, printed Jul. 5, 2017, 4 pgs.
Penjuri, "Simulation and Testing of Deployable CFRP Booms for Large Space Structures", PhD thesis, Aug. 2011, 118 pgs.
Pors et al., "Analog Computing Using Reflective Plasmonic Metasurfaces", Nano Lett., Dec. 18, 2014, vol. 15, pp. 791-797.
Radford et al., "Measurement of Manufacturing Distortion in Flat Composite Laminates", International Conference on Composite Materials, Jul. 1999, 9 pgs.
Radford et al., "Separating Sources of Manufacturing Distortion in Laminated Composites", Journal of Reinforced Plastics and Composites, first published May 1, 2000, vol. 19, No. Aug. 2000, pp. 621-641.
Rakic et al., "Algorithm for the determination of intrinsic optical constants of metal films: application to aluminum", Applied Optics, Aug. 1, 1995, vol. 34, No. 22, pp. 4755-4767.
Rakic et al., "Optical Properties of Metallic Films for Vertical-Cavity Optoelectronic Devices", Applied Optics, Aug. 1, 1998, vol. 37, No. 22, pp. 5271-5283.
Raman et al., "Passive radiative cooling below ambient air temperature under direct sunlight", Nature, Nov. 27, 2014, vol. 515, pp. 540-544.
Reha et al., "A Dual-Band Rectangular CPW Folded Slot Antenna for GNSS Applications", International Journal of Advanced Research in Electrical, Electronics and Instrumentation Engineering, Aug. 2014, pp. 11055-11061.
Rephaeli et al., "Absorber and emitter for solar thermo-photovoltaic systems to achieve efficiency exceeding the Shockley-Queisser limit", Optics. Express, Aug. 11, 2009, vol. 17, No. 17, pp. 15145-15159.
Santer et al., "Composite Tube Flexures at Nanosatellite Scale", 4th AIAA Space-craft Structures Conference, Jan. 9-13, 2017, 12 pgs.

(56) References Cited

OTHER PUBLICATIONS

Sasaki, "How Japan plans to build an orbital solar farm", printed from https://energy.gov/articles/space-based-solar-power, published Apr. 24, 2014.
Seffen et al., "Deployment dynamics of tape springs", Proceedings of the Royal Society of London A: Mathematical, Physical and Engineering Sciences, Mar. 9, 1999, vol. 455, pp. 1003-1048.
Shaltout et al., "Time-varying metasurfaces and Lorentz non-reciprocity", Optical Materials Express, Nov. 1, 2015, vol. 5, No. 11, pp. 2459-2467.
Shin-Etsu, "Meeting the increasingly diverse and sophisticated needs of industry with the unique properties of silicone rubbers", Characteristic properties of Silicone Rubber Compounds, 2013, 16 pgs.
Sickinger et al., "Lightweight deployable booms: Design, manufacture, verification, and smart materials application", 55th International Astronautical Congress, Vancouver, Canada, Oct. 4-8, 2004, pp. 1-11.
Sihn et al., "Experimental studies of thin-ply laminated composites", Composites Science and Technology, May 1, 2007, vol. 67, pp. 996-1008.
Silva et al., "Performing Mathematical Operations with Metamaterials", Science, Jan. 10, 2014, vol. 343, No. 6167, pp. 160-163.
Stabile et al., "Coiling dynamic analysis of thin-walled composite deployable boom", Composite Structures, Mar. 29, 2014, vol. 113, pp. 429-436.
Steeves, "Multilayer Active Shell Mirrors", Thesis of John Steeves, May 5, 2015, 164 pgs.
Streyer et al., "Strong absorption and selective emission from engineered metals with dielectric coatings", Optics Express , Apr. 8, 2013, vol. 21, No. 7, pp. 9113-9122.
Stuart et al., "Absorption enhancement in silicon-on-insulator waveguides using metal island films,", Appl. Phys. Lett., Oct. 14, 1996, vol. 69, No. 16, pp. 2327-2329.
Stuart et al., "Island size effects in nanoparticle-enhanced photodetectors", Appl. Phys. Lett., Dec. 28, 1998, vol. 73, No. 26, pp. 3815-3817.
Svanberg et al., "An experimental investigation on mechanisms for manufacturing induced shape distortions in homogeneous and balanced laminates", Composites—Part A: Applied Science and Manufacturing, Jun. 1, 2001, vol. 32, pp. 827-838.
Torayca, "T800H Technical Data Sheet", Technical report No. CFA-007, 2 pgs.
Walker et al., "An investigation of tape spring fold curvature", Proceedings of the 6th International Conference on Dynamics and Control of Systems and Structures in Space, Citeseer, 2004, 10 pgs.
Walters et al., "Spenvis implementation of end-of-life solar cell calculations using the displacement damage dose methodology", in the Proceedings of the 19th Space Photovoltaic Research and Technology Conference, Feb. 1, 2007, 9 pgs.
Weinberg et al., "Radiation and temperature effects in gallium arsenide, indium phosphide, and silicon solar cells", National Aeronautics and Space Administration Technical Memorandum 89870, May 4-8, 1987, 14 pgs., published Feb. 1, 1987.
Wells et al., "Metamaterials-based Salisbury screens with reduced angular sensitivity", Appl. Phys. Lett., Oct. 21, 2014, vol. 105, pp. 161105-1-161105-4.
White et al., "Cure Cycle Optimization for the Reduction of Processing-Induced Residual Stresses in Composite Materials", Journal of Composite Materials, Dec. 1, 1993, vol. 27, No. 14, pp. 1352-1378.
Whorton et al., "Nanosail-D: the first flight demonstration of solar sails for nanosatellites", 22nd AIAA/USU Conference on Small Satellites, Aug. 11, 2008, pp. 1-6.
Wood, "Space-based solar power", printed Jul. 5, 2017 from https://energy.gov/articles/space-based-solar-power, Mar. 6, 2014, 7 pgs.
Wu et al., "Retarding the crystallization of Pbl2 for highly reproducible planar-structured perovskite solar cells via sequential deposition", Energy & Environmental Science 7, Jun. 24, 2014, pp. 2934-2938.

Yamaguchi, "Radiation-resistant solar cells for space use", Solar Energy Materials & Solar Cells, 2001. vol. 68, pp. 31-53.
Yamaguchi et al., "Correlations for damage in diffused-junction InP solar cells induced by electron and proton irradiation", Journal of Applied Physics, May 1, 1997, vol. 81, No. 9, 6013-6018.
Yamaguchi et al., "Mechanism for the anomalous degradation of Si solar cells induced by high fluence 1 MeV electron irradiation", Applied Physics Letters, May 27, 1996, vol. 68, No. 22, pp. 3141-3143.
Yu et al., "A Broadband, Background-Free Quarter-Wave Plate Based on Plasmonic Metasurfaces", Nano Letters, Nov. 3, 2012, vol. 12, No. 12, pp. 6328-6333.
Yu et al., "Flat optics with designer metasurfaces", Nature Materials, published online Feb. 2014, vol. 13, pp. 139-150.
Zhang et al., "Infrared Refractive Index and Extinction Coefficient of Polyimide Films", International Journal of Thermophysics, May 1, 1998, vol. 19, No. 3, pp. 905-916.
Zheng et al., "Metasurface holograms reaching 80% efficiency", Nature Nanotechnology, published online Feb. 23, 2015, pp. 1-6.
Zhu et al., "Radiative cooling of solar cells", Optica, Jul. 22, 2014, vol. 1, pp. 32-38.
Zhu et al., "Radiative cooling of solar absorbers using a visibly transparent photonic crystal thermal blackbody", PNAS, Oct. 6, 2015, vol. 112, pp. 12282-12287.
International Preliminary Report on Patentability for International Application PCT/US2016/043424, Report dated May 15, 2018, dated May 24, 2018, 12 Pgs.
DuPont Kapton, Mar. 2012, 26 pgs.
Extended European Search Report for European Application No. 15795587.3, Search completed Feb. 5, 2018, dated Feb. 12, 2018, 7 Pgs.
Extended European Search Report for European Application No. 15803447.0, Search completed Oct. 17, 2017, dated Oct. 25, 2017, 10 Pgs.
International Preliminary Report on Patentability for International Application PCT/US2016/043424, Report completed Dec. 2, 2017, dated Dec. 15, 2017, 153 Pgs.
International Preliminary Report on Patentability for International Application PCT/US2016/043677, Report dated Jan. 23, 2018, dated Feb. 1, 2018, 6 Pgs.
International Preliminary Report on Patentability for International Application PCT/US2016/046389, Report dated Feb. 13, 2018, dated Feb. 22, 2018, 9 Pgs.
International Preliminary Report on Patentability for International Application PCT/US2016/046394, Report dated Feb. 13, 2018, dated Feb. 22, 2018, 10 Pgs.
International Preliminary Report on Patentability for International Application PCT/US2016/046415, Report dated Feb. 13, 2018, dated Feb. 22, 2018, 8 Pgs.
International Preliminary Report on Patentability for International Application PCT/US2016/046421, Report dated Feb. 13, 2018, dated Feb. 22, 2018, 8 Pgs.
"Corona Resistant Kapton CR Takes Electrical Insulation Design and Reliability to New Levels", Kapton, DuPont Films, H-54506-1.
"DuPont Kapton 100CRC: Technical Data Sheet", kapton.dupont. com, Jul. 2014, K-28402.
"DuPont Kapton 120FWN616B", kapton.dupont.com, K-28459, Sep. 2014.
"DuPont Kapton 150FCRC019", kapton.dupont.com, K-28402, Jun. 2014.
"DuPont Kapton 150FWN019: Magnet Wire Insulation", www.kapton.dupont.com, H-78319-01, Mar. 2005.
"DuPont Kapton 150FWR019: Insulation Substrate", www.dupont.com/kapton, H-78312, Nov. 2001.
"DuPont Kapton 150PRN411", kapton.com, K-28731, Dec. 2014.
"DuPont Kapton 200FWR919: Insulation Substrate", www.dupont.com/kapton, H-78313, Nov. 2001.
"DuPont Kapton 200RS100", kapton.com, K-15354-2, Sep. 2014.
"DuPont Kapton B: Technical Bulletin", kapton.dupont.com, K-25099-1, Jul. 2013.
"DuPont Kapton FCR: Advanced Magnet Wire Insulation", Jun. 2005, H-99888.

(56) References Cited

OTHER PUBLICATIONS

"DuPont Kapton FN: Polyimide Film", kapton.com, K-15347-2, Jun. 2015.
"DuPont Kapton FPC: Polyimide Film", kapton.dupont.com, K-15361, Mar. 2006.
"DuPont Kapton GS Polyimide Film: Technical Data Sheet", kapton.dupont.com, K-26875-1, Jul. 2014.
"DuPont Kapton HN:Polyimide Film", kapton.dupont.com, K-15345-1, Apr. 2011.
"DuPont Kapton HPP-ST: Polyimide Film", kapton.dupont.com, K-15357, Mar. 2006.
"DuPont Kapton MT: Technical Data Sheet", kapton.dupont.com, H-38497-3, Apr. 2014.
"DuPont Kapton PST: Polyimide Film", kapton.dupont.com, K-10790, Nov. 2005.
"DuPont Kapton PV9100 Series: Polyimide Films", kapton.dupont.com, K-26028-1_A4, Oct. 2012.
"DuPont Kapton: Polyimide Film", kapton.dupont.com, Mar. 2012, H-38479-9, 7 pgs.
Arbabi et al., "Multiwavelength polarization insensitive lenses based on dielectric metasurfaces with meta-molecules", Optics, Jan. 22, 2016, vol. 3, Issue 6, pp. 628-633.
Arbabi et al., "Subwavelength-thick lenses with high numerical apertures and large efficiency based on high-contrast transmitarrays", Nature Communications, May 5, 2015, vol. 6, pp. 7069, doi:10.1038/ncomms8069.
Lee et al., "Non-Destructive Wafer Recycling for Low-Cost Thin-Film Flexible Optoelectronics", Advanced Functional Materials, Apr. 2, 2014, vol. 24, pp. 4284-4291.
Liu et al., "Microstructure, thermal shock resistance and thermal emissivity of plasma sprayed $LaMAl_{11}O_{19}$(M=Mg, Fe) coatings for metallic thermal protection systems", Applied Surface Science, vol. 271, Feb. 6, 2013, pp. 52-59.
Vaccaro et al., "In-flight experiment for combined planar antennas and solar cells (SOLANT)", IET Microwaves Antennas & Propaga, vol. 3, No. 8, Dec. 1, 2009, pp. 1279-1287.
Jaffe et al., "Development of a Sandwich Module Prototype for Space Solar Power", 2012 IEEE Aerospace Conference, Mar. 3-10, 2012, Big Sky, MT, USA, pp. 1-9, DOI: 10.1109/AERO.2012.6187077.
Jaffe et al., "Energy Conversion and Transmission Modules for Space Solar Power", Proceedings of the IEEE, Jun. 2013, vol. 101, No. 6, pp. 1424-1437, DOI: 10.1109/JPROC.2013.2252591.
Mankins, "SPS-Alpha: The First Practical Solar Power Satellite via Arbitrarily Large Phased Array (A 2011-2012 NASA NIAC Phase 1 Project)", Artemis Innovation Management Solutions LLC, Sep. 15, 2012, NIAC Phase 1 Final Report, 113 pgs.
Rubenchik et al., "Solar Power Beaming: From Space to Earth", U.S. Department of Energy Office of Scientific and Technical Information, Apr. 14, 2009, Technical Report LLNL-TR-412782, 16 pgs. DOI: 10.2172/952766.
Sasaki et al., "A new concept of solar power satellite: Tethered-SPS", Acta Astronautica, 2006, vol. 60, pp. 153-165, doi:10.1016/j.actaastro.2006.07.010.
Borriello et al., "Ab initio investigation of hybrid organic-inorganic perovskites based on tin halides", Physical Review B, Jun. 23, 2008, vol. 77, 235214, 9 pgs.
Conings et al., "Intrinsic thermal instability of methylammonium lead trihalide perovskite", Advanced Energy Materials, Jun. 2, 2015, DOI: 10.1002/aenm.201500477, 8 pgs.
Preston et al., "From plasmon spectra of metallic to vibron spectra of dielectric nanoparticles", Accounts of Chemical Research, Jan. 9, 2012, vol. 45, No. 9, pp. 1501-1510.
Scholl et al., "Quantum plasmon resonances of individual metallic nanoparticles", Nature, Mar. 22, 2012, vol. 483, doi:10.1038/nature10904, pp. 421-428.
Tsai et al., "High-efficiency two-dimensional Ruddlesden-Popper perovskite solar cells", Nature, Aug. 18, 2016, vol. 536, doi:10.1038/nature18306, 15 pgs.
Weinberg et al., "Radiation and temperature effects in gallium arsenide, indium phosphide, and silicon solar cells", NASA Technical Memorandum 89870, Washington, D.C., May 4-8, 1987, 14 pgs.
Zhang et al., "Intrinsic instability of the hybrid halide perovskite semiconductor $CH_3NH_3PbI_3$", Chinese Physics Letters, Jun. 3, 2015, vol. 35, No. 3, 036104, 11 pgs.
Extended European Search Report for European Application No. 16828571.6, Search completed Mar. 18, 2019, dated Mar. 22, 2019, 17 Pgs.
Extended European Search Report for European Application No. 16835856.2, Search completed Feb. 22, 2019 dated Mar. 1, 2019, 8 Pgs.
Romeo et al., "Unique space telescope concepts using CFRP composite thin-shelled mirrors and structures", 2007.

* cited by examiner

FIG. 4a
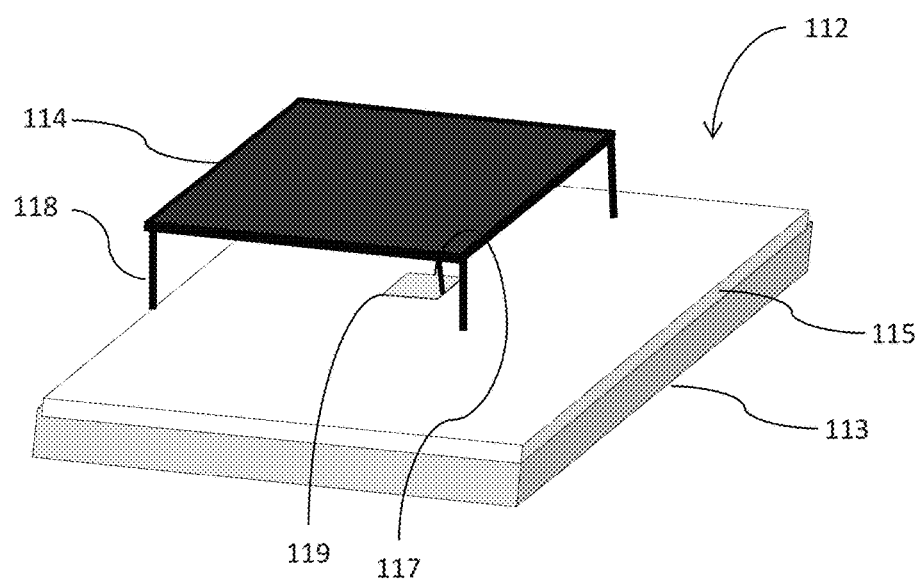
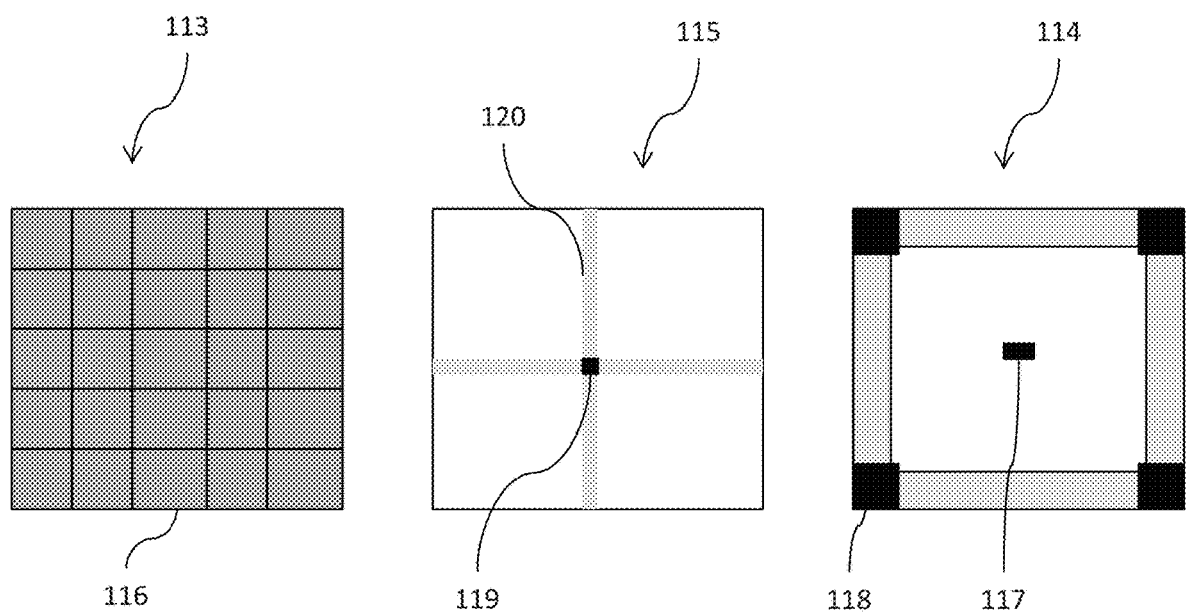

FIG. 5
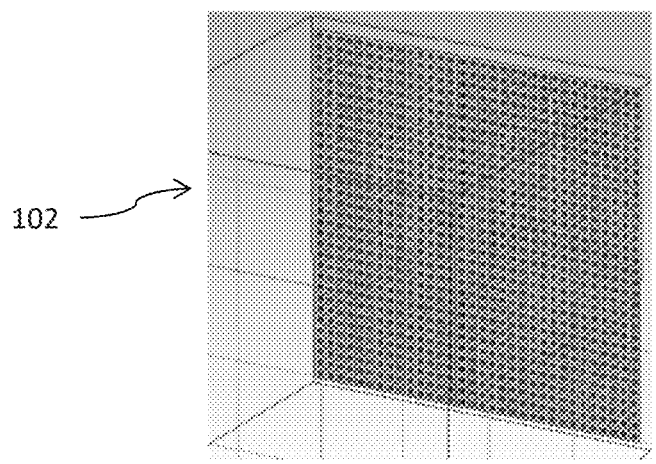
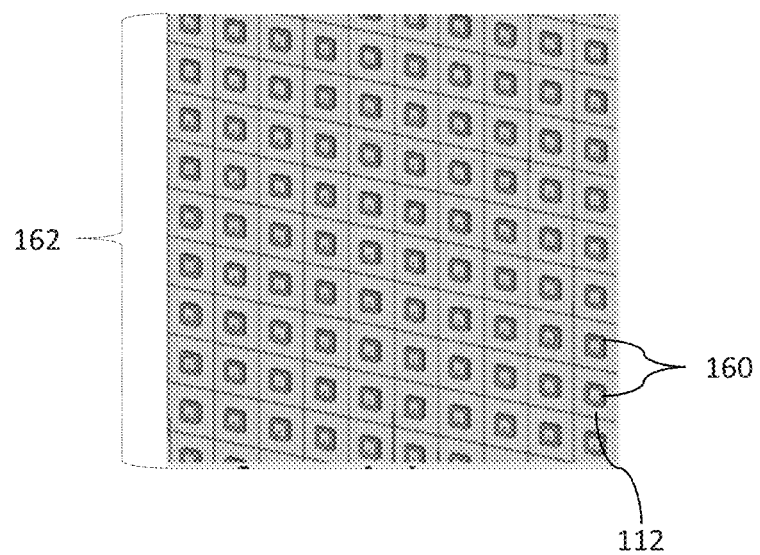
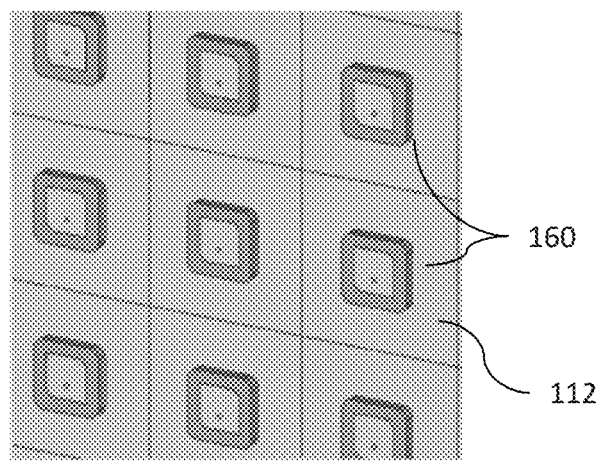

LARGE-SCALE SPACE-BASED SOLAR POWER STATION: EFFICIENT POWER GENERATION TILES

CROSS-REFERENCE TO RELATED APPLICATIONS

This application claims priority to U.S. provisional patent application Ser. No. 62/006,604 entitled "Large-Scale Space-Based Array: Efficient Photovoltaic Structures for Space," filed Jun. 2, 2014; and U.S. provisional patent application Ser. No. 62/120,650 entitled "Large-Scale Space-Based Array: Packaging, Deployment and Stabilization of Lightweight Structures," filed Feb. 25, 2015; both of which are incorporated by reference herein in their entirety.

FIELD OF THE INVENTION

The present invention is related to space-based solar power stations including a plurality of solar power satellite modules, as well as power generation tiles, which can be implemented within said satellite modules.

BACKGROUND

Space-based solar power (SBSP) describes the collection of solar power in space by a solar-power satellite or a satellite power system (SPS) and then the conversion and transmission of the power to a remote receiver for conversion back to electrical power. In an SBSP system, solar energy is collected as electrical energy on board, powering some manner of wireless power transmission to a receiver located remotely from the SBSP. The wireless power transmission application might include a microwave transmitter or laser emitter, which would direct its beam toward a collector, such as a power receiving rectenna at the remote location, such as, on the Earth's surface.

SBSP differs from ground-based solar collection methods in that the means used to collect energy resides on an orbiting satellite instead of on the Earth's surface. Basing such a system in space results in a higher collection rate for the solar energy due to the lack of a diffusing atmosphere. In a conventional ground-based system a large percentage (55-60%) of the solar energy is lost on its way through the atmosphere by the effects of reflection and absorption. Space-based solar power systems convert solar energy to a far-field emission such as microwaves outside the atmosphere, avoiding these losses. In addition, SBSP systems have a longer collection period and the ability to collect solar energy continuously without the downtime (and cosine losses, for fixed flat-plate collectors) that result from the Earth's rotation away from the sun.

A general limitation for conventional SBSP systems is the size of SPS required to generate sufficient electrical power from solar energy. For example, for a 500 MW system a 5 $km^2$ platform may be required. Such a platform would be formed of large satellites on the order to tens to hundreds of tonnes/satellite. The launch costs associated with placing such large structures into orbit reduces the economic viability of such SBSP systems.

SUMMARY OF THE INVENTION

Systems and methods in accordance with various embodiments of the invention provide a space-based solar power (SBSP) system including a plurality of solar-power satellite modules, and constituent components thereof. In a number of embodiments, the satellite modules include a plurality of modular power generation tiles combining at least one photovoltaic cell, a power transmitter and circuitry configured to perform a variety of control functions including (but not limited to) coordinating the participation of the power transmitter in a phased array. Embodiments also provide compactible structures, and methods and mechanisms for deploying such compactible light weight structures once in a selected operating location. A plurality of the standalone satellite modules may be collocated, and flown in any suitable orbital formation in space to collectively constitute the space-based solar power system.

Many embodiments are directed to a space-based solar power station including, a plurality of unconnected satellite modules disposed in space in an orbital array formation, a plurality of power generation tiles disposed on each of the plurality of satellite modules, at least one photovoltaic cell disposed on each of the power generation tiles, at least one power transmitter collocated with the at least one photovoltaic cell on each of the power generation tiles and in signal communication therewith such that an electrical current generated by the collection of solar radiation by the at least one photovoltaic cell powers the at least one power transmitter, where each of the at least one power transmitters includes: an antenna, and control electronics that controls the phase of a radio frequency power signal that feeds the antenna so that the power transmitter is coordinated with power transmitters on other power generation tiles to form a phased array.

Numerous embodiments relate to efficient power generation tiles. In one embodiment, an efficient power generation tile includes: at least one photovoltaic material; and at least one concentrator that redirects incident solar radiation towards a photovoltaic material such that the photovoltaic material experiences a greater solar flux relative to the case where the photovoltaic material experiences unaltered solar radiation.

In another embodiment, a power generation tile further includes structures having characteristic dimensions between approximately 1 μm and 100 μm that are disposed on a surface in thermal communication with one of: at least one photovoltaic material and a concentrator.

In still another embodiment the at least one concentrator includes a reflector and a substrate.

In yet another embodiment, the reflector includes one of: aluminum, silver, a dielectric material, and combinations thereof.

In still yet another embodiment, the substrate includes KAPTON polyimide.

In a further embodiment, the thickness of the reflector is between approximately 2 μm and approximately 10 μm.

In a still further embodiment, the thickness of the KAPTON polyimide substrate is approximately 10 μm.

In a yet further embodiment, at least one photovoltaic cell includes a plurality of junctions.

In a still yet further embodiment, the at least one photovoltaic material is a plurality of photovoltaic materials; the at least one concentrator is a plurality of concentrators that are adjacently disposed; each of the at least one concentrators defines a reflective side and a non-reflective side; each of the at least one photovoltaic materials is disposed on the non-reflective side of a concentrator; and at least a plurality of the concentrators are configured to redirect incident solar radiation onto a photovoltaic material that is disposed on the non-reflective side of an adjacent concentrator.

In another embodiment, at least one concentrator includes a reflector disposed on a substrate, and further includes a spring.

In yet another embodiment, at least one concentrator includes a conductive reflector and a conductive spring.

In still another embodiment, at least one photovoltaic material is electrically connected to a conductive spring and to a conductive reflector and can thereby use them as electrical contacts.

In still yet another embodiment, at least one concentrator includes a reflector that includes two conductive portions that are electrically isolated except that they are each connected to a photovoltaic material such that the photovoltaic material can use the conductive portions as electrical contacts.

In a further embodiment, at least one concentrator includes two conductive springs, and at least one photovoltaic material is coupled with each of the two conductive springs such that it can use them as electrical contacts.

In a still further embodiment, at least one concentrator includes a primary reflector and a secondary reflector, where the primary reflector redirects incident solar radiation onto a secondary reflector, and where the secondary reflector redirects incident solar radiation onto at least one photovoltaic material.

In a yet further embodiment, the photovoltaic material is in thermal communication with the primary reflector.

In a still yet further embodiment, the primary reflector conforms to a parabolic shape and the secondary reflector conforms to a hyperbolic shape.

In another embodiment, an efficient power generation tile further includes a radiative heat sink in thermal communication with at least one photovoltaic cell.

In yet another embodiment, the at least one concentrator is parabolic in shape, and focuses incident solar radiation onto a photovoltaic material disposed proximate the focus of the parabolic shape.

In still another embodiment, the concentrator includes a reflector that includes one of: aluminum, silver, a dielectric material, and combinations thereof.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein:

FIG. 4a conceptually illustrates a cross-sectional view of a modular power generation tile, according to one embodiment.

FIG. 5 conceptually illustrates an array of power generation tiles in which the antenna elements of the power generation tiles are configured as a phased array, according to one embodiment.

DETAILED DESCRIPTION

Figure 1:
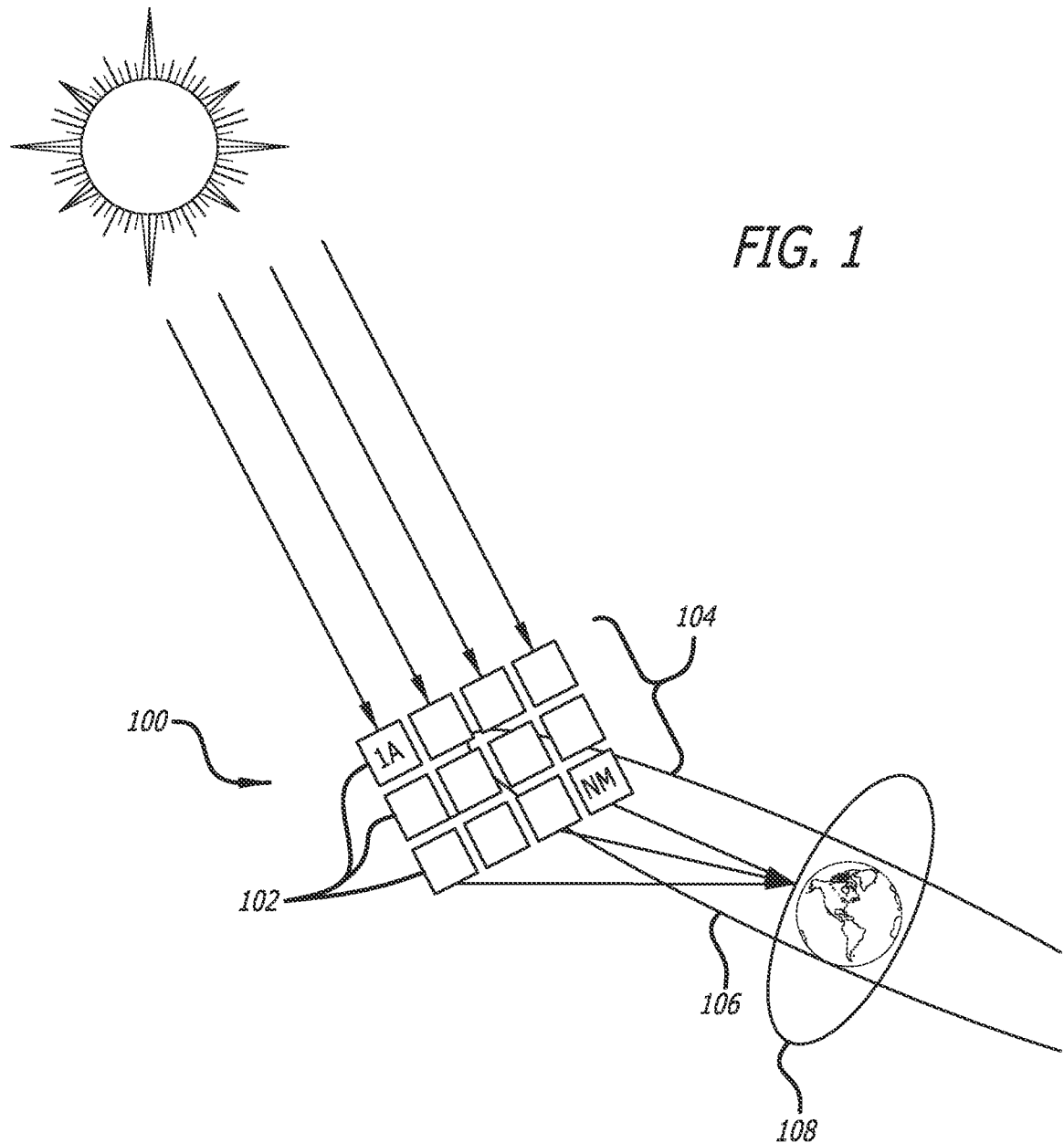
FIG. 1 conceptually illustrates a large-scale space-based solar power station with a plurality of power satellite modules in geosynchronous orbit about the Earth, according to one embodiment.

Turning now to the drawings, large-scale space-based solar power (SBSP) stations and efficient power generation tiles in accordance with various embodiments of the invention are illustrated. In many embodiments, the SBSP systems include arrays of independent satellite modules each incorporating arrays of independent solar electric power generation tiles. In several embodiments, the power generation tiles are each formed incorporating independent photovoltaic cells, power transmitters, and control circuits. The satellite modules and power generation tiles may be formed from compactible structures according to some embodiments. Methods for deploying, stabilizing, operating and constructing such large-scale space-based solar power systems in accordance with a number of embodiments of the invention are also described. Similar systems and methods are described in: U.S. provisional patent application Ser. No. 61/993,016 entitled "Large-Scale Space-Based Array: Packaging, Deployment and Stabilization of Lightweight Structures," filed on May 14, 2014; U.S. provisional patent application Ser. No. 61/993,025 entitled "Large-Scale Space-Based Array: Multi-Scale Modular Space Power System," filed on May 14, 2014; U.S. provisional patent application Ser. No. 61/993,957 entitled "Large-Scale Space-Based Array: Modular Phased Array Power Transmission," filed May 15, 2014; U.S. provisional patent application Ser. No. 61/993,037 entitled "Large-Scale Space-Based Array: Space-Based Dynamic Power Distribution System," filed May 14, 2014; U.S. patent application Ser. No. 14/712,812 entitled "Large-Scale Space-Based Solar Power Station: Packaging, Deployment and Stabilization of Lightweight Structures," filed May 14, 2015; U.S. patent application Ser. No. 14/712,783 entitled "Large-Scale Space-Based Solar Power Station: Multi-Scale Modular Space Power," filed May 14, 2015; and U.S. patent application Ser. No. 14/712,856 entitled "Large-Scale Space-Based Solar Power Station: Power transmission Using Steerable Beams," filed May 14, 2015, all of which are incorporated by reference herein in their entirety.

A large-scale space-based solar power station in accordance with many embodiments is a modular space-based construct that can be formed from a plurality of independent satellite modules placed into orbit within an orbital formation such that the position of each satellite module relative to each other is known. Each of the satellite modules can include a plurality of power generation tiles that capture solar radiation as electrical current and use the current to transmit the energy to one or more remote receivers using power transmitters. In many instances, the transmissions are generated using microwave power transmitters that are coordinated to act as a phased- and/or amplitude array capable of generating a steerable beam and/or focused beam that can be directed toward one or more remote receivers. In other embodiments, any of a variety of appropriate power transmission technologies can be utilized including (but not limited to) optical transmitters such as lasers.

Many embodiments relate to lightweight space structures used to construct the modular elements of the solar power station. Some lightweight space structures are used in the construction of the power generation tiles and/or satellite modules and may incorporate movable elements that allow the lightweight space structure to be compacted prior to deployment to reduce the area or dimensional length, height and/or width of the power generation tiles and/or satellite modules prior to deployment. The space structures may be made of any number, size and configuration of movable elements, and the elements may be configured to compact according to any suitable compacting mechanism or configuration, including one or two-dimensional compacting using, among others, z-folding, wrapping, rolling, fan-folding, double z-folding, Miura-ori, slip folding, wrapping, and combinations thereof. Some embodiments of movable elements are interrelated by hinges, such as, frictionless, latchable, ligament, and slippage hinges, among others. Some embodiments of structures are pre-stressed and/or provided with supportive frameworks to reduce out-of-plane macro- and micro-deformation of the lightweight structures. Structures and modules may include dynamic stabilizing movement (e.g., spinning) during deployment and/or operation. Deployment mechanisms to deploy the compactible lightweight structures into a deployed operational state may be incorporated into or associated with embodiments of the lightweight structures. Some deployment mechanisms may include (but are not limited to) expansive boom arms, centrifugal force mechanisms such as tip masses or module self-mass, among others.

Large-scale space-based solar power stations according to many embodiments utilize a distributed approach to capture solar radiation, and use the energy thus captured to operate power transmitters, which transmit power to one or more remote receivers (e.g., using laser or microwave emissions). The satellite modules of the solar power station can be physically independent structures, each comprising an independent array of power generation tiles. The satellite modules are each placed into a specified flying formation within an array of such satellite modules in a suitable orbit about the Earth. The position of each of the independent satellite modules in space within the orbital array formation is controllable via a combination of station-keeping thrusters and controlled forces from absorption, reflection, and emission of electromagnetic radiation, as well as guidance controls. Using such controllers each of the independent satellite modules may be positioned and maintained within the controlled orbital array formation relative to each of the other satellite modules so that each satellite module forms an independent modular element of the large-scale space-based solar power station. The solar radiation received by each of the power generation tiles of each of the independent satellite module is utilized to generate electricity, which powers one or more power transmitters on each of the power generation tiles. Collectively, the power transmitters on each of the power generation tiles can be configured as independent elements of a phased and/or amplitude-array.

The power generation tiles and/or satellite modules may also include separate electronics to process and exchange timing and control information with other power generation tiles and/or satellite modules within the large-scale space-based solar power station. In many implementations, the separate electronics form part of an integrated circuit that possesses the ability to independently determine a phase offset to apply to a reference signal based upon the position of an individual tile and/or transmitter element. In this way, coordination of a phased array of antennas can be achieved in a distributed manner.

In some embodiments of the distributive approach, different array elements of the phased array may be directed to transmit power with different transmission characteristics (e.g., phase) to one or more different remote power receiving collectors (e.g., ground based rectenna). Each satellite module of power generation tiles, or combinations of power generating tiles across one or more satellite modules, may thus be controlled to transmit energy to a different power receiving collector using the independent control circuitry and associated power transmitters.

A photovoltaic cell (PV) refers to an individual solar power collecting element on a power generation tile in a satellite module. The PV includes any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof.

A power transmitter or radiator refers to an individual radiative element on a power generation tile in a satellite module and its associated control circuitry. A power transmitter can include any device capable of converting power in the electrical current generated by the PV to a wireless signal, such as microwave radiation or light, including (but not limited to) a laser, a klystron, a traveling-wave tube, a gyrotron, or suitable transistor and/or diode. A power transmitter may also include suitable transmissive antennas, such as, dipole, patch, helical or spherical antennas, among others.

A phased array refers to an array of power transmitters in which the relative phases of the respective signals feeding the power transmitters are configured such that the effective radiation pattern of the power emission of the array is reinforced in a desired emission direction and suppressed in undesired directions. Phased arrays in accordance with embodiments may be dynamic or fixed, active or passive.

An orbital array formation refers to any size, number or configuration of independent satellite modules being flown in formation at a desired orbit in space such that the position of the satellite modules relative to each other is known such that power generation tiles on each of the satellite modules within the formation serves as an array element in the phased array of the solar power station.

A power generation tile refers to an individual solar power collecting and transmitting element in the phased array of the large-scale space-based solar power station. In many embodiments a power generation tile is a modular solar radiation collector, converter and transmitter that collects solar radiation through at least one photovoltaic cell disposed on the tile, and uses the electrical current to provide power to at least one power transmitter collocated on the same tile that transmits the converted power to one or more remote power receiving collectors. Many of the power generation tiles incorporated within a space-based solar power station include separate control electronics independently control the operation of the at least one power transmitter located on the power generation tile based upon timing, position, and/or control information that may be received from other tiles and/or other modules within the large-scale space-based solar power station. In this way, the separate control electronics can coordinate (in a distributed manner) the transmission characteristics of each of the power generation tiles form a phased array. Each power generation tile may also include other structures such as radiation collectors for focusing solar radiation on the photovoltaic, thermal radiators for regulating the temperature of the power generation tile, and radiation shielding, among other structures.

A satellite module refers to an array of power generation tiles collocated on a single integral space structure. The space structure of the satellite module may be a compactable structure such that the area occupied by the structure may be expanded or contracted depending on the configuration assumed. The satellite modules may include two or more power generation tiles. Each power generation tile may include at least one solar radiation collector and power transmitter. As discussed above, each of the power generation tiles may transmit power and may be independently controlled to form an array element of one or more phased arrays formed across the individual satellite module or several such satellite modules collectively. Alternatively, each of the power generation tiles collocated on a satellite module may be controlled centrally.

A lightweight space structure refers to integral structures of movably interrelated elements used in the construction of the power generation tiles and/or satellite modules that may be configurable between at least packaged and deployed positions wherein the area and or dimensions of the power generation tiles and/or satellite modules may be reduced or enlarged in at least one direction. The lightweight space structures may incorporate or be used in conjunction with deployment mechanisms providing a deploying force for urging the movable elements between deployed and compacted configurations.

A large-scale space-based solar power station or simply solar power station refers to a collection of satellite modules being flown in an orbital array formation designed to function as one or more phased arrays. In embodiments the one or more phased arrays may be operated to direct the collected solar radiation to one or more power receiving collectors.

Transmission characteristics of a power generation tile refer to any characteristics or parameters of the power transmitter of the power generation tile associated with transmitting the collected solar radiation to a power receiving collector via a far-field emission. The transmission characteristics may include, among others, the phase and operational timing of the power transmitter and the amount of power transmitted.

Structure of Large-Scale Space-Based Solar Power Station

A large-scale space-based solar power station including a plurality of satellite modules positioned in an orbital array formation in a geosynchronous orbit about the Earth in accordance with certain embodiments of the invention is illustrated in FIG. 1. The large-scale space-based solar power station 100 includes an array of independent satellite modules 102. The solar power station 100 is configured by placing a plurality of independent satellite modules 102 into a suitable orbital trajectory in an orbital array formation 104, according to one embodiment. The solar power station 100 may include a plurality of such satellite modules 1A through NM. In one embodiment, the satellite modules 1A through NM are arranged in a grid format as illustrated in FIG. 1. In other embodiments, the satellite modules are arranged in a non-grid format. For example, the satellite modules may be arranged in a circular pattern, zigzagged pattern or scattered pattern. Likewise, the orbit may be either geosynchronous 106, which is typically at an altitude of 35,786 km above the Earth, or low Earth 108, which is typically at an altitude of from 800 to 2000 km above the Earth, depending on the application of the solar power station. As can readily be appreciated, any orbit appropriate to the requirements of a specific application can be utilized by a space-based solar power station in accordance with various embodiments of the invention.

Figure 2:
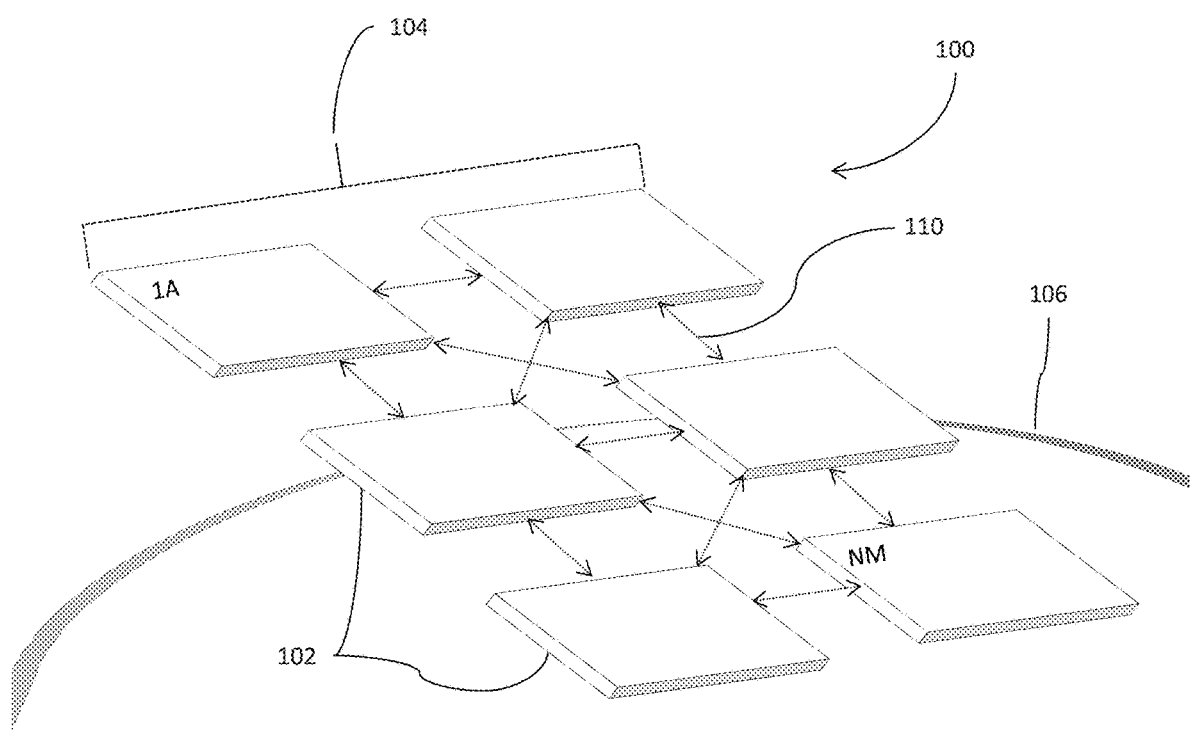
FIG. 2 conceptually illustrates a large-scale space-based solar power station with a plurality of power satellite modules flying in a rectangular orbital formation, according to one embodiment.

In some embodiments, the satellite modules in the solar power station are spatially separated from each other by a predetermined distance. By increasing the spatial separation, the maneuverability of the modules in relation to each other is simplified. As discussed further below, the separation and relative orientation of the satellite modules can impact the ability of the power generation tile on each of the satellite modules to operate as elements within a phased array. In one embodiment, each satellite module 1A through NM may include its own station keeping and/or maneuvering propulsion system, guidance control, and related circuitry. Specifically, as illustrated in FIG. 2, each of the satellite modules 102 of the solar power station 100 may include positioning sensors to determine the relative position 110 of the particular satellite module 1A through NM in relation to the other satellite modules 1A to NM, and guidance control circuitry and propulsion system to maintain the satellite module in a desired position within the arbitrary formation 104 of satellite modules during operation of the solar power station. Positioning sensors in accordance with many embodiments can include the use of external positioning data from global positions system (GPS) satellites or international ground station (IGS) network, as well as onboard devices such as inertial measurement units (e.g., gyroscopes and accelerometers), and combinations thereof. In several embodiments, the positioning sensors can utilize beacons that transmit information from which relative position can be determined that are located on the satellite modules and/or additional support satellites. The guidance control and propulsion system may likewise include any suitable combination of circuitry and propulsion system capable of maintaining each of the satellite modules in formation in the solar power station array 104. In many embodiments the propulsion system may utilize, among others, one or more of chemical rockets, such as biopropellant, solid-fuel, resistojet rockets, etc., electromagnetic thrusters, ion thrusters, electrothermal thrusters, solar sails, etc. Likewise, each of the satellite modules may also include attitudinal or orientational controls, such as, for example, reaction wheels or control moment gyroscopes, among others.

Figure 3:
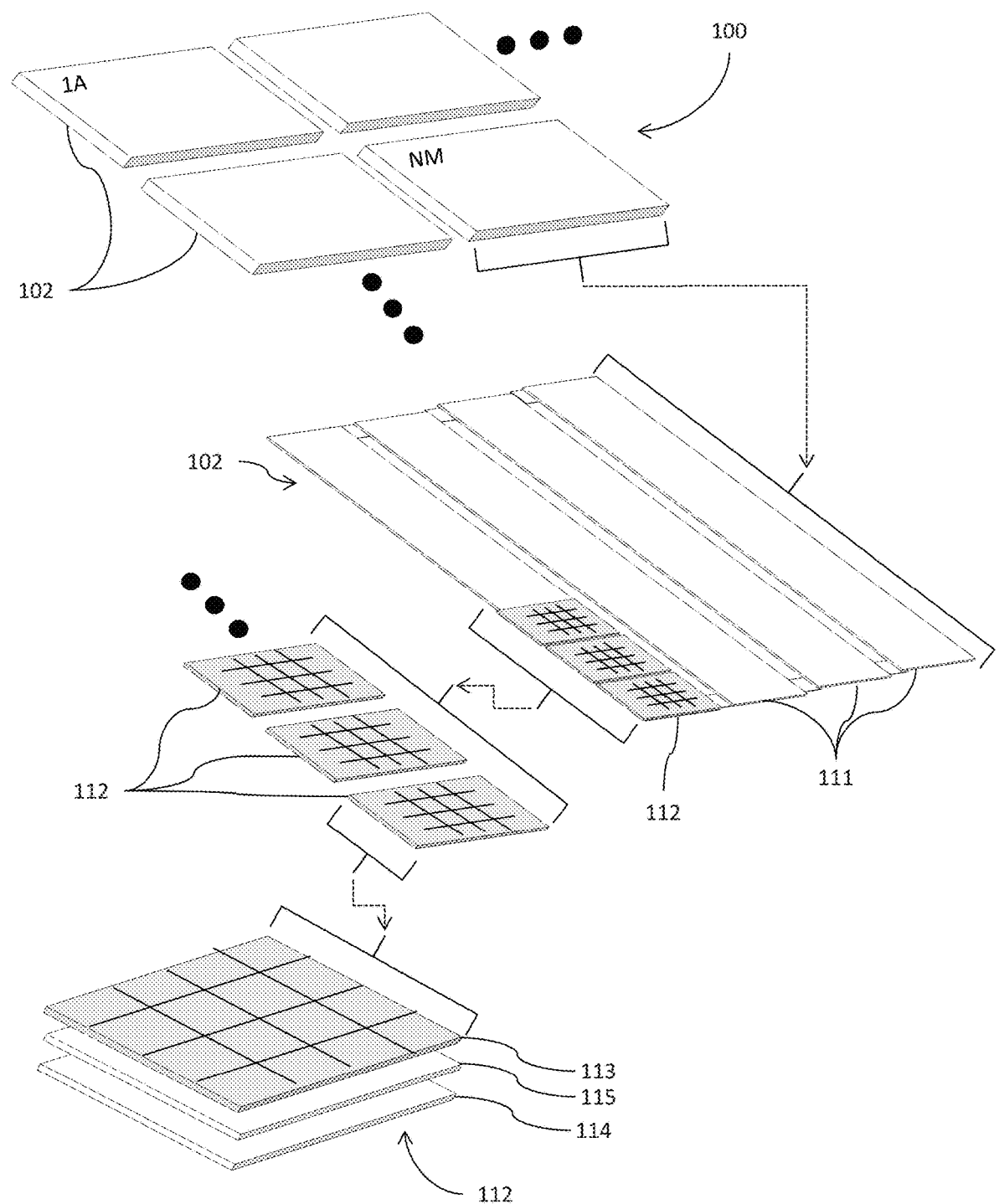
FIG. 3 conceptually illustrates a large-scale space-based solar power station, a satellite module, and a cross-sectional view of a modular power generation tile, according to one embodiment.

In many embodiments, as illustrated in FIG. 3, each satellite module 1A through NM of the solar power station 100 comprises a space structure comprised of one or more interconnected structural elements 111 having one or more power generation tiles 112 collocated thereon. Specifically, each of the satellite modules 1A through NM is associated with an array of power generation tiles 112 where each of the power generation tiles of the array each independently collect solar radiation and convert it to electric current. Power transmitters convert the electrical current to a wireless power transmission that can be received by a remote power receiving station. As discussed above, one or more power transmitters on each of a set of power generation tiles can be configured as an element in one or more phased arrays formed by collections of power generation tiles and satellite modules of the overall solar power station. In one embodiment, the power generation tiles in the satellite module are spatially separated from each other by a predetermined distance. In other embodiments, the construction of the satellite modules is such that the power generation tiles are separated by distances that can vary and the distributed coordination of the power generation tiles to form a phased array involves the control circuitry of individual power transmitters determining phase offsets based upon the relative positions of satellite modules and/or individual power generation tiles.

Power generation tiles 112 according to many embodiments include a multicomponent structure including a photovoltaic cell 113, a power transmitter 114, and accompanying control electronics 115 electrically interconnected as required to suit the needs of the power transmission application. As illustrated in FIG. 4a, in some embodiments photovoltaic cells 113, may comprise a plurality of individual photovoltaic elements 116 of a desired solar collection area that may be interconnected together to produce a desired electrical current output across the power generation tile. Some power transmitters 114 include one or more transmission antennas, which may be of any suitable design, including, among others, dipole, helical and patch. In the illustrated embodiment, a conventional patch antenna 114 incorporating a conductive feed 117 to conductively interconnect the RF power from the control electronics 115 to the antenna 114. As can readily be appreciated the specific antenna design utilized is largely dependent upon the requirements of a specific application. Some power transmitters 114 are physically separated from one or both of the photovoltaic cell 113 and/or the control electronics 115 such as by fixed or deployable spacer structures 118 disposed therebetween. Some control electronics 115 may include one or more integrated circuits 119 that may control some aspect of the power conversion (e.g., to a power emission such as collimated light or an radio frequency (RF) emission such as microwave radiation), movement and/or orientation of the satellite module, inter- and intra-satellite module communications, and transmission characteristics of the power generation tile and/or satellite module. Further conductive interconnections 120 may connect the control electronics 115 to the source power of the photovoltaic cell 113. Each of the power generation tiles may also include thermal radiators to control the operating temperature of each of the power generation tiles.

Figure 4B:
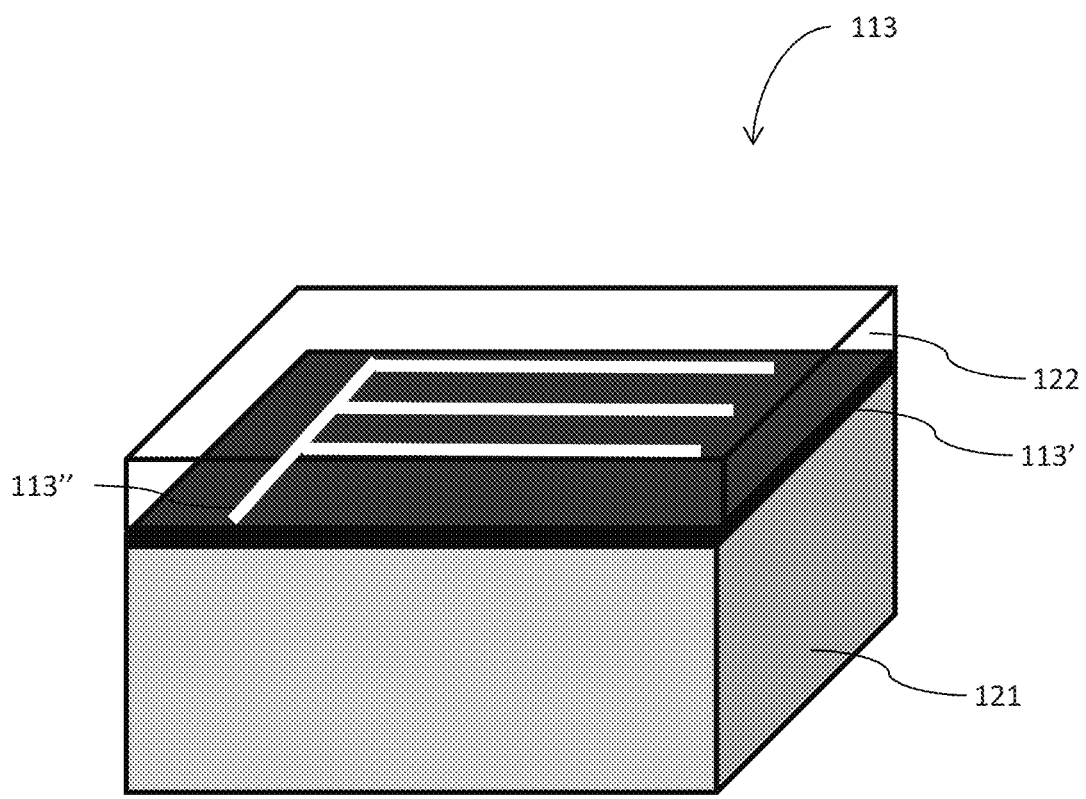
FIG. 4b conceptually illustrates a cross-sectional view of a photovoltaic cell, according to one embodiment.

In some embodiments, the PV 113 is a multi-layer cell, as illustrated in FIG. 4*b*, incorporating at least an absorber material 113' having one or more junctions 113" disposed between a back contact 121 on a back side of the absorber material and a top radiation shield 122 disposed on the surface of the absorber material in the direction of the incident solar radiation. The PV may include any electrical device that converts the energy of light directly into electricity by the photovoltaic effect including elements made from polysilicon and monocrystalline silicon, thin film solar cells that include amorphous silicon, CdTe and CIGS cells, multijunction cells, perovskite cells, organic/polymer cells, and various alternatives thereof. In some embodiments the photovoltaic material used within the PV cell is made from a thin film of GaInP/GaAs that is matched to the solar spectrum. Radiation shielding may include a solar radiation transparent material such as $SiO_2$ or glass, among others. The back contact may be made of any suitable conductive material such as a conductive material like aluminum, among others. The thickness of the back contact and top radiation shield may be of any thickness suitable to provide radiation shielding to the PV. Additional structures may be provided around the PV to increase the efficiency of the absorption and operation of the device including, for example, one or more concentrators that gather and focus incoming solar radiation on the PV, such as a Cassegrain, parabolic, nonparabolic, hyperbolic geometries or combinations thereof. The PV may also incorporate a temperature management device, such as a radiative heat sink. In some embodiments the temperature management device is integrated with the control electronics and may be configured to control the operating temperature of the PV within a range of from ~150 to 300 K. Particularly effective configurations for power generation tiles are discussed in a subsequent section of this application.

In a number of embodiments, the power transmitters that are components of power generation tiles are implemented using a combination of control circuitry and one or more antennas. The control circuitry can provide the power generation tile with the computational capacity to determine the location of the power generation tile antenna(s) relative to other antennas within the satellite module and/or the solar power station. As can readily be appreciated, the relative phase of each element within a phased array is determined based upon the location of the element and a desired beam direction and/or focal point location. The control circuitry on each power generation tile can determine an appropriate phased offset to apply to a reference signal using a determined location of the power generation tile antenna(s) and beam-steering information. In certain embodiments, the control circuitry receives position information for the satellite module and utilizes the position information to determine the location of the power generation tile antenna(s) and determine a phase offset to apply to a reference signal. In other embodiments, a central processor within a satellite module can determine the locations of antennas on power generation tiles and/or phase offsets to apply and provides the location and/or phase offset information to individual power generation tiles.

In many embodiments, the positional information of each tile is received from partially redundant systems, such as, but not limited to, gyroscopes, accelerometers, electronic ranging radar, electronic positioning systems, phase and/or timing information from beacons, as well as employing a priori knowledge from system steering and flight control commands. In several embodiments, electronic systems are located on the ground, and/or in space on satellites deployed for this purpose (and, possibly, other purposes, e.g. in the case of using GPS satellites).

In a number of embodiments, position information may be relayed in a hierarchical fashion between modules, panels and/or tiles within the space-based solar power station, such that a central processing unit relays positional information such as location and orientation of the entire space-based solar power station with respect to a ground station and/or other suitable known locations to modules within the system. The relayed information can be expressed as an absolute and/or differential location(s), and/or orientation(s) as appropriate to the requirements of specific applications. In a similar fashion, the location and/or orientation of each module with respect to the center of the space-based solar power station or other suitable reference point can be determined at each module using processes similar to those outlined above. Furthermore, going down a hierarchical level, the position and orientation information of individual panels and tiles can be determined in a similar fashion. The entirety or any useful part of this information can be used at the tile-level, the panel-level, the module-level, the system-level and/or any combination thereof to control the phase and/or amplitude of each tile radiator to form a beam or focal spot on the ground. The aggregate computational power of the computational resources of each tile, panel and/or module can be utilized since each tile (and/or panel or module) can utilize its local computational power available from a DSP, microcontroller or other suitable computational resource to control its operation such that the system in aggregate generates the desired or close-to desired beam and/or focused transmission.

Figure 4C:
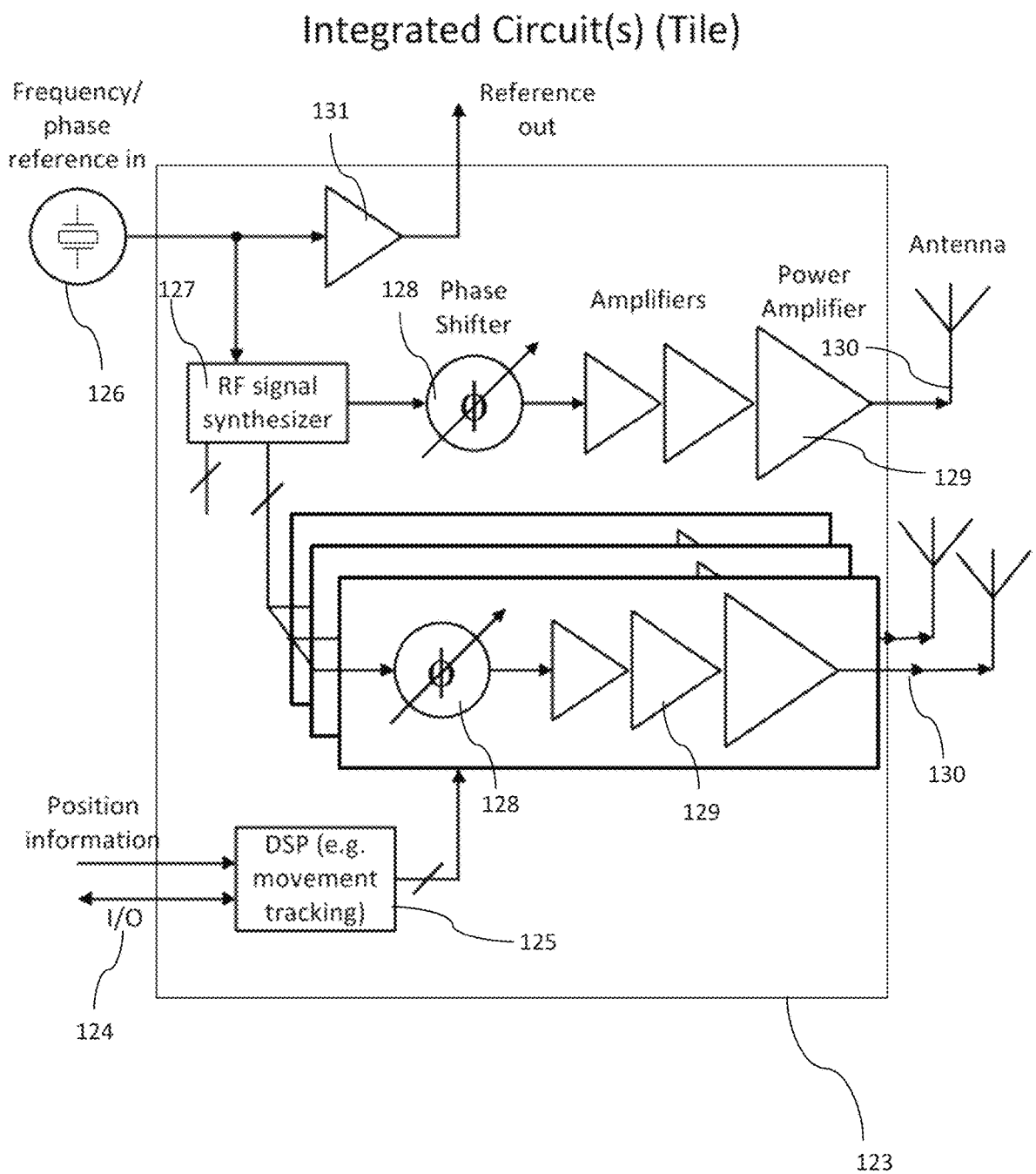
FIG. 4c conceptually illustrates a block-diagram for an integrated circuit suitable for utilization in a power transmitter forming part of a power generation tile, according to one embodiment.

In various embodiments, as illustrated conceptually in FIG. 4*c*, power generation tile control circuitry can be implemented using one or more integrated circuits. An integrated circuit 123 can include an input/output interface 124 via which a digital signal processing block 125 can send and receive information to communicate with other elements of a satellite module, which typically includes a processor and/or memory configured by a control application. In certain embodiments, the digital signal processing block 125 receives location information (see discussion above) that can be utilized to determine the location of one or more antennas. In many embodiments, the location information can include a fixed location and/or one or more relative locations with respect to a reference point. The digital signal processing block can utilize the received location information and/or additional information obtained from any of a variety of sensors including (but not limited to) temperature sensors, accelerometers, and/or gyroscopes to determine the position of one or more antennas. Based upon the determined positions of the one or more antennas, the digital signal processing block 125 can determine a phase offset to apply to a reference signal 126 used to generate the RF signal fed to a specific antenna. In the illustrated embodiment, the integrated circuit 500 receives a reference signal 126, which is provided to an RF synthesizer 127 to generate an RF signal having a desired frequency. The RF signal generated by the RF synthesizer 127 is provided to one or more phase offset devices 128, which are configured to controllably phase shift the RF signal received from the RF synthesizer. The digital signal processing block 125 can generate control signals that are provided to the phase offset device(s) 128 to introduce the appropriate phase shifts based upon the determined location(s) of the one or more antennas. In many embodiments, the amplitude of the generated signal can be modulated and/or varied alone or in conjunction with the phase appropriately upon the determined locations to form the power beam and/or focused transmission. The amplitude can be modulated in variety of ways such as at the input of a power amplifier chain via a mixer or within an amplifier via its supply voltage, an internal gate or cascade biasing voltage. As can readily be appreciated, any of a variety of techniques appropriate to the requirements of a specific application can be utilized to amplitude modulate an RF signal in accordance with various embodiments of the invention. The phase shifted RF signals can then be provided to a series of amplifiers that includes a power amplifier 129. While the entire circuit is powered by the electric current generated by the PV component(s) of the power generation tile, the power amplifier is primarily responsible for converting the DC electric current into RF power that is transmitted via the RF signal. Accordingly, the power amplifier increases the amplitude of the received phase shifted RF signal and the amplified and phase shifted RF signal is provided to an output RF feed 130 connected to an antenna. In many embodiments, the RF signal generated by the RF synthesizer is provided to an amplifier 131 and distributed to the control circuitry of other tiles. The distribution of reference signals between tiles in a module in accordance with various embodiments of the invention is discussed further below.

Although specific integrated circuit implementations are described above with reference to FIG. 4c, power generation tile control circuitry can be implemented using any of a variety of integrated circuits and computing platforms in accordance with various embodiments. Furthermore, satellite modules can be implemented without providing computational capabilities on each power generation tile and/or without utilizing the computational capabilities of a power generation tile to determine locations and/or phase shifts for the purposes of generating an RF signal to feed a power generation tile antenna.

In many embodiments, as illustrated conceptually in FIG. 5, a plurality of power generation tiles 112 on each satellite module may each form a panel 160 of a modular phased array 162 incorporating at least self-contained, collocated photovoltaics, power transmitters and control electronics within each power generation tile. The control electronics may allow for wire or wireless communications between the individual power generation tiles for the exchange of timing and control information. The array of control electronics may also allow for the exchange of control and timing formation with other satellite modules. Collocation of at least the power collection, far-field conversion, and transmission elements on each modular power generation tile allows for the each power generation tile to operate as an independent element of the phased array without inter- and intra-module power wiring.

In one embodiment, the power generation tiles and/or satellite modules may include other related circuitry. The other circuitry may include, among others, circuitry to control transmission characteristics of the power generation tiles, thermal management, inter or intra-module communications, and sensors to sense physical parameters, such as orientation, position, etc. The control circuitry may control transmission parameters such as phase and timing information such that the arrays of power generation tiles across each module and across the solar power station may be operated as independent array elements of one or more phased arrays. The sensors may include gyroscopes, GPS or IGS devices to estimate position and orientation, and thermocouples to estimate the temperature on the power generation tiles.

In one embodiment, the circuits for controlling transmission characteristic parameters may be collocated on the several power generation tiles or satellite modules and may control each transmitter of each power generation tile independently or in a synchronized manner such that the tiles operate as one or more element of one or more phased arrays. Reference signals (e.g., phase and timing) that can be used to synchronize the operation of the power generation tiles as a phased array may be generated locally on each power generation tile or satellite module and propagated via wired or wireless intra and inter-module communications links, or may be generated centrally from a single source on a single satellite module and propagated via wired or wireless intra and/or inter-module communications links across each of the satellite modules and power generation tiles. In addition, one or multiple timing reference signals may be generated from outside the space-based solar power station system such as one or more satellites flying in close proximity or even in different orbits; as well as from one or more ground stations.

Each power generation tile or satellite module may be operated independently or collectively as an element in a phased array. Entire or most operations associated with each individual power generation tile may be collocated on each of the power generation tiles or collectivized within the satellite module on which the power generation tiles are collocated, or across multiple satellite modules. In one embodiment, a central reference signal is generated and deviation (e.g., phase) from such reference signal is determined for each power generation tile array element of the phased array. By propagating a central reference signal from the reference signal, higher levels of control abstraction can be achieved to facilitate simpler programming for many operations of the phased array.

In some embodiments, each power generation tile of each satellite module may be the same or different. The number of distinct combinations of photovoltaic cells, transmission modules and control electronics may be as large as the number of power generation tiles in the satellite modules. Further, even where each of the power generation tiles on a satellite module are the same, each of the satellite modules 1A through NM or a group of satellite modules may have different solar radiation collection or transmission characteristics or may have arrays of power generation tiles of different sizes, shapes and configurations.

In certain embodiments, the solar power station is designed as a modular phased array where the plurality of satellite modules and power generating tiles located thereon form the array elements of the phased array. For this purpose, each of the satellite modules may be designed to be physically compatible with conventional launch vehicles although the achieved power generation of the phased array of the solar power station may exceed conventional space-based solar power satellites in many respects. Taking advantage of the increased performance, the solar power station phased array of the embodiment may include smaller payload size and overall array size to obtain equal or better power generation compared to conventional space-based solar power satellites. Alternatively, the size of the overall solar power station may be reduced compared to solar platforms in conventional solar power satellites while achieving comparable results.

In order to match the power generation of a conventional solar power satellite without increasing platform size or weight, the power collection, transmission and control logic for the individual power generation tiles is preferably collocated within each of the power generation tiles or within the satellite module on which the power generation tiles are collocated thus eliminating the need for intra- or inter-module communications, wiring or structural interconnection. In one embodiment, much of the power transmission control logic is a single collection of functions common to all or most of the power generating tiles. In this embodiment, the conventional external intra- and inter-power generation tile infrastructure for the solar power station may be entirely eliminated thus reducing the power generated per weight unit (W/kg).

In one embodiment, the phased array of the solar power station including the satellite modules and power generation tiles replaces a conventional monolithic solar power satellite. The solar power stations includes N×N satellite modules, each module including power generation tiles of $$\frac{M}{N^2}.$$

Table 1 lists example configurations of solar power stations according to embodiments replacing conventional solar power stations.

view, the preferred number of elements in the phased array formed by a solar power station and the wavelength of the transmission will depend on the size of the receiving rectenna and/or array of receiving rectennas. In many embodiments it is desirable to have the maximum power lobe on the ground coextensive with the rectenna area.

Figure 7:
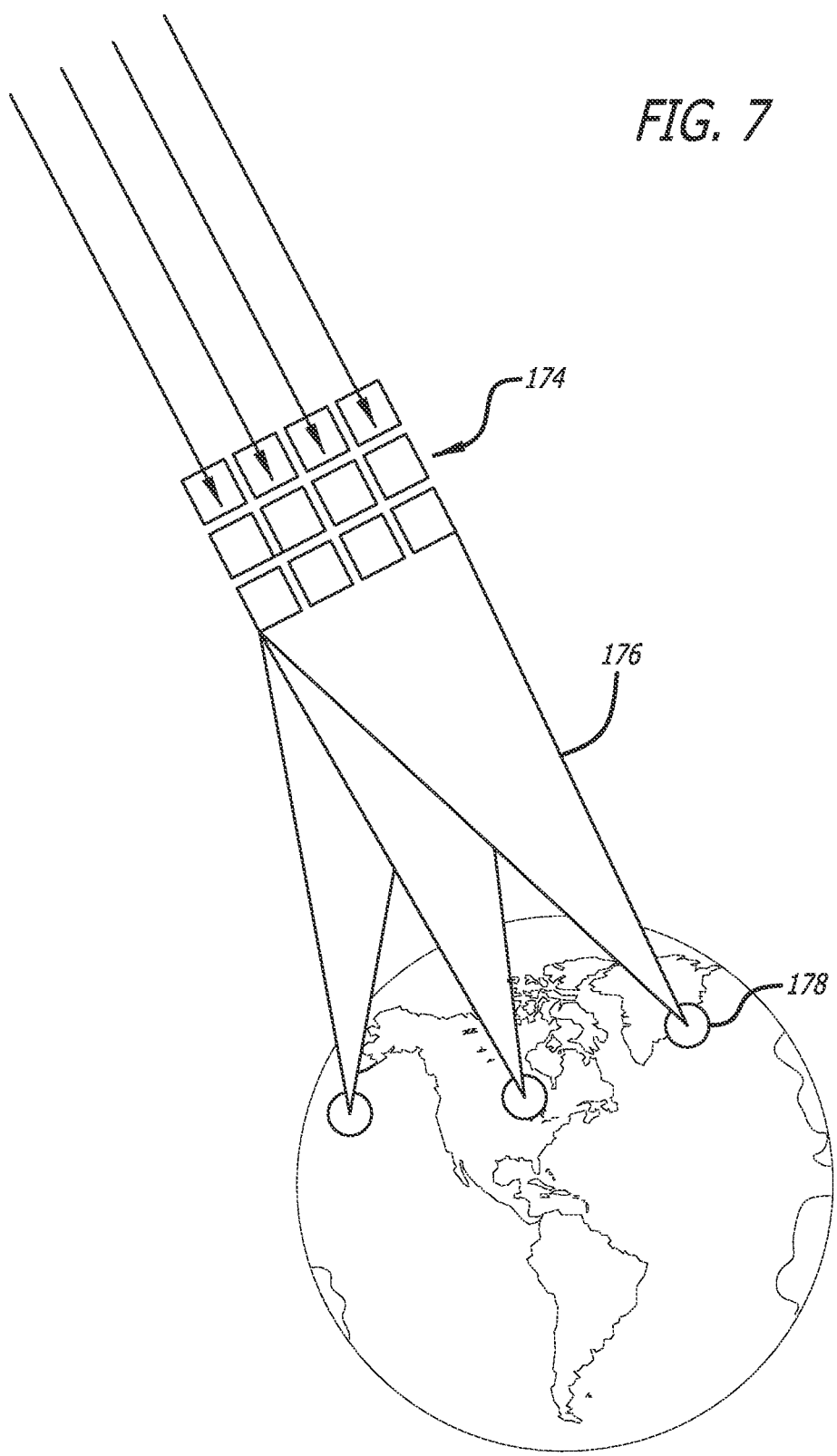
FIG. 7 conceptually illustrates dynamic power allocation from a large-scale space-based solar power system, according to one embodiment.

In certain embodiments this limitation many also be overcome by dividing the power transmission output 176 of the solar power station 174 between different rectenna power receivers 178, as illustrated conceptually in FIG. 7. In many embodiments, different collections of elements (e.g., satellite modules and/or power generation tiles) forming part of the solar power station 174 may be configured into different phased arrays that may be simultaneously directed at different rectenna power receivers 178 on the ground thus potentially reducing the individual incident areas radiated by the solar power station. In some embodiments additional control circuitry is provided either within the satellite module or within each of the power generation tiles to allow for dynamic electronic steering of the transmission beam, either from the collective power generation tiles of a satellite module or from each power generation tile independently. In some embodiments the power steering circuitry may allow

| | | | SPS Configuration Parameters | | |
|---|---|---|---|---|---|
| Efficiency Standards | | SPS Configuration | W/kg | Max Size | Exemplary Phased Array System Performance* |
| Solar Cell Efficiency | 35% | | | | |
| DC-Microwave Conversion | 78% | USEF | 41 | 100 × 95 m | Power Received 12 GW |
| Collection Efficiency | 86% | JAXA | 98 | 3.5 km | Power Received/Module 1.72 MW |
| Transmission Efficiency | 77% | ESA | 132 | 15 km | Power Received Rectenna 1.34 GW |
| Atmospheric Absorption | <2% | Alpha | 33 | 6 km | Rectenna size: 6.65 km |
| Overall | 14% | Modular Phased Array According to Embodiments | 2270 | 60 × 60 m | Total mass (avg: 100 g/m²) 900000 kg |

*Assuming a Solar Power Station having a 50 × 50 array of 60 × 60 m satellite modules in a geosynchronous orbit with a 1 GHz power transmission having a a/λ = 0.5, and a solar irradiance of 1400 W/m².

The Conventional SPS performance in Table 1 are taken from published literature. The Exemplary Phased Array System Performance in Table 1 are estimates and may differ based on the actual design parameters implemented.

Figure 6:
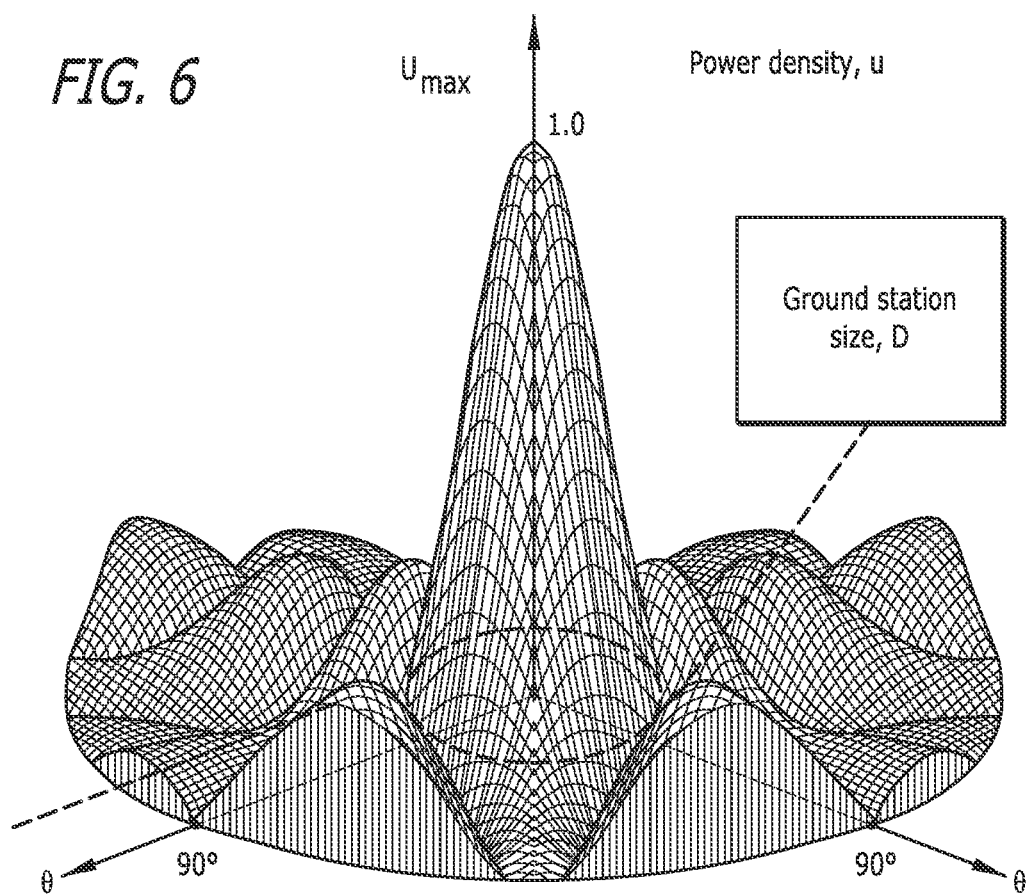
FIG. 6 conceptually illustrates the power density distribution at a ground receiver from a transmission of power from a phased array of antennas on a solar power station, according to certain embodiments.
Figure 8A:
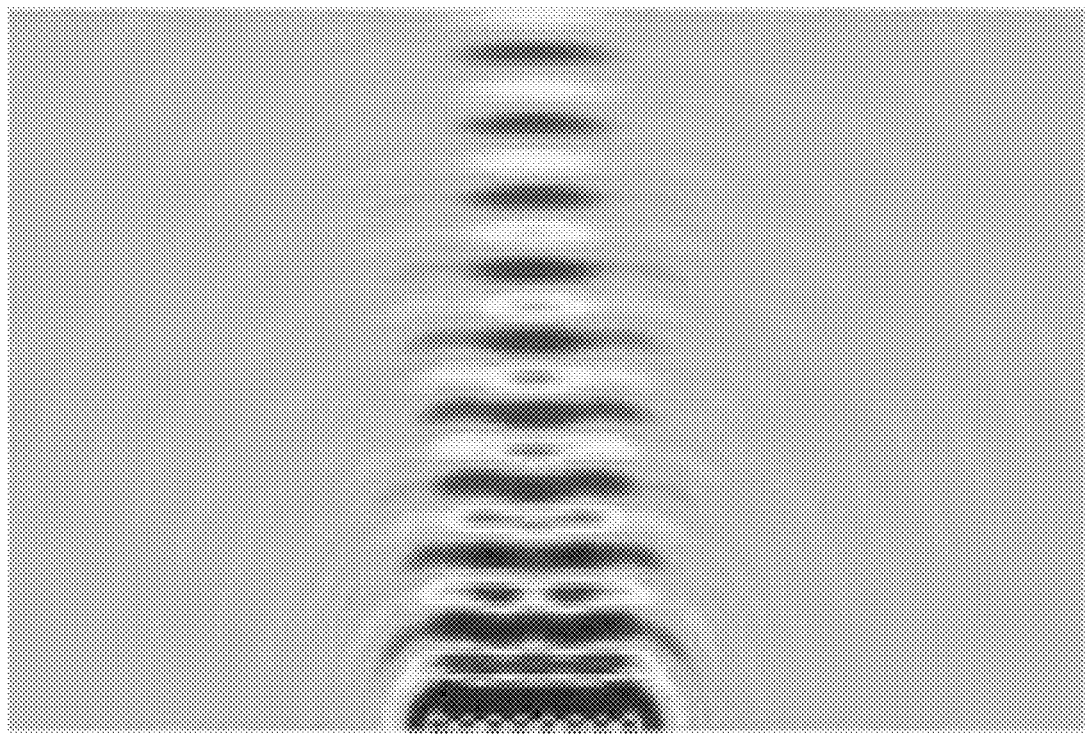
FIGS. 8a and 8b conceptually illustrate electronic beam steering using relative phase offset between elements of a phased array, according to one embodiment.
Figure 8B:
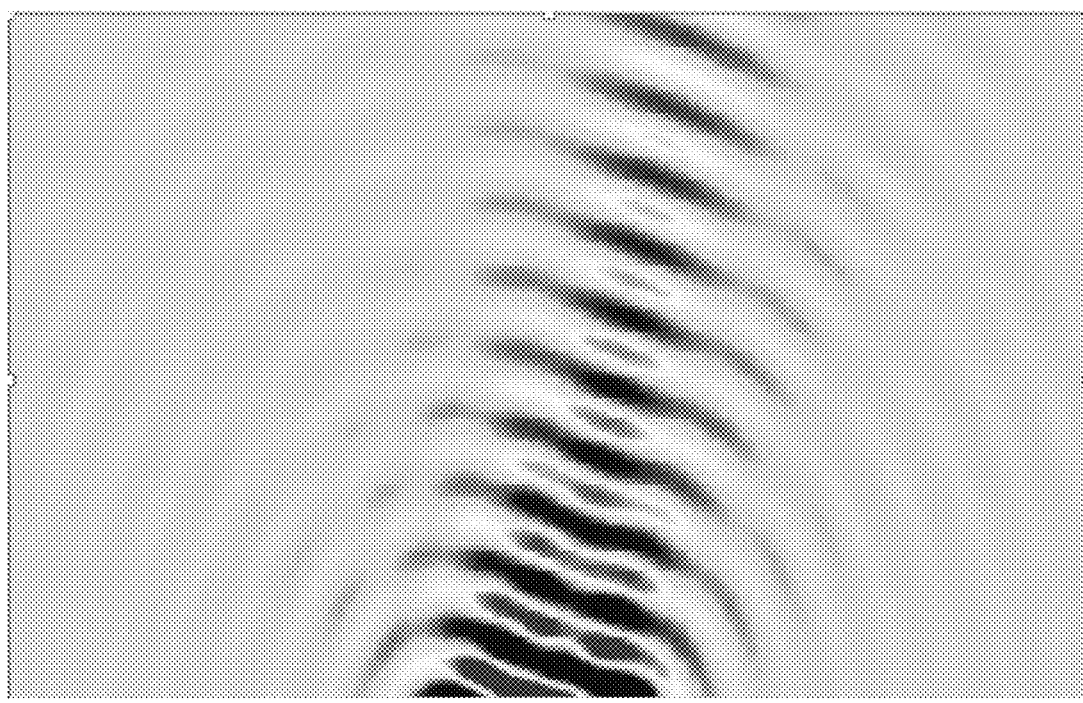

The number of power generation tile array elements in each satellite module, and the number of satellite modules in the solar power station may be determined based on, among other factors, power requirements, payload restrictions, etc. A first factor for the size of an overall solar power station is the power to be generated at the power receiving rectenna. As illustrated in FIG. 6, in embodiments the power incident on the ground using a far-field RF emission can have a maximum power lobe ($u_{max}$) that is dependent on factors including (but not limited to) the size of the array, the wavelength of the RF transmission, and the phase offset error tolerated within the phased array. For example, in embodiments of a 50×50 array of satellite modules in a solar power station formed by 60×60 m satellite modules a maximum power lobe of 926 W/m² is estimated to be generate on the ground with a sidelobe level of 44 W/m². The incident area of the maximum power lobe with a 1 GHz emission is estimated to have a diameter of 6.6 km, while the incident area is estimated to have a diameter of 2.8 km for a 2.4 GHz emission. From a power transmission point of for the control of the relative timing (phase) of the various power transmitters on the power generation tile array elements, as illustrated conceptually in FIGS. 8a and 8b, such that each transmission beam may be redirected electronically at micro- and/or nano-second time scales. The power transmission from such dynamically steerable phased array on a solar power station allows for the entire phased array or portions thereof to be dynamically redirected in different directions dependent on demand at one or more rectenna power receivers. Many embodiments characterized by such dynamically directable phased arrays on power solar stations may be used to redirect the power transmission in different directions at micro and nano-second time scales by electronic steering. Certain embodiments also allow for power transmissions to be dynamically distributed to various ground stations either simultaneously or sequentially based on instantaneous local demand. Power levels at each of such rectenna receivers may also be dynamically adjusted. Rapid time domain switching of power amongst rectenna receivers can also be used to control duty cycle and alleviate large scale AC synchronization issues with respect to an overall power grid.

A second factor that may constrain the number of array elements in any satellite module is the issue of payload size and weight. Current payload delivery technologies for geosynchronous orbits range from 2,000 to 20,000 kg. Accordingly, the limit to the size of any single satellite module is the actual lift capacity of available payload delivery vehicles. Based on an assumption of 100 g/m² for the phased array satellite modules according to embodiments, a 60×60 m satellite module would have a weight of 360 kg, well within the limits of current delivery technologies. Larger modules could be produced provided they are within the lift capacity of available lift vehicles.

Figure 9A:
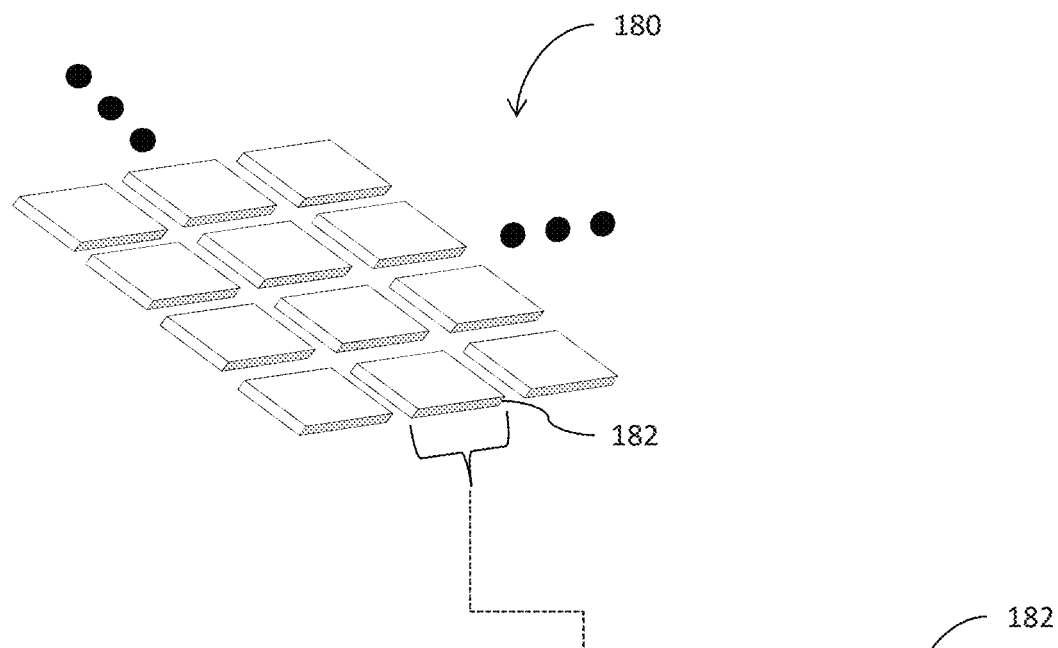
FIG. 9a conceptually illustrates a large-scale space-based solar power station and a compactable satellite module in a deployed configuration, according to certain embodiments.
Figure 9B:
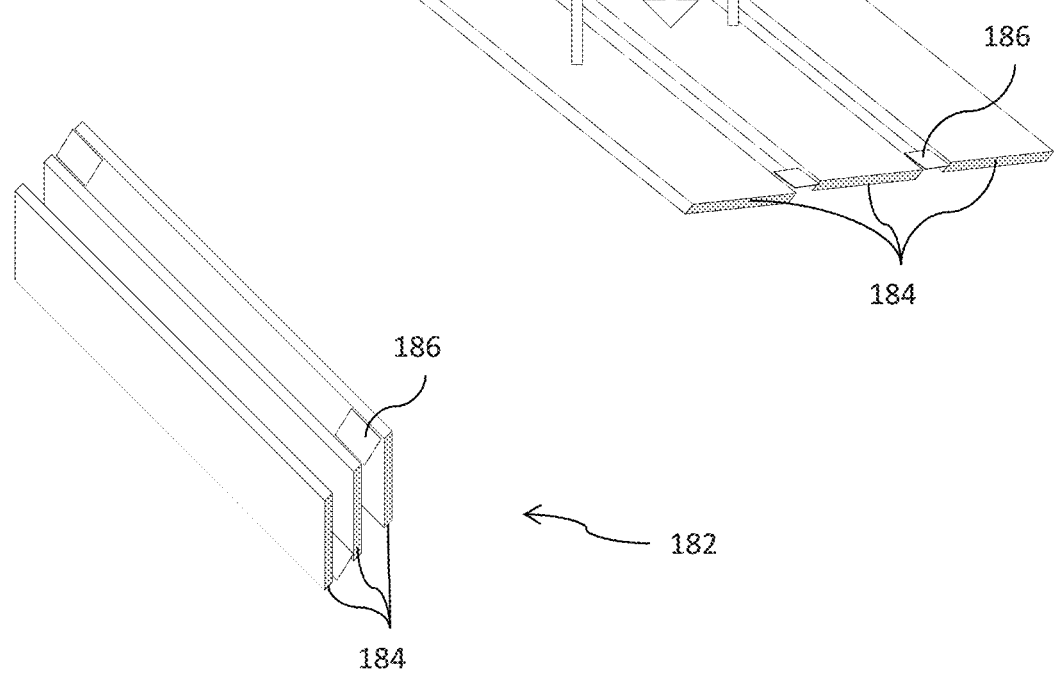
FIG. 9b conceptually illustrates a retracted compactable satellite module, according to FIG. 9a in a retracted configuration.

In some embodiments, satellite modules are compactable such that the size of the satellite module in one or more dimensions may be reduced during delivery to overcome payload space constraints and then expanded into its final operating configuration. As illustrated in FIGS. 9a and 9b, in many embodiments the solar power station 180 includes an array of satellite modules 182, each satellite module comprising a plurality of structural elements 184 that are movably interconnected such that the plurality of structural elements may be moved between at least two configurations: a deployed configuration (FIG. 9a) and a compacted configuration (9b), such that the ratio of the packaged volume to the material volume is larger in the deployed configuration when compared to the compacted or packaged configuration. In some embodiments, the structural elements 184 may be hinged, tessellated, folded or otherwise interconnected 186 such that the structural elements can move in relation to each other between the compacted and deployed configurations. Each satellite module of a solar power station may be configured to compact to the same or different sizes. In addition, different compacting methods may be used to compact one or more satellite modules of a solar space station, including, among others, one and two-dimensional compaction structures. In some embodiments, one or a combination of z-folding, wrapping, rolling, fan-folding, double z-folding, Miura-ori, slip folding and symmetric wrapping may be used, among others.

In many embodiments the power generation tiles may have further compactible and expandable features and structures disposed thereon. In some embodiments of power generation tiles the photovoltaic cell and power transmitter may be movably interrelated through a compactable structure, such that when in a compacted or packaged configuration the elements of the power generating cell are compressed together to occupy a total volume lower than when in a deployed configuration. In some deployed configurations the photovoltaic cell and power transmitter are separated by a gap (e.g., to create a vertical offset therebetween). Certain embodiments having a compactable structure include motorized interconnections and resilient members such as spring or tension arms that are bent or under compression, among others. Such compactable structures may also incorporate packaging techniques such as one or a combination of z-folding, wrapping, rolling, fan-folding, double z-folding, Miura-ori, slip folding and symmetric wrapping may be used, among others.

The power generation tiles and/or satellite modules may include other structures to enhance the collection of solar radiation or transmission of power from the power generation tiles and/or satellite modules. Structures that may be incorporated into power generation tiles and/or satellite modules may include, among others, thermal radiators for controlling the thermal profile of the power generation tiles, light-collecting structures (e.g., radiators, reflectors and collectors) to enhance the efficiency of solar radiation collection to the photovoltaic cell, and radiation shielding to protect the photovoltaic cells, power transmitters and/or control electronics from space radiation. Such structures may also be independently compactible, between packaged and deployed configurations, as described above in relation to other elements of the power generation tiles.

A design for a satellite module or power generation tile may be applied to different satellite modules or power generation tiles. Other variables in the solar power station such as spatial distances, photovoltaics, power transmitter, control electronics and combinations with may be modified to produce a phased array with differing power collection and transmission characteristics. In this way, a diverse mix of solar power stations may be produced while maintaining the benefits of the modular solar power station described.

Compactable Space Structures

In many embodiments, the satellite modules of the solar power station employ compactible structures. Compactable structures allow for the satellite modules and/or power generation tiles to be packaged in a compacted form such that the volume occupied by the satellite module and/or power generation tiles can be reduced along at least dimension to allow for the satellite modules to fit within an assigned payload envelope within a delivery vehicle. Several exemplary embodiments of possible packaging schemes are provided, however, it should be understood that the packaging procedure and compactible structures may involve, among other procedures, using one and two-dimensional compaction techniques, including, one or a combination of z-folding, wrapping, rolling, fan-folding, double z-folding, Miura-ori, star folding, slip folding and wrapping.

Figure 10:
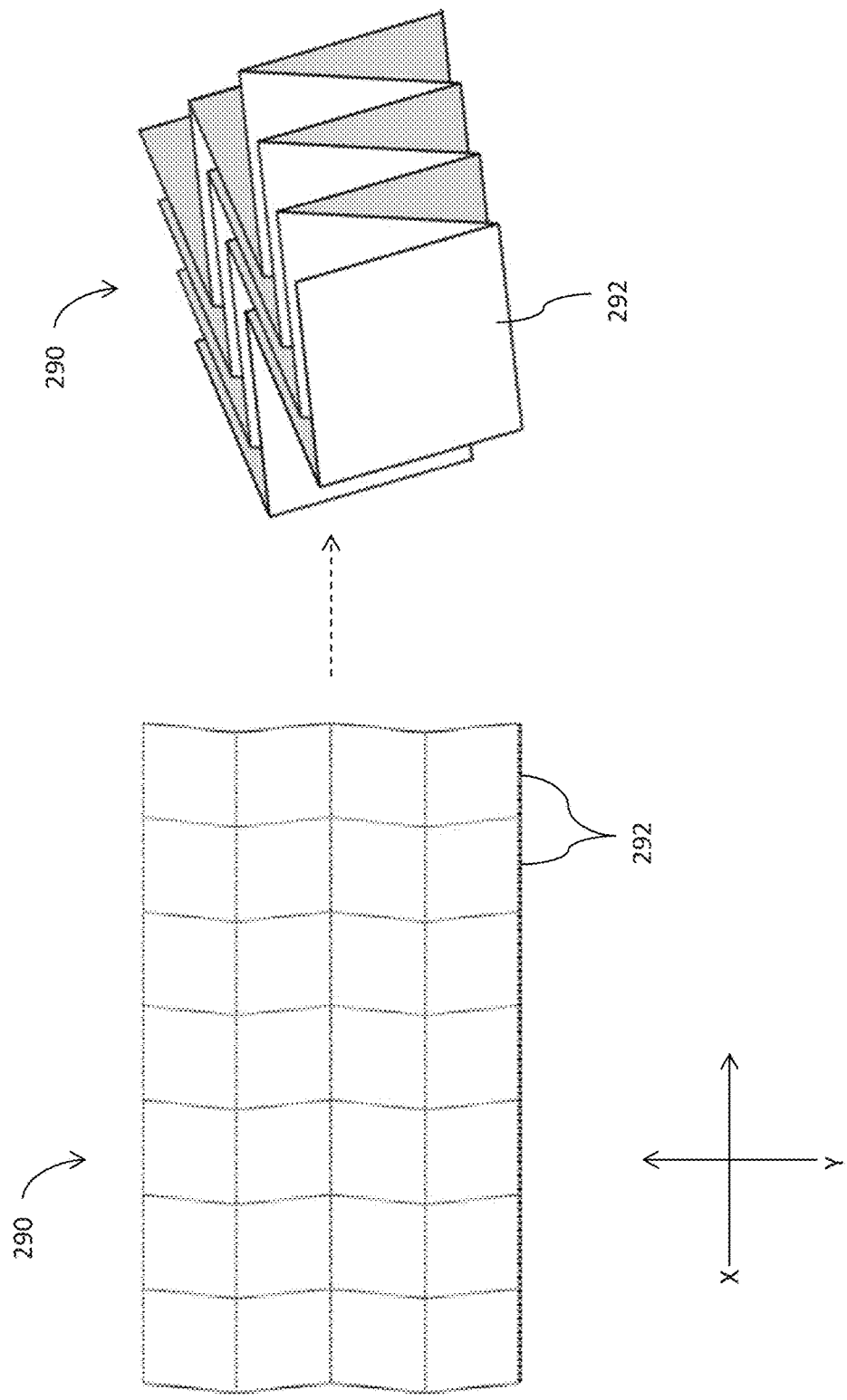
FIG. 10 conceptually illustrates a compactable satellite module having a biaxial folding configuration, according to certain embodiments.
Figure 11:
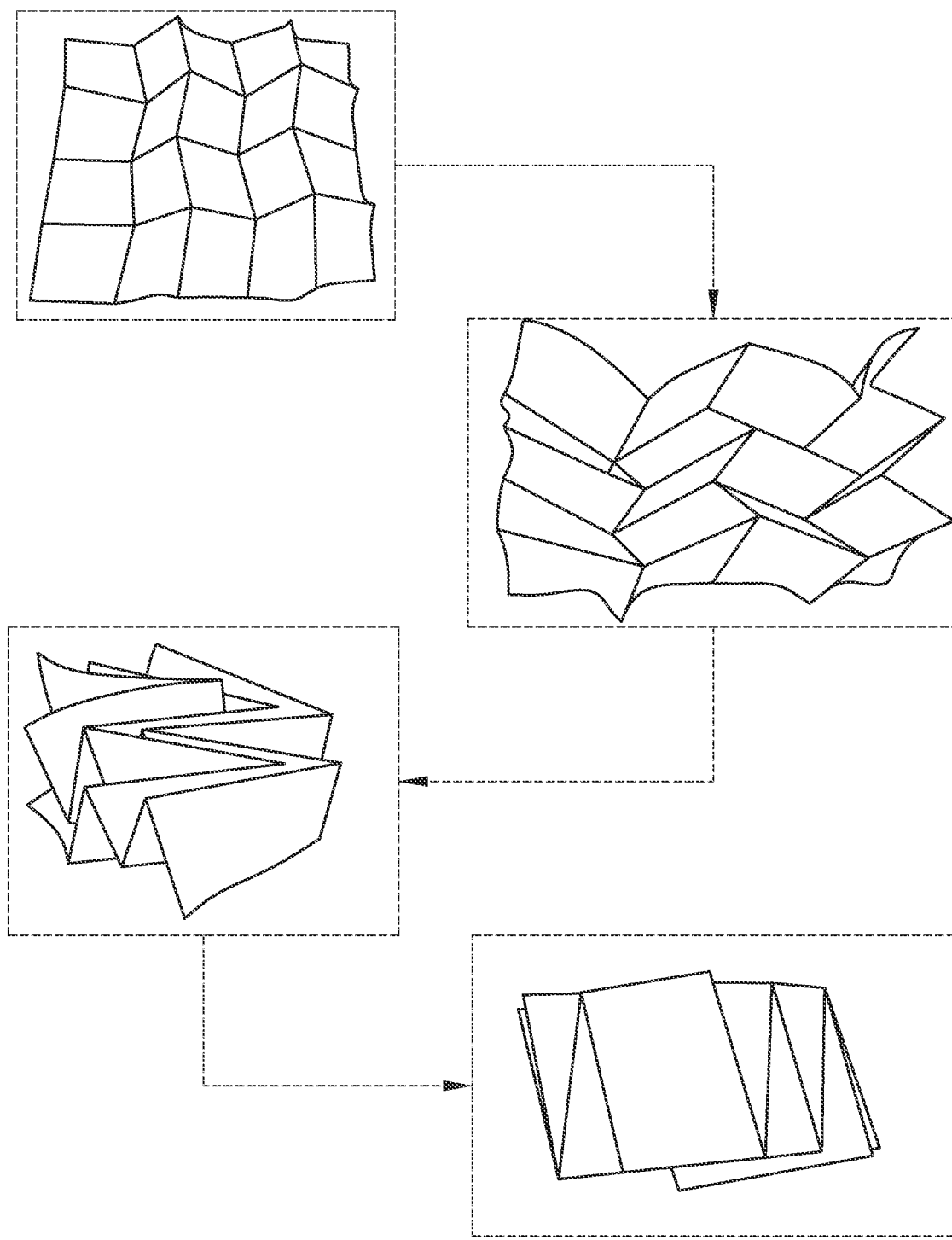
FIG. 11 provides images of the compaction of a membrane using the compaction technique of FIG. 10.

In many embodiments a two-dimensional compacting technique may be utilized to package and deploy the satellite modules and/or power generation tiles. FIG. 10 provides a perspective view of a satellite module 290 with a plurality of power generation tiles 292, according to embodiments. The plurality of power generation tiles 292 in this embodiment are hinged together and tessellated into a Miura-ori folding pattern such that the satellite module is compacted biaxially along an X and Y axis. Although the hinges interconnecting the panels may be made of any suitable design, in one embodiment the hinged elements are interconnected by carbon fiber rods or other suitable support structure. Images of a membrane being folded in accordance with these embodiments are provided in FIG. 11.

Figure 12A:
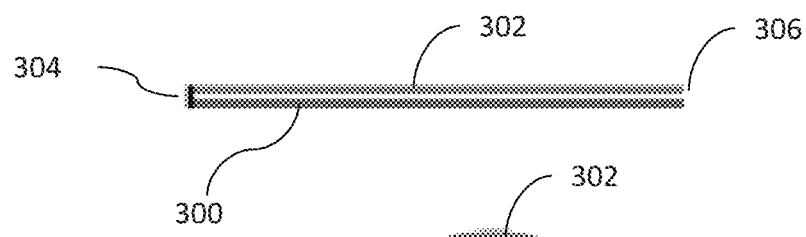
FIGS. 12a to 12d conceptually illustrate a cross-sectional view of a compactable satellite module having a slip folding and wrapping configuration, according to certain embodiments.
Figure 12B:
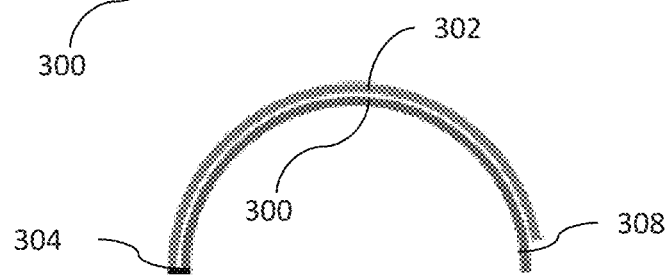
Figure 12C:
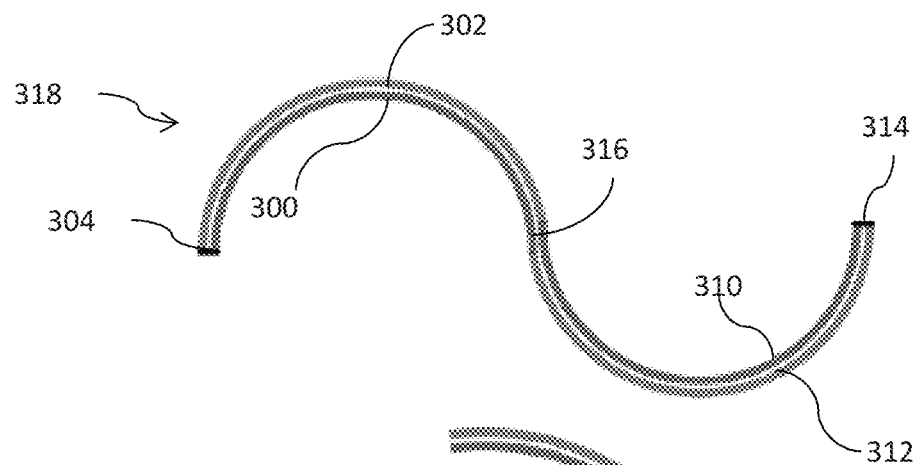
Figure 12D:
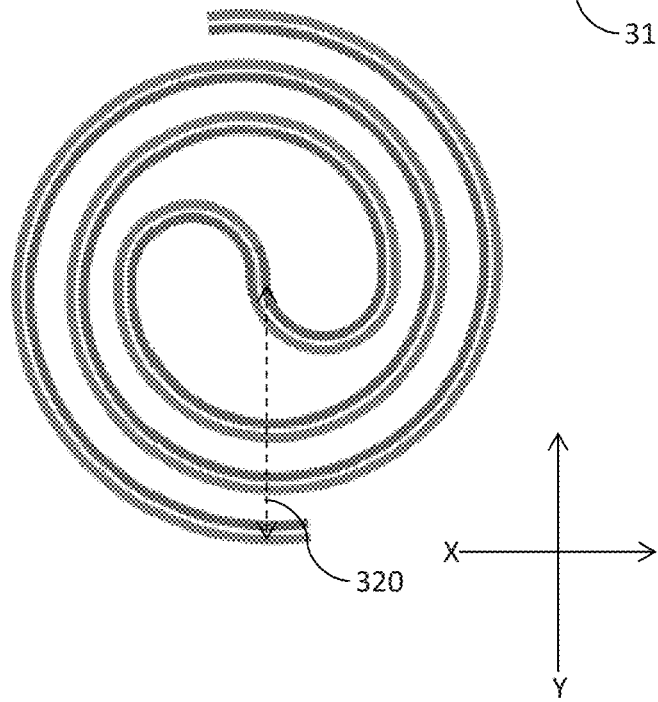

In many embodiments a slip-wrapping compacting technique may be utilized to package and deploy the satellite modules and/or power generation tiles. FIGS. 12a to 12d provide cross-sectional views of the construction of embodiments of the slip-wrapping technique. As shown, in these embodiments two elongated elements 300 and 302 interconnected at a first end 304 and open at a second end 306 (FIG. 12a) are wrapped about a hub (FIG. 12b). Such wrapping causes one of the elongated elements 300 to slip along its longitudinal length with respect to the second elongated element 302 such that a gap 308 forms between the unconnected ends of the elements. A second set of such elongated elements 310 and 312 interconnected at one end 314 are then obtained by a 180° rotation of the first set of elongated elements and the non-interconnected ends are then joined together 316 to form a single elongated element of an undulating configuration 318 interconnected at both ends 304 and 314 (FIG. 12c). The undulating strip thus formed may then be wrapped about a hub of a specified radius 320 that is no smaller than the minimum bend radius of the material of the elongated element thus reducing the dimensions of the satellite module biaxially in both an X and a Y axis (FIG. 12d).

Figure 13:
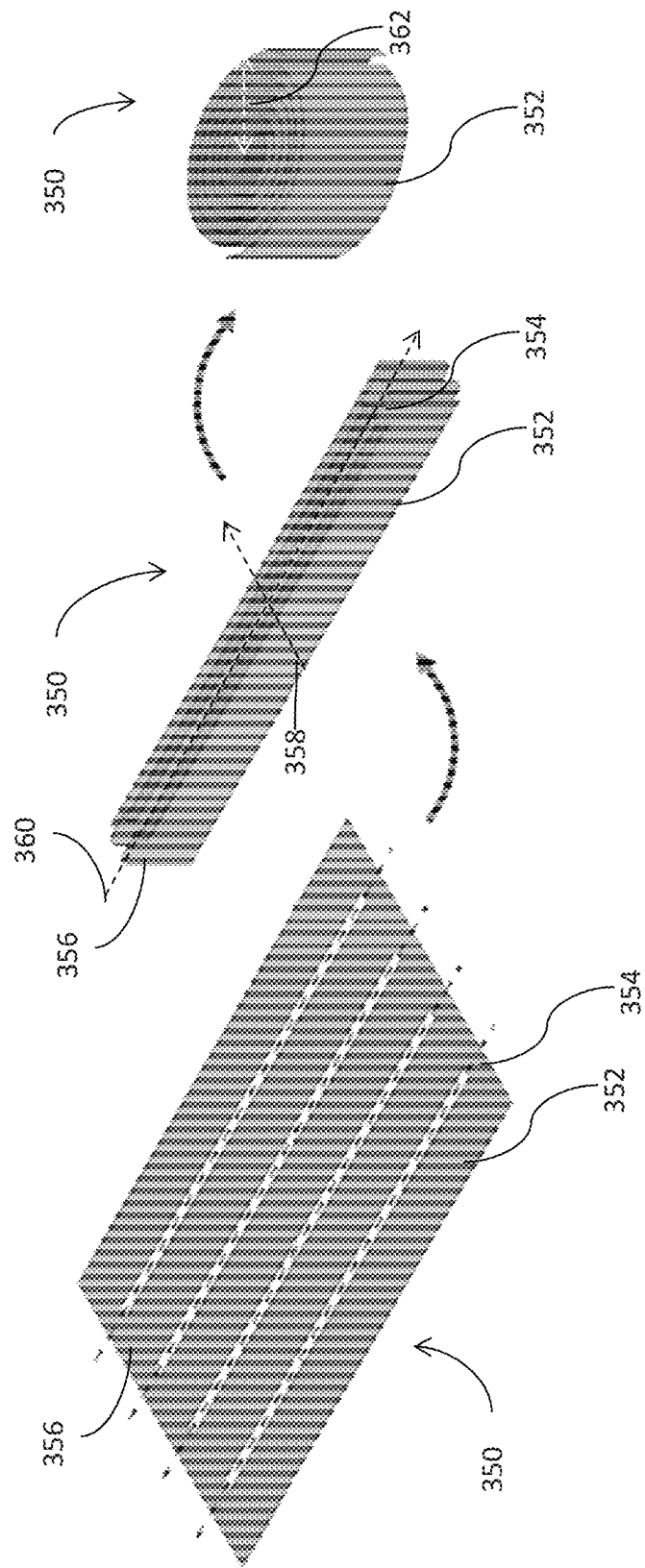
FIG. 13 conceptually illustrates a perspective view of a compactable satellite module having a slip folding and wrapping configuration, according to certain embodiments.
Figure 14:
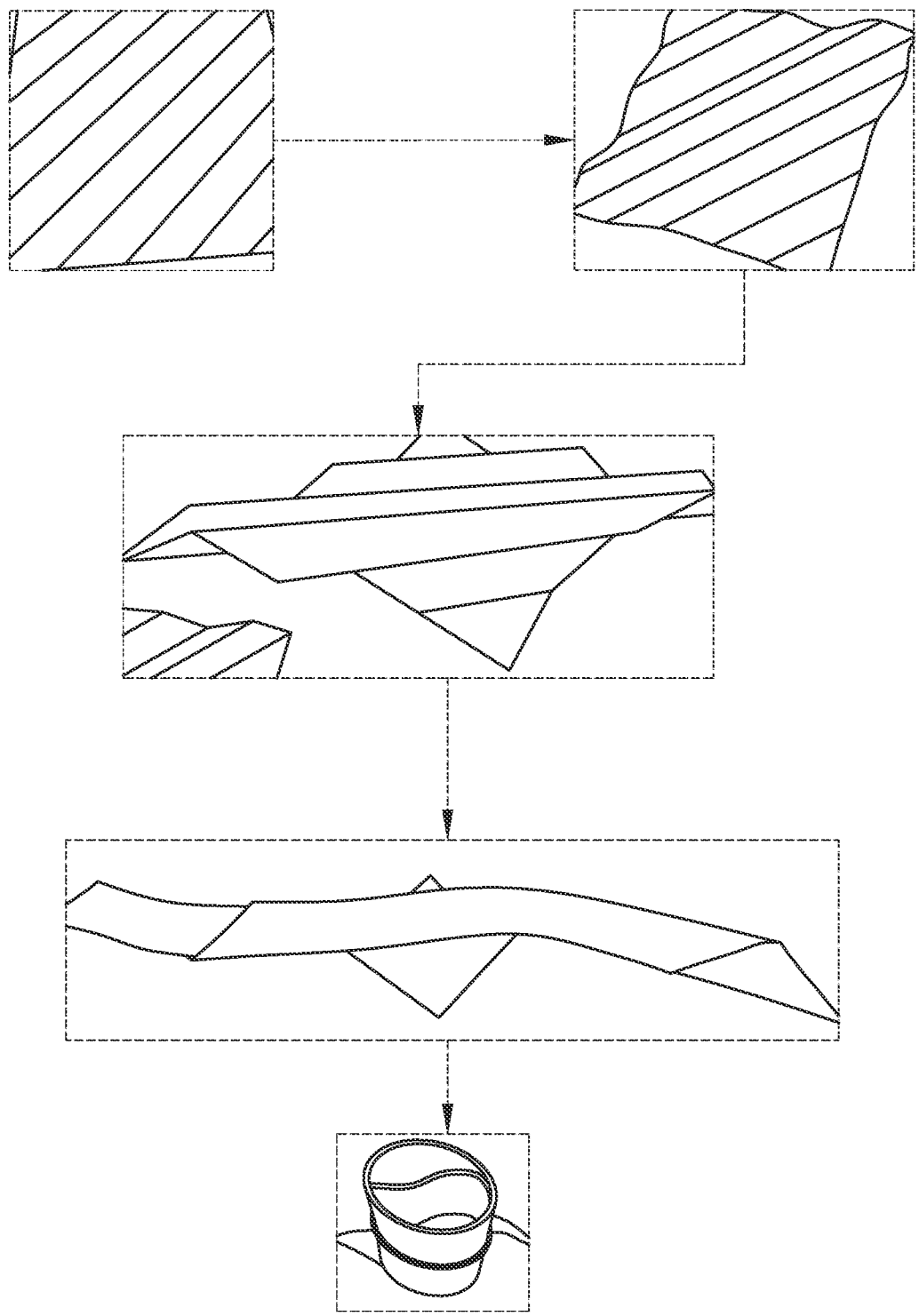
FIG. 14 provides images of the compaction of a membrane using the compaction technique of FIG. 13.

Some embodiments of a slip-wrap packing technique as applied to a compactible satellite module 350 are shown in a perspective view in FIG. 13. In one embodiment the satellite module is formed of a plurality of elongated structures 352 that are interconnected at two ends 354 and 356, but that are allowed to shear along their edges. During packaging the elongated structures are first folded with z-fold to form an elongated plurality of structures that are compacted along a first axis 358 orthogonal to the longitudinal axis 360 of the elongated structures. The compacted elongated structures are then wrapped about a hub with a radius 362 (which is selected to be no smaller than the minimum bend radius of the elongated structures of the satellite module) to further compact the strips along a second axis, thereby forming a fully compacted satellite module. Although a satellite module with an overall rectangular configuration are shown in FIGS. 12 and 13, it should be understood that the technique may be implemented with any configuration, number or shape of individual strip elements so long as they are joined at the edges and the edges are permitted to shear as described above. Images of a compactible structure using a diagonal z-fold in accordance with these embodiments are provided in FIG. 14. In this embodiment the deployed square of 0.5 m may be packaged into a cylindrical structure with a diameter of 10 cm and a height of 7 cm.

Using such techniques it is possible to significantly reduce the packaging volume of the satellite modules. In one exemplary embodiment where the compactible structures of a satellite module have a tile/panel thickness of 1 cm and a minimum bend radius of 10 cm, a satellite module with a deployed area of 60 m×60 m and being comprised of 30 such compactible structures would be compatible using the slip-wrap packaging technique into cylindrical package with a diameter of 5 m and a height of 2 m.

In many embodiments, the number of compactible elements in each of the satellite modules in a solar space station may be the same or different and may contain one or more power generation tiles collocated thereon. One or more compacting techniques may be used in packaging the compactible elements of each of the satellite modules and the techniques use may also the same or different. In many embodiments the compacting techniques utilized to package the satellite modules prior to deployment reduce the packaging volume of the satellite module in at least one dimension such that the satellite module fits within the allowed payload volume of the selected delivery vehicle.

In many embodiments, the power generation tiles may have further compactible and expandable features and structures disposed thereon. In some embodiments, power generation tiles, the photovoltaic cell, and power transmitter may be movably interrelated through a compactable structure, such that when in a compacted or packaged configuration the elements of the power generation tile are compressed together to occupy a total volume lower than when in a deployed configuration. In some deployed configurations the photovoltaic cell and power transmitter are separated by a gap (e.g., to create a vertical offset therebetween). Some embodiments of compactable structure include motorized interconnections and resilient members such as spring or tension arms that are bent or under compression, among others. Such compactable structures may also incorporate packaging techniques such as one or a combination of z-folding, wrapping, rolling, fan-folding, double z-folding, Miura-ori, slip folding and symmetric wrapping may be used, among others.

In many embodiments, deployment mechanisms are provided to deploy the compacted satellite modules (e.g., move the compactible elements of the satellite module from a compacted to a deployed configuration). In many embodiments, an active or passive mechanism is interconnected with one or more portions of the compactible structures of the satellite module such that when activated the compacted structures of the satellite modules may be expanded into a deployed operational configuration.

Figure 15:
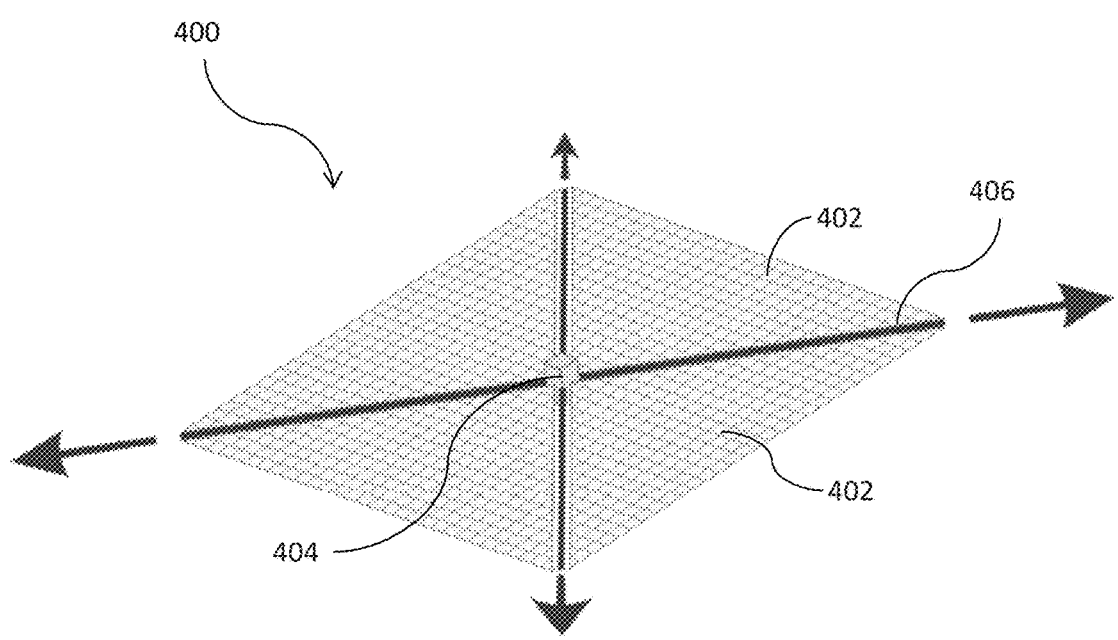
FIG. 15 conceptually illustrates a boom deployment mechanism for a compactable satellite module, according to certain embodiments.

In some embodiments, a mechanically expandable member may be incorporated into the satellite module. An illustration of such a satellite module is provided in FIG. 15 where a satellite module 400 having a plurality of compactible structures 402 are disposed about a central hub 404. The compactible structures 402 are interconnected on at least one edge with a mechanically expandable member 406 such that as the mechanical member is urged outward the compactible structures are also expanded outward from the central hub. The expandable member may be motorized or may use stored energy, such as, compressed or bent expandable members, among others.

Figure 16:
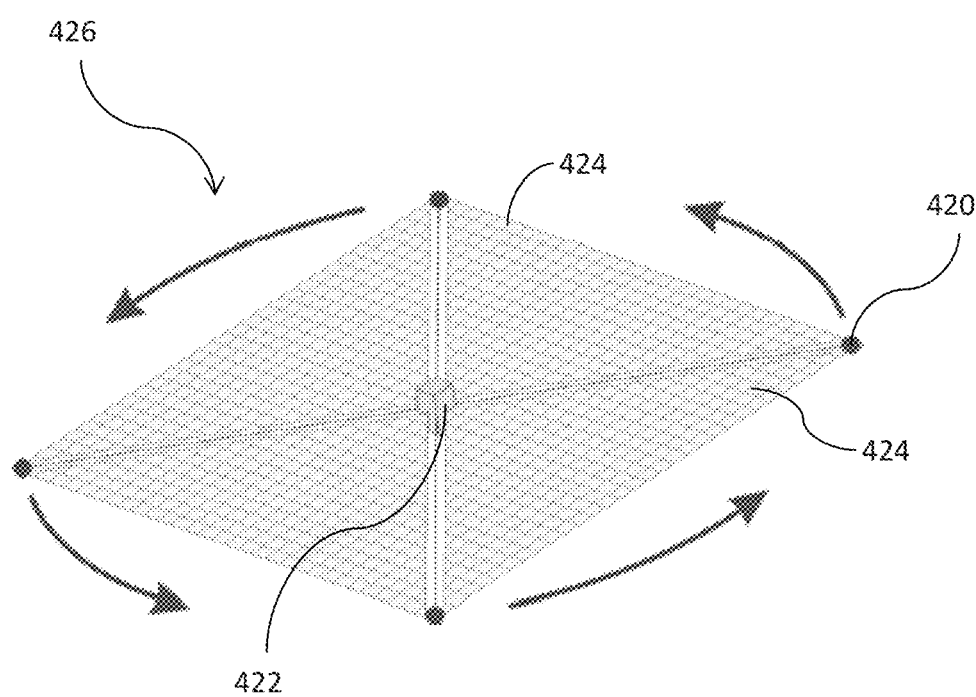
FIG. 16 conceptually illustrates a spin deployment mechanism for a compactable satellite module, according to certain embodiments.

In many embodiments the compactible structures of the satellite module may be configured such that motion of the satellite module provides the expansive deployable force. An illustration of one such embodiment is provided in FIG. 16 where weighted elements 420 are attached between a central hub 422 and at least a portion of each of the compactible structures 424 of the satellite module 426 such that when the central hub of the satellite module is spun the centrifugal force of the spinning hub causes the weighted elements to move outward thereby expanding the compactible structures. In such embodiments, the satellite module may be made to spin continuously to provide a stabilization force to the compactible structures.

Regardless of the mechanism chosen, in many embodiments, the satellite module may be divided into any number and configuration of separate compactible structures with any number of hubs and deployment mechanisms (e.g., expandable members, weighted elements, etc.). In many embodiments, the compactible structures are attached along at least two edges to more than one deployment mechanism such that more even expansion of the compactible structures may be obtained. In many embodiments, for example, multiple weights or expandable members may be attached to each of the compactible structures along multiple points or edges of the compactible structures. Some expandable members or weighted elements may be incorporated into the structure of the compactible structures. Many embodiments of deployment mechanisms may include deployment controls to controllably operate the compactible structures of the satellite modules so that the satellite modules are expanded into a deployed configuration when desired. Some embodiments of such deployment controls may be automated, such that the positioning or motion of the satellite hub automatically engages the deployment mechanism, such as, for example, by spinning the satellite module at a specified rate. Other embodiments may incorporate control circuits such that an external signal or command is required to activate the deployment mechanism. Such deployment controls may operate across an entire satellite module, may be disposed individually in each power generation tile, or a combination thereof.

Efficient Power Generation Tile Configurations

In many embodiments, particularly efficient power generation tiles are implemented. The implementation of such power generation tiles within the described SBSP systems can make them more practicable insofar as they can offer greater power generation per unit mass. As can be appreciated, power generation tiles having a reduced mass can be advantageous for at least two reasons: (1) they can allow for reduced launch costs—i.e. a reduced payload can be cheaper to send into outer space; and (2) they can enable easier maneuverability of corresponding satellite modules. Against this backdrop, in many embodiments, thin film, pliable, photovoltaic materials that create an electrical current from solar radiation are implemented; the thin film photovoltaic materials can be used in conjunction with lightweight substrates for structural support. As can be appreciated, a photovoltaic material can be understood to be a contiguous material having a structure whereby the receipt of incident light (photons) excites electrons to a conduction band to a useful extent, and thereby allows for the creation of a useful electrical current. In a number of embodiments, concentrators are implemented that redirect solar radiation toward an associated photovoltaic material, such that the photovoltaic material can experience greater solar flux relative to the case where no concentrators are used. As can be appreciated, the amount of electrical current that a corresponding PV cell is able to produce is directly related to the incident solar radiation (accounting for its concentration/flux). In this way, for a given target power generation value, the utilization of concentrators can allow the amount of photovoltaic materials used, along with respective attendant radiative shielding (which can be relatively massive), to be reduced. In several embodiments, configurations are implemented that facilitate the radiative cooling of the photovoltaic materials, which can allow them to generate power more efficiently. In some embodiments, structures that are sized approximately on the order of wavelengths of thermally radiated light and are otherwise configured to effectively increase the emissivity of the of power generation tiles, and thereby contribute to the radiative cooling of the photovoltaic materials, are implemented.

Figure 17A:
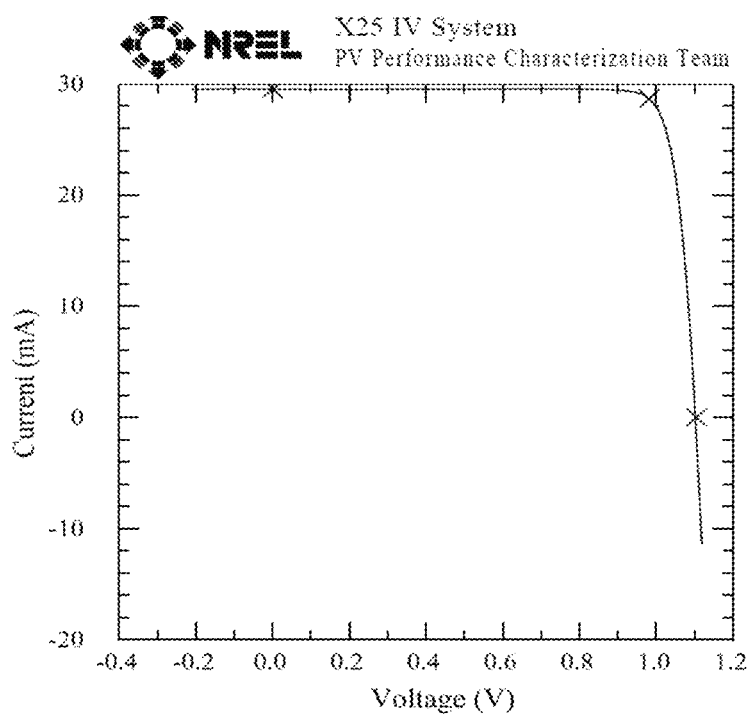
FIGS. 17A-17B illustrate data pertaining to an ALTADEVICES photovoltaic material that can be incorporated in accordance with certain embodiments of the invention.
Figure 17B:
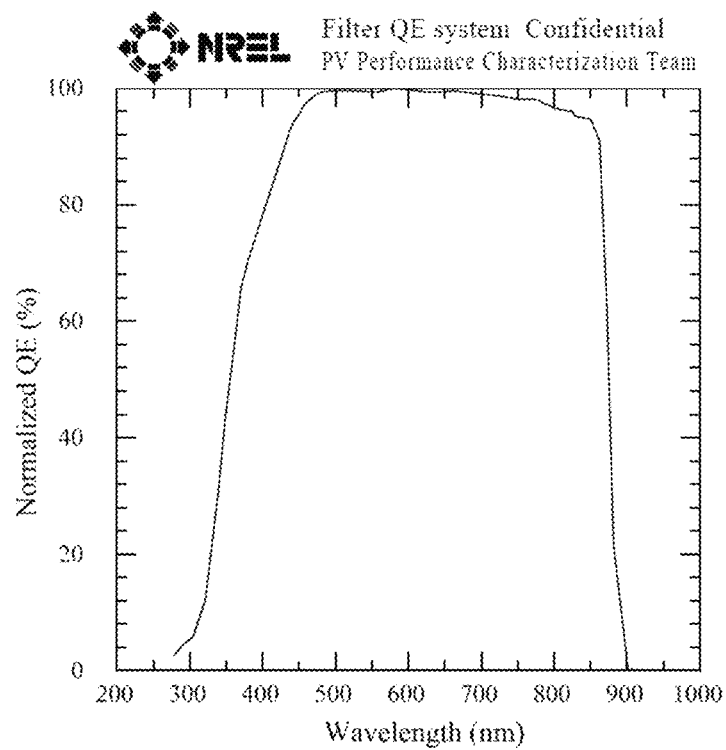

In many embodiments, a thin film photovoltaic material is implemented, such as those used in a typical III-V solar cell, to produce electrical current from incident solar radiation. Thus, for instance, in many embodiments, a Gallium Arsenide thin film photovoltaic material is implemented, such as those developed by ALTADEVICES. FIGS. 17A and 17B illustrate performance data pertaining an ALTADEVICES photovoltaic material that can be incorporated in accordance with certain embodiments of the invention. In particular, FIG. 17A depicts the current vs. voltage characteristics of an X25 IV System, while FIG. 17B depicts a normalized QE performance as a function of electromagnetic wavelength. ALTADEVICES thin film photovoltaic materials have demonstrated efficiencies as high as: 28.8% for a single junction configuration; 31% for a dual junction configuration; and 36% for a triple junction configuration. As can be appreciated, multi-junction PV cells can produce electric current for a broader range of electromagnetic wavelengths, and can thereby demonstrate greater conversion efficiencies. Note that this data was obtained under conditions of 1 Sun and 1.5 atmospheric G. Of course, it should be realized that, while the implementation of ALTADEVICES photovoltaic materials has been discussed, any suitable photovoltaic materials can be incorporated in accordance with embodiments of the invention. In other words, embodiments of the invention are not constrained to the implementation of photovoltaic materials produced by ALTADEVICES. For example, in many embodiments, power generation tiles include photovoltaic materials fabricated by SPECTROLABS. In a number of embodiments, power generation tiles include photovoltaic materials fabricated by SOLAERO TECHNOLOGIES. Any thin film photovoltaic materials that are characterized by desirable pliability and durability can be implemented in accordance with many embodiments of the invention.

Figure 18:
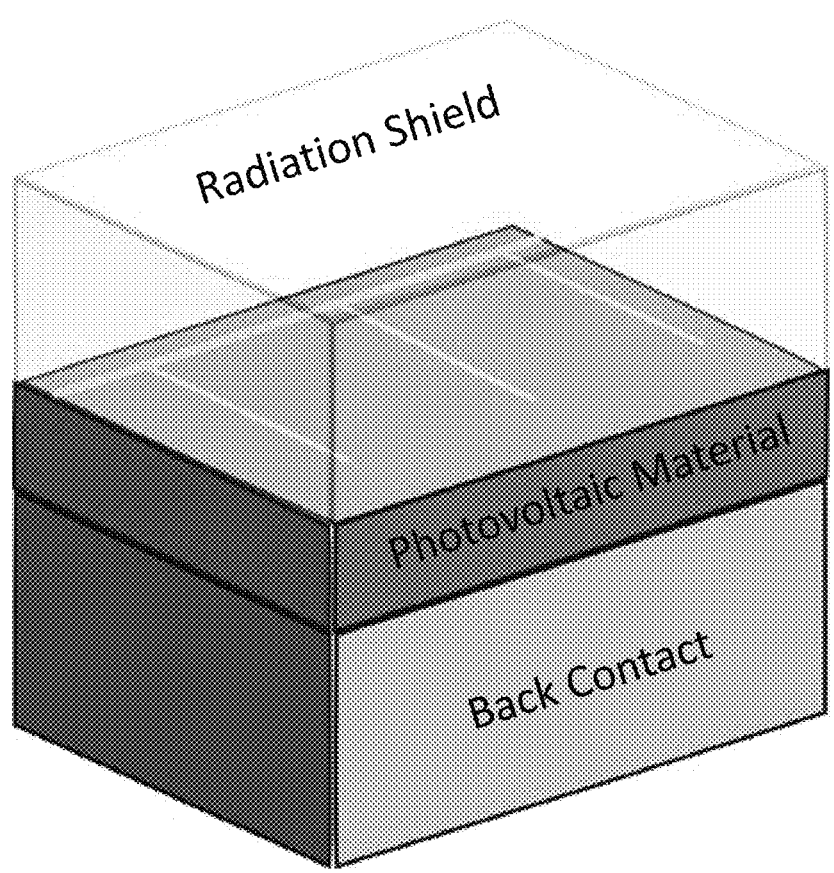
FIG. 18 illustrates a cross section of a portion of a PV cell in accordance with certain embodiments of the invention.

Notably, in many instances when photovoltaic materials are implemented in outer space, they are typically accompanied by radiation shields that protect them from deleterious radiation. The radiation shields are typically in the form of cover glass, which can be relatively massive. To provide context, FIG. 18 illustrates a typical configuration for a PV Cell that is to be implemented in outer space. In particular, FIG. 18 depicts that a typical configuration for a PV cell includes a photovoltaic material disposed on a back contact and covered by a radiation shield. Note that it is typical for the entire surface area of a photovoltaic material to be protected by radiation shielding. Thus, implementing photovoltaic materials having relatively more surface area generally involves implementing correspondingly more radiation shielding. As radiation shielding (commonly in the form of cover glass) can be relatively massive, including more radiation shielding can non-negligibly increase the mass of the power generation tile, which can be undesirable. Accordingly, many embodiments implement configurations that reduce the amount of radiation shielding, while preserving power generation efficiency. For example, in many embodiments, concentrators are incorporated that can reduce the amount of photovoltaic material required for a target power generation value. In effect, the amount of photovoltaic cell surface area is reduced by relatively less massive concentrators.

Figure 19:
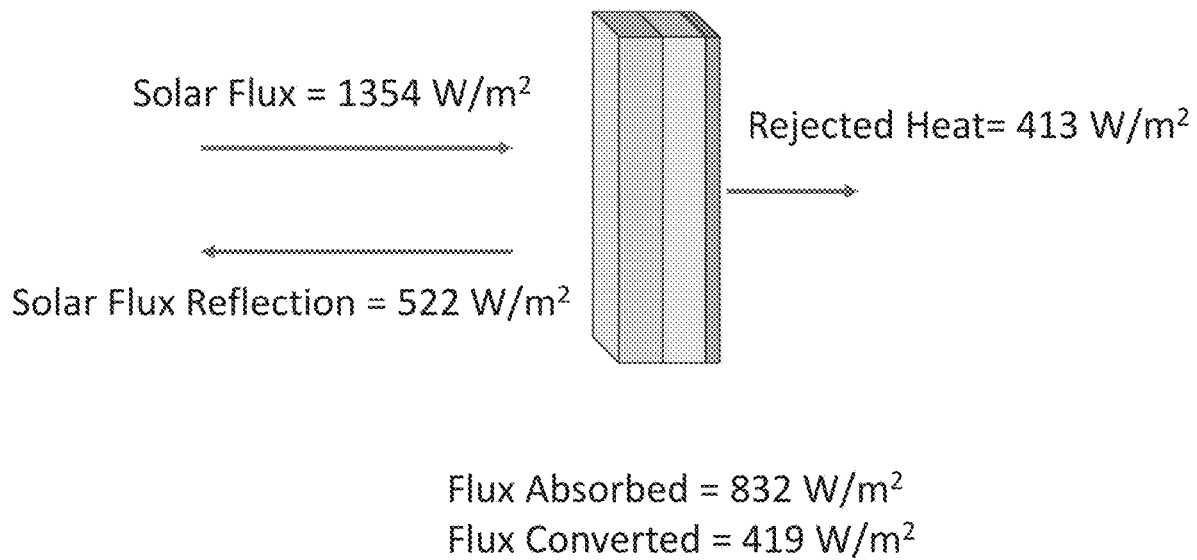
FIG. 19 depicts an illustrative energy balance for an ALTADEVICES DUAL Junction Cell that can be incorporated in accordance with certain embodiments of the invention.

Moreover, in many embodiments power generation tile configurations are implemented that facilitate the cooling of the photovoltaic materials. As can be appreciated, photovoltaic materials can heat up extensively during operation, and heat can adversely impact a photovoltaic material's ability to produce electrical current. To provide context, an energy balance for a sample solar cell in operation is depicted in FIG. 19. In particular, an ALTADEVICES Dual Junction Cell having a conversion efficiency of 31% is illustrated. The Dual Junction Cell experiences a solar flux of 1354 W/m$^2$, of which 522 W/m$^2$ is reflected. Correspondingly, 832 W/m$^2$ is absorbed by the Dual Junction Cell, of which 419 W/m$^2$ is converted into electrical energy, and 413 W/m$^2$ of which is rejected as heat. In general, the rejection of heat reduces the operating temperature of the photovoltaic material so as to benefit its power generation efficiency.

Against this backdrop, in many embodiments, configurations are implemented that provide improved power generation per unit mass. For instance, in many embodiments concentrators are implemented that concentrate solar radiation onto a corresponding photovoltaic material such that the photovoltaic material experiences greater solar flux relative to if the photovoltaic material were subjected to unaltered solar radiation. As can be appreciated a photovoltaic material's ability to generate electrical current is related to the amount of incident solar radiation/flux. Note that concentrators can be made to be less massive than the combined mass of conventional PV Cells including radiation shielding. Accordingly, the incorporation of concentrators can reduce the amount of photovoltaic material for a given desired power generation value, and can correspondingly reduce the amount of radiation shielding implemented.

The concentrators can take any suitable form in accordance with many embodiments of the invention. For example, in many embodiments, concentrators are implemented in the form of an aluminum film disposed on a KAPTON Polyimide film produced by DUPONT. In several embodiments, the aluminum has a thickness of between approximately 2 µm and approximately 10 µm. In many embodiments, the KAPTON Polyimide film has a thickness of approximately 10 µm. In effect, the aluminum acts as the reflective surface (i.e. a 'reflector'), while the KAPTON polyimide film acts as a supportive substrate. Note that while several illustrative dimensions are referenced, it should be clear that the structures can adopt any suitable dimension in accordance with embodiments of the invention. It should also be clear that concentrators can be implemented using any of a variety of materials, not just those recited above—e.g. reflectors and substrates can comprise any suitable material in accordance with embodiments of the invention. For example, in many embodiments, a silver reflective surface is incorporated. The incorporation of silver can be advantageous insofar as silver has a relatively lower optical loss over that portion of the electromagnetic spectrum characterized by wavelengths of approximately 300 nm to approximately 900 nm relative to aluminum. In a number of embodiments, a dielectric reflector is implemented within a concentrator. The utilization of a dielectric reflector can be advantageous insofar as it can be made to not overly interfere with any desired electromagnetic transmissions (or any other transmission). For example, where the corresponding SBSP station is transmitting generated power via microwaves, dielectric reflective surfaces can be implemented that do not overly interfere (if at all) with the transmission. In any case, while several materials have been mentioned for the construction of concentrators, it should be clear that the concentrators can be implemented using any of a variety of suitable materials in accordance with many embodiments of the invention, and are not restricted to construction from the above-recited materials.

Figure 20A:
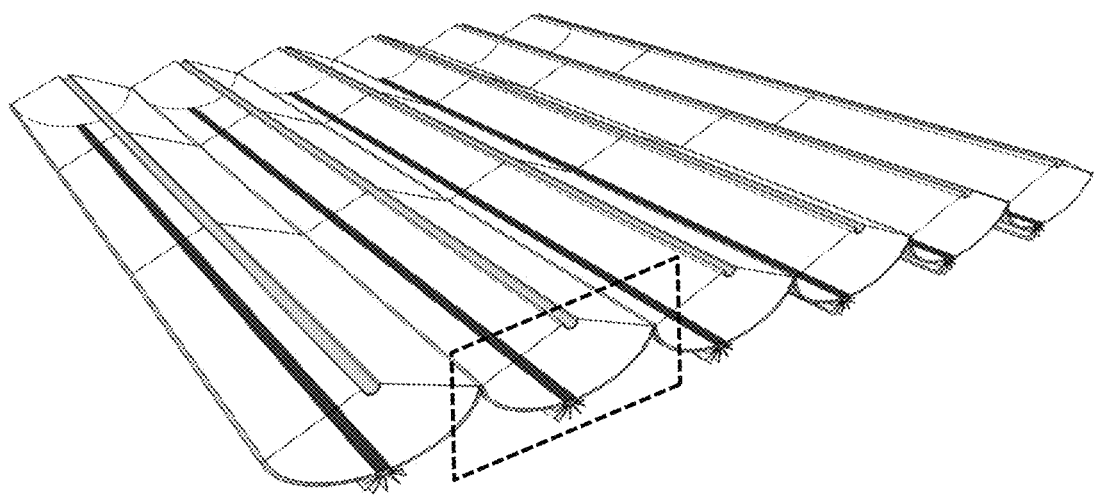
FIGS. 20A-20C illustrate a Cassegrain configuration that can be implemented in accordance with certain embodiments of the invention.
Figure 20B:
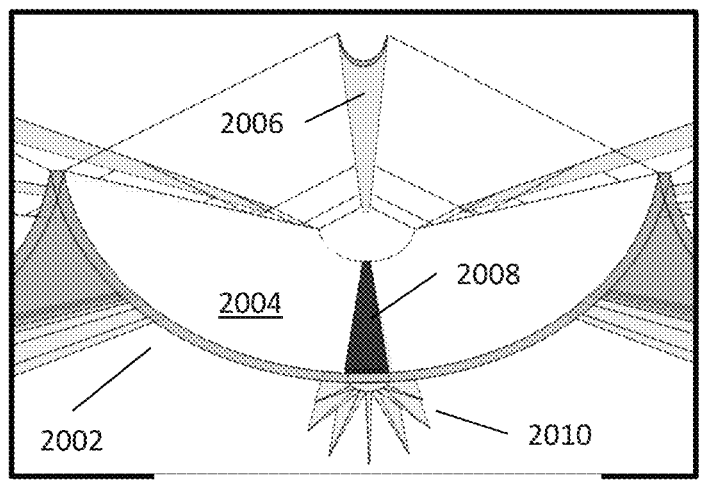
Figure 20C:
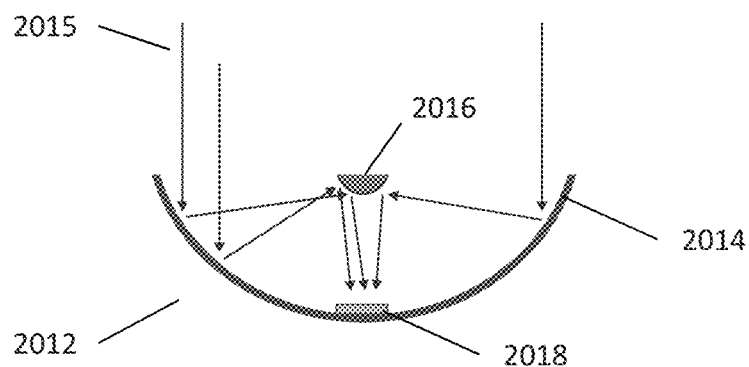

Importantly, concentrators can be implemented in any of a variety of geometric configurations. For example, in many embodiments, Cassegrain configurations are implemented; Cassegrain configurations are typically characterized by primary and secondary reflectors that redirect solar radiation onto a photovoltaic material (typically disposed on the primary reflector). Typically, a primary reflector redirects incident solar radiation onto a secondary reflector, which subsequently redirects incident solar radiation onto a photovoltaic material. Note that a reflector can be understood to be that portion of a concentrator which directly reflects incident solar radiation. For example, FIGS. 20A-20C illustrate a Cassegrain configuration that can be implemented in accordance with embodiments of the invention. In particular, FIG. 20A depicts an isometric view of the iterative Cassegrain configuration. FIG. 20B illustrates a cross-sectional view of a single Cassegrain cell within a Cassegrain configuration. In particular, it is illustrated that the Cassegrain cell 2002 includes a primary reflector 2004, a complementary secondary reflector 2006, a photovoltaic material 2008, and a radiative heat sink 2010 that can facilitate the rejection of thermal energy by the photovoltaic material 2008. As can be appreciated from the above discussion, the reflectors can be implemented using any suitable material in accordance with embodiments of the invention, including but not limited to aluminum, silver, and/or dielectrics. Similarly, they can be disposed on any suitable substrate, including but not limited to a KAPTON polyimide film.

FIG. 20C illustrates the generalized understanding of the operating principles of Cassegrain configurations. In particular, it is illustrated that for a Cassegrain structure 2012, it is generally understood that light rays 2015 are redirected by a primary reflector 2014 onto a secondary reflector 2016, and subsequently onto a photovoltaic material 2018. It should be clear that embodiments of the invention are not constrained to the precise manifestation of these operating principles. Rather, the understood generalized operating principles are discussed here to facilitate the understanding of the structure.

Note that the reflectors implemented in Cassegrain structures can incorporate any of a variety of complementary shapes to redirect—and focus—solar radiation onto a photovoltaic material. For example, in many embodiments, a primary reflector conforming to a parabolic shape is implemented, while a corresponding secondary reflector that conforms to a hyperbolic shape is implemented. Moreover, the particular characteristics of the parabolic and hyperbolic shapes can be adjusted based on the requirements of a particular application. For instance, the parabolic and hyperbolic shapes can be made to be wider or narrower based on desired design criteria. To be clear though, any suitable pairing of reflector shapes that redirect solar radiation onto a photovoltaic material can be implemented in accordance with embodiments of the invention, and not just those conforming to parabolic/hyperbolic shapes.

Cassegrain structures, such as those illustrated in FIGS. 20A-20C, can be advantageous insofar as they can demonstrate good thermal properties. For example, as the photovoltaic materials are typically in direct contact with the primary reflector, the primary reflector can function has a heat sink for the photovoltaic material, and thereby facilitate radiative cooling. As the primary reflector can facilitate conductive cooling, it can be said to be in thermal communication with the photovoltaic material. Additionally, dedicated heat sinks can also be coupled to the photovoltaic material, as illustrated in FIG. 20B. As can be appreciated, coupled heat sink structures can further assist the photovoltaic material in tending towards cooler, more preferable (e.g. efficient), operating temperatures.

While Cassegrain structures can exhibit advantageous thermal properties, they can be sensitive to solar radiation angle of incidence. For example, the secondary reflector can cast a shadow and thereby hinder solar flux received by the primary reflector, and eventually the photovoltaic material. Additionally, because of the somewhat sophisticated geometry, some angles at which solar radiation reaches the corresponding power generation tile may not be received. Moreover, because Cassegrain structures employ two reflectors, they are subject to more reflection loss relative to configurations that employ only a single reflector.

Figure 21:
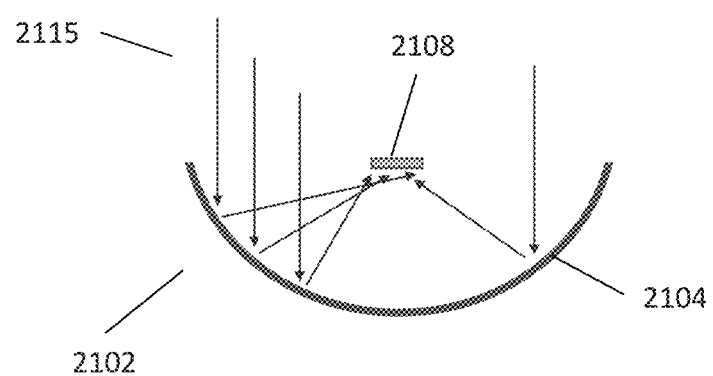
FIG. 21 illustrates the operation of a Parabolic Trough configuration that can be implemented in accordance with certain embodiments of the invention.

While Cassegrain structures have been discussed, it should be clear that any of a variety of concentrator configurations can be implemented in accordance with certain embodiments of the invention. For example, in many embodiments, 'Parabolic Trough' configurations are implemented. Parabolic Trough configurations are similar to the Cassegrain structures discussed above, except that they do not include a secondary reflector; rather the primary reflector is used to redirect solar radiation onto an opposingly disposed photovoltaic material. For example, FIG. 21 illustrates the generalized understanding of the operation of a Parabolic Trough configuration that can be implemented in accordance with certain embodiments of the invention. In particular, it is illustrated that the Parabolic Trough configuration 2102 includes a parabolic reflector 2104, and an opposingly disposed photovoltaic material 2108. Light rays 2115 are depicted that are redirected by the parabolic reflector 2104 onto the photovoltaic material 2108. Again, it should be clear that embodiments of the invention are not constrained to the precise manifestation of these operating principles. Rather, the understood generalized operating principles are discussed here to facilitate the understanding of the discussed structure. Additionally, it should be noted that while FIG. 21 depicts the operation of a single Parabolic Trough unit, a power generation tile can of course includes a plurality of such Parabolic Trough units in accordance with certain embodiments of the invention.

While the reflector can conform to any shape that redirects solar radiation to a photovoltaic material in accordance with certain embodiments of the invention, it can be advantageous if it conforms to a parabolic shape so as to efficiently focus solar radiation onto the opposingly disposed photovoltaic material. Additionally, as can be appreciated from the discussion above, the configurations can be implemented using any of a variety of materials. For example, in many embodiments, the concentrator is implemented using a reflective surface, such as aluminum, silver, and/or a dielectric material, in conjunction with a lightweight substrate. Additionally, the photovoltaic material can be any suitable material, such as—but not limited to—thin film photovoltaics produced by ALTADEVICES.

Parabolic Trough configurations can be advantageous relative to Cassegrain structures in that, since they only employ a single reflector (as opposed to two reflectors), they are subject to less reflective loss relative to Cassegrain structures that implement two reflectors. However, as the photovoltaic material is not typically directly coupled to a large surface area such as the primary reflector (as in the case of a Cassegrain structure), Parabolic Trough configurations may not be as efficient at radiative heat transfer.

Figure 22A:
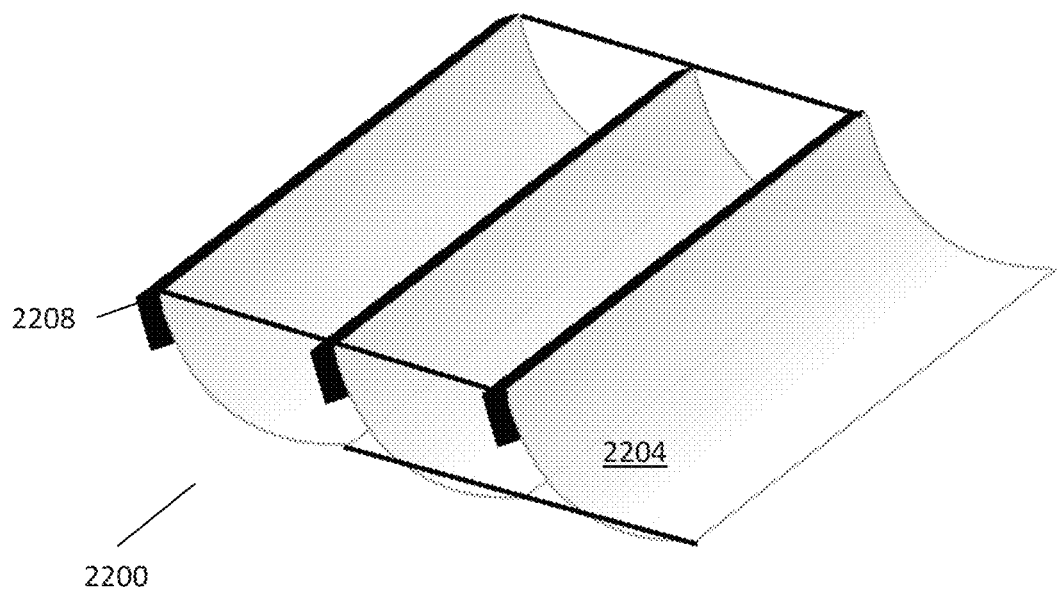
FIGS. 22A-22B illustrate a Venetian Blinds configuration that can be incorporated in accordance with certain embodiments of the invention.
Figure 22B:
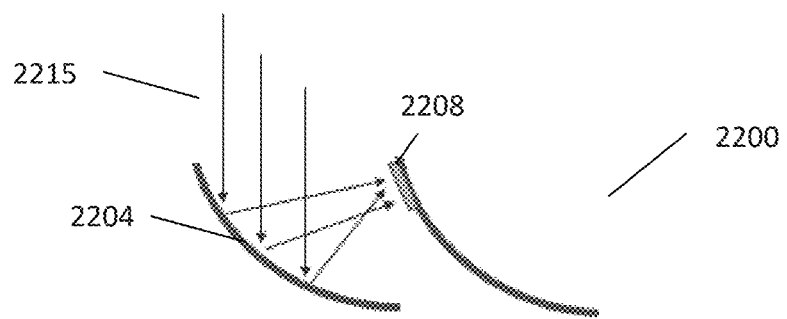

In many embodiments, a 'Venetian Blinds' configuration is implemented, whereby concentrators redirect solar radiation towards photovoltaic materials that are disposed on the backside of adjacently disposed concentrators. FIGS. 22A-22B illustrate a Venetian Blinds configuration that can be implemented in accordance with certain embodiments of the invention. More specifically, FIG. 22A illustrates an isometric view of a Venetian Blinds configuration. In particular, it is depicted that the configuration 2200 includes a plurality of concentrators 2204, each having a photovoltaic material 2208 disposed on its backside. The photovoltaic materials are disposed such that the concentrators 2204 redirect solar radiation onto a photovoltaic material that is disposed the on backside of an adjacent concentrator. FIG. 22B illustrates a generalized understanding of the operation of the Venetian Blinds configuration. In particular, it is illustrated that light rays 2215 are redirected by a respective reflector 2204 onto a photovoltaic material 2208 that is disposed on the backside of an adjacent reflector. As can be gathered from the above discussion, the reflectors 2104 can be curved so as to focus the solar radiation on to the targeted photovoltaic material 2208. It should be clear that embodiments of the invention are not constrained to the precise manifestation of these operating principles. Rather, the understood generalized operating principles are discussed here to facilitate the understanding of the discussed structure.

Figure 23A:
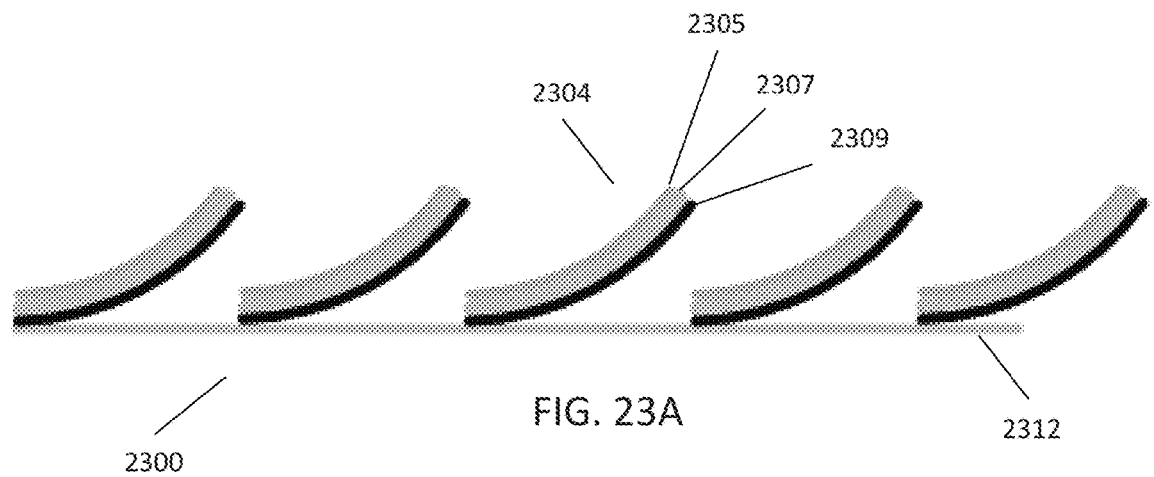
FIG. 23A illustrates the constitution of a Venetian Blinds configuration in accordance with an embodiment of the invention.

Venetian Blinds configurations can be constructed using any of a variety of materials and techniques in accordance with many embodiments of the invention. For example, in several embodiments, Venetian Blinds configurations are implemented using polyimide films in conjunction with carbon springs, and reflectors. FIG. 23A illustrates a cross section of a Venetian Blinds configuration that depicts materials that can be used in its construction. In particular, it is illustrated that the Venetian Blinds configuration 2300 includes reflectors 2304 that are characterized by a reflective surface 2305 disposed on a KAPTON polyimide layer 2307, that is itself utilized in conjunction with a carbon springs 2309. As can be appreciated, the springs can help the power generation tile deploy, and also aid in structural integrity. The plurality of reflectors 2304 can be disposed on a KAPTON Polyimide substrate 2312. This recited combination of materials has been shown to be particularly effective for the intended operation, as the carbon springs and polyimide films have demonstrated sufficient pliability and durability for operation in space. Although, it should again be clear that while certain materials are referenced, any suitable materials can be incorporated in accordance with certain embodiments of the invention. For instance, any of a variety of spring materials can be incorporated, including any of a variety of conductive spring materials, and non-conductive spring materials.

Figure 23B:
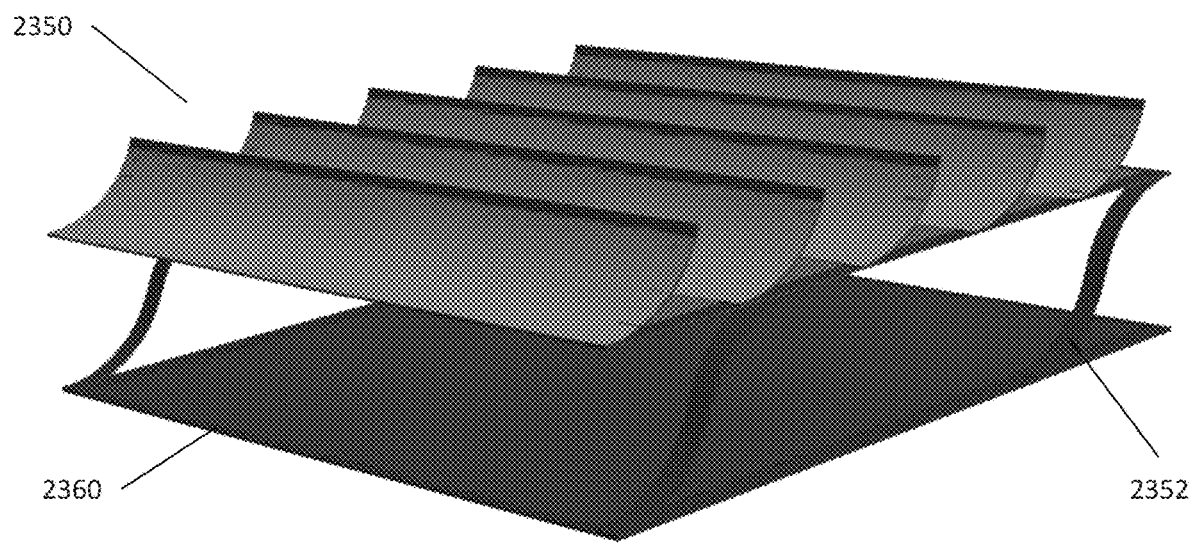
FIG. 23B illustrates a Venetian Blinds configuration coupled with a power transmitter in accordance with an embodiment of the invention.

To provide context, FIG. 23B illustrates a Venetian Blinds configuration in conjunction with a power transmitter. In particular, it is depicted that a Venetian Blinds configuration 2350 is disposed above a power transmitter 2360, and adjoined to the power transmitter via four "s-shaped" struts 2352. Of course it should be clear that the power transmitter and struts can be implemented in any of a variety of ways and can conform to any of a variety of suitable shapes in accordance with many embodiments of the invention. The depiction is meant to be illustrative and not exhaustive of configurations that can be implemented.

Figure 24:
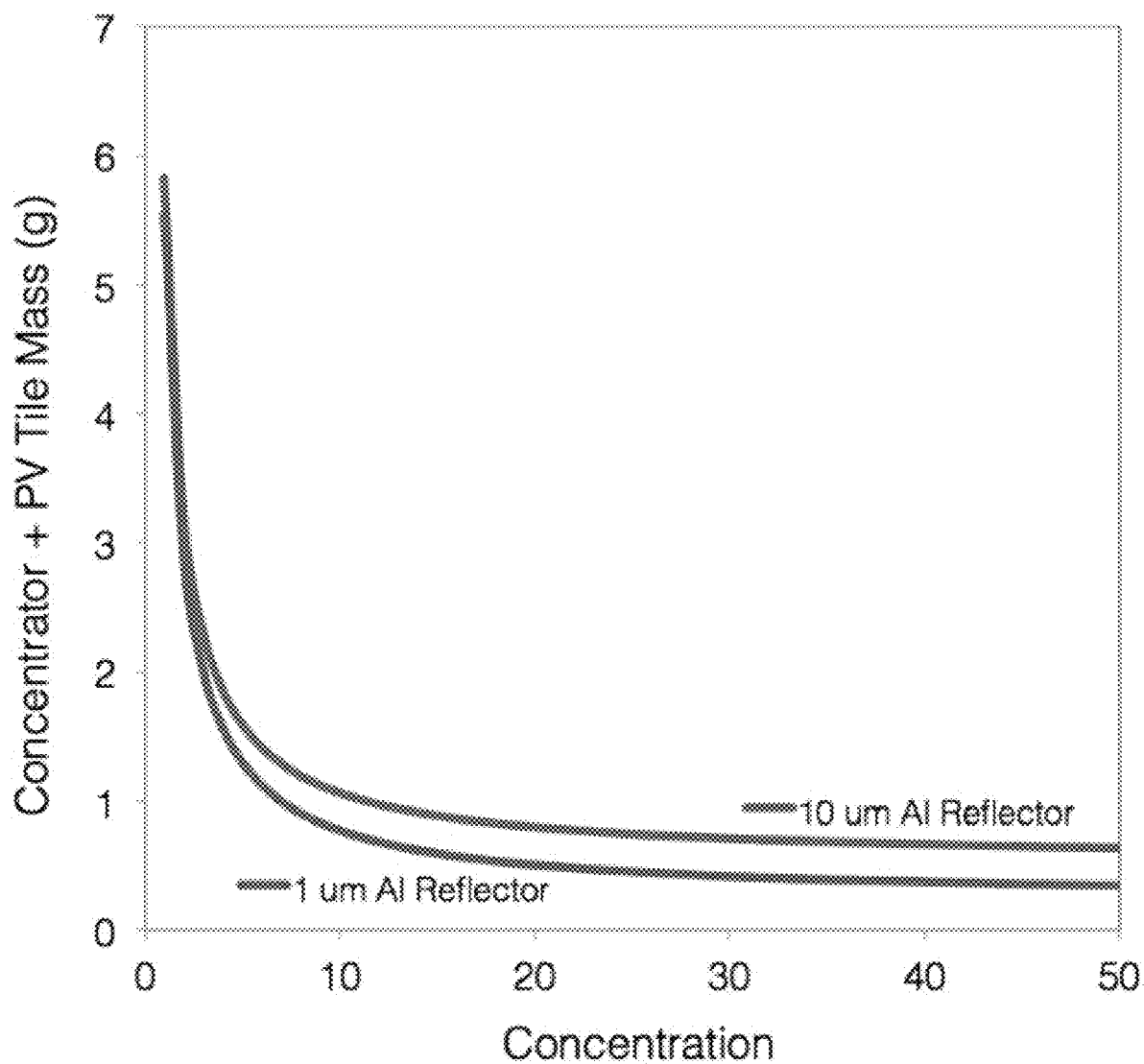
FIG. 24 illustrates how the mass of a power generation tile can be significantly reduced by implementing concentrators in accordance with certain embodiments of the invention.

Venetian Blinds configurations can be advantageous insofar as each of the concentrators can act as a heat sink for a coupled photovoltaic material, thereby facilitating conductive and radiative cooling, and consequently a more efficient operation. Additionally, in contrast to the Cassegrain configuration, only a single reflector is used in redirecting solar radiation onto a photovoltaic material. As alluded to above, using a single reflector can reduce the potential energy loss relative to configurations that incorporate a plurality of reflectors. In many instances, optical efficiencies of greater than 90% can be realized using Venetian Blind configurations. Moreover, such configurations can result in concentrations of between approximately 10× to approximately 40× or more. FIG. 24 illustrates a chart demonstrating how the combined mass of a concentrator and a PV tile diminishes as a function of concentration. In particular, the data in the graph is for a 10 cm by 10 cm power generation tile, with five 1-dimensional Venetian Blinds, a 100 µm cover glass, with 30 um copper back contact/structural support, a 1 µm GaAs photovoltaic film, supported by a 12.5 µm KAPTON polyimide substrate. Thus, it is illustrated how the mass of a corresponding power generation tile can be substantially reduced using concentrators.

Figure 25:
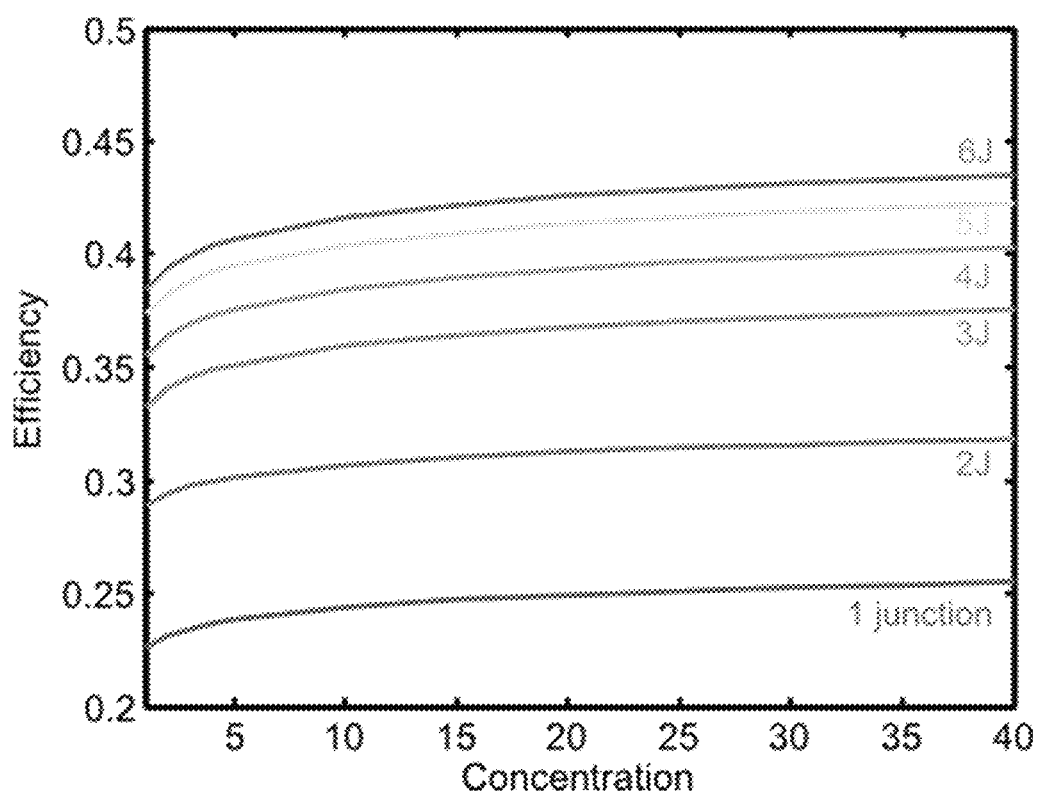
FIG. 25 illustrates how the efficiency of a power generation tile can be a stronger function of the number of junctions implemented relative to the concentration implemented.

As noted above, the number of junctions within a photovoltaic material also influences the power generation efficiency. Interestingly, FIG. 25 depicts that the efficiency of a photovoltaic cell is a stronger function of the number of junctions incorporated than it is of solar radiation concentration. Accordingly, in many embodiments, photovoltaic materials are implemented that are characterized by multiple junctions are incorporated within a power generation tile.

While fins can be used to facilitate thermal radiation, and consequently result in the cooling of the photovoltaic cell allowing it to operate more efficiently, in many embodiments, microscale structures are further incorporated to facilitate thermal radiation. For instance, in several embodiments, structures that have dimensions approximately on the order of wavelengths of thermally radiated light are incorporated onto a surface that is interconnected with (or otherwise in thermal communication with) a photovoltaic material or a concentrator surface; in particular, the structures can cause thermally generated infrared photons to interact with the material to a greater extent, and can thereby allow for greater overall thermal radiation, which in turn causes higher cooling rates. This can be understood as the inverse process of increasing absorption of incident photons by surface texturing, as described by Kirchoff's law of thermal radiation, which states that the emissivity of an arbitrary body is equal to its absorptivity. In general, structures with characteristic dimensions approximately on the order of wavelengths of thermally radiated light (inclusive of dimensions between approximately 1 µm and approximately 100 µm or more) can modify the absorptivity/emissivity of a material by causing optical resonances. A plurality of these structures can be implemented so as to create a 'textured' surface. In general, when such surfaces are interconnected with (e.g. in thermal communication with) the photovoltaic material or else a concentrator surface, they can facilitate its cooling via conduction and radiation. For example, in many embodiments, implemented microstructures have characteristic dimensions of between approximately 1 µm and approximately 100 µm. In several embodiments, implemented microstructures have characteristic dimensions between approximately 5 µm and approximately 50 µm. While certain dimensions are referenced, it should be clear that features of any suitable dimension that can texture a surface so as to increase its emissivity can be incorporated in accordance with embodiments of the invention.

Figure 26A:
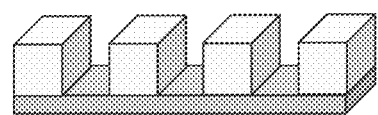
FIGS. 26A and 26B illustrate microscale structures that can be incorporated to improve emissivity in accordance with certain embodiments of the invention.
Figure 26B:
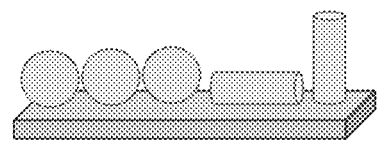

FIGS. 26A and 26B illustrate examples of structures having dimensions on the order of wavelengths of thermally radiated light that can be incorporated onto the solar concentrators. In particular, FIG. 26A illustrates a series of prisms that can be incorporated, while FIG. 26B illustrates a series of spheres and prisms. But of course, it should be clear that features having any of a variety of shapes can be implemented in accordance with embodiments of the invention. The structures can be scaled so as to result in the desired optical resonances.

Figure 27A:
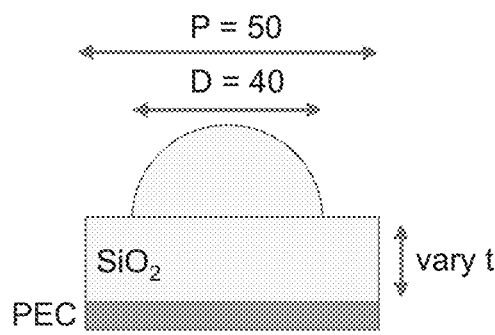
FIGS. 27A and 27B illustrate the effect of the incorporation of microscale structures on the emissivity of a surface in accordance with certain embodiments of the invention.
Figure 27B:
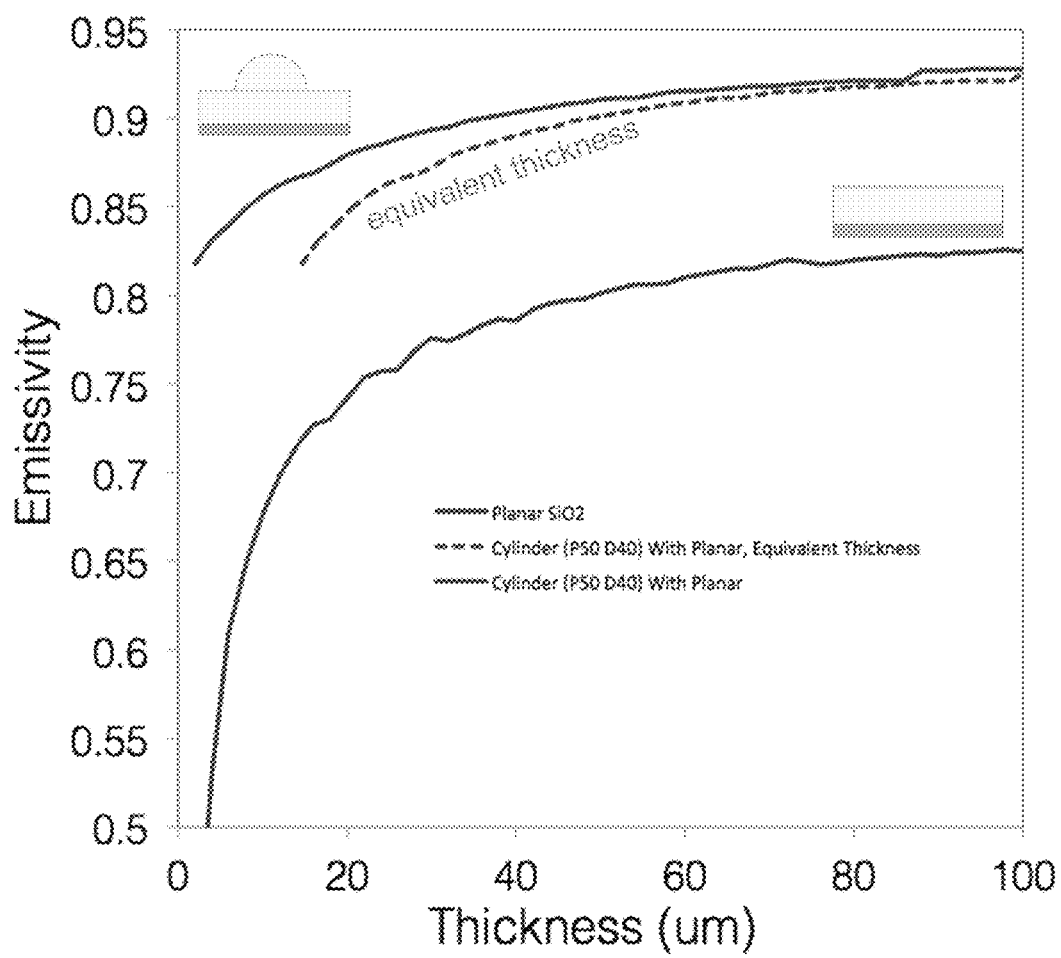

FIGS. 27A and 27B illustrate a structure characterized by having a dimension on the microscale, and how the incorporation of a texture including such structures onto a surface that is interconnected with a photovoltaic material can elevate emissivities relative to when no such texture is incorporated. In particular, FIG. 27A depicts the geometry of the structure that is iteratively incorporated onto the surface. More specifically, the diameter is approximately 40 µm, and the pitch is approximately 50 µm. FIG. 27B illustrates the emissivity of the surface (as a function of surface thickness) relative to if no such texture is included. Note that the graph indicates that, for any given surface thickness, the emissivity of the surface having the texture including the illustrated structure is greater.

In many embodiments, the contacts used by PV Cells are integrated so as to facilitate the efficiency of the power generation tile. For instance, in many embodiments, conductive structures that already exist within a power generation tile are used as the conductive contacts of constituent PV Cells. In this way, the conductive structures are made to be dual purpose. For example, in many embodiments, a Venetian Blinds configuration is implemented that includes a conductive reflector as well as carbon springs for structural support, and the conductive reflector and/or the carbon springs are used as the electrical contacts for the PV Cell. This can be achieved in any of a variety of ways.

Figure 28A:
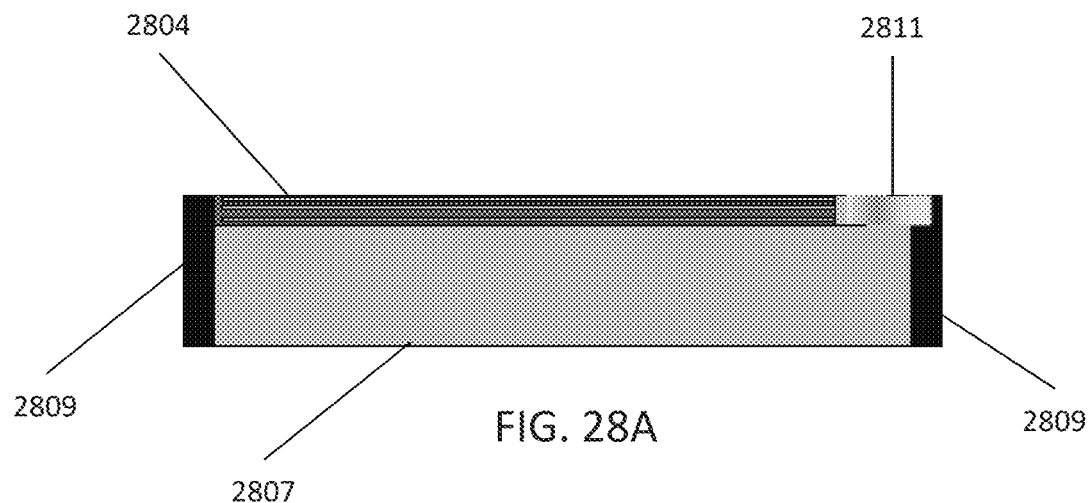
FIGS. 28A-28B illustrate using a conductive carbon spring and a conductive reflector as the metallic contacts for a photovoltaic material in accordance with certain embodiments of the invention.
Figure 28B:
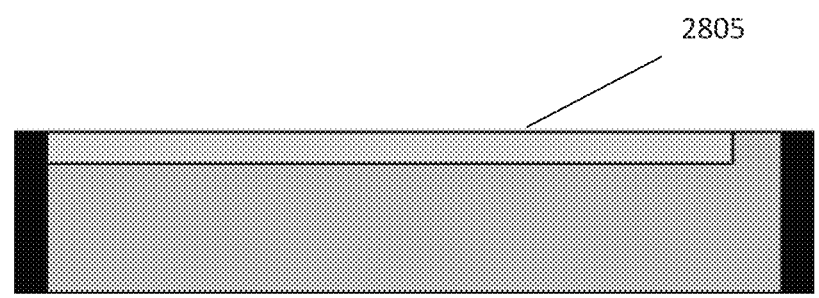

For instance, FIGS. 28A-28B depict the utilization of a carbon spring and a reflector as the contacts for a corresponding PV Cell in accordance with an embodiment of the invention. In particular, FIG. 28A depicts a photovoltaic material 2804 within a Venetian Blind structure that includes carbon springs 2809, a KAPTON polyimide substrate 2807, and a conductive tape bond 2811. FIG. 28B illustrates the same structure without the photovoltaic material to indicate that the conductive reflective surface 2805 is exposed and can make direct contact with the utilized photovoltaic material 2804. This geometry can be achieved in any of a variety of ways. For example, that portion of the KAPTON polyimide surface can be excised so that the photovoltaic material can directly contact the conductive reflective surface. Similarly, a conductive tape bond 2811 is used to couple the opposing side of the photovoltaic material 2804 to a carbon spring. As can be appreciated, the carbon spring 2809 and the reflective surface 2805 can be electrically isolated. Thus, the conductive reflective surface 2805 and the carbon spring 2809 can serve as opposing contacts for the photovoltaic material. In this way, as can be appreciated, each of the reflector 2805 and the carbon spring 2809 can provide multiple functions: (1) the reflector can redirect incident solar radiation onto a photovoltaic material and also serve as a contact for a photovoltaic material; and (2) the carbon spring can allow the Venetian Blind to deploy, provide structural support, and serve as a contact for a photovoltaic material.

Figure 29A:
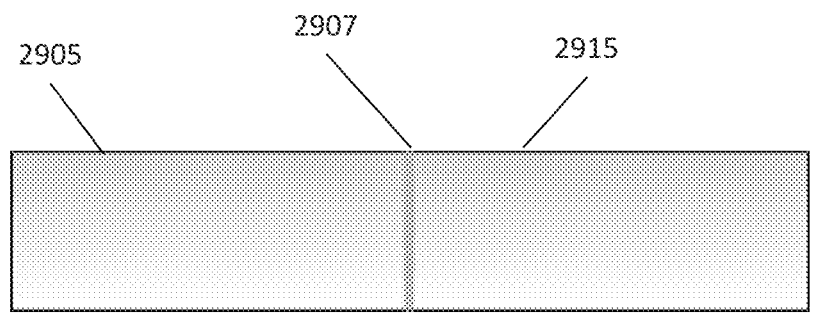
FIGS. 29A-29C illustrate using a reflector as the contacts for a photovoltaic material in accordance with certain embodiments of the invention.
Figure 29B:
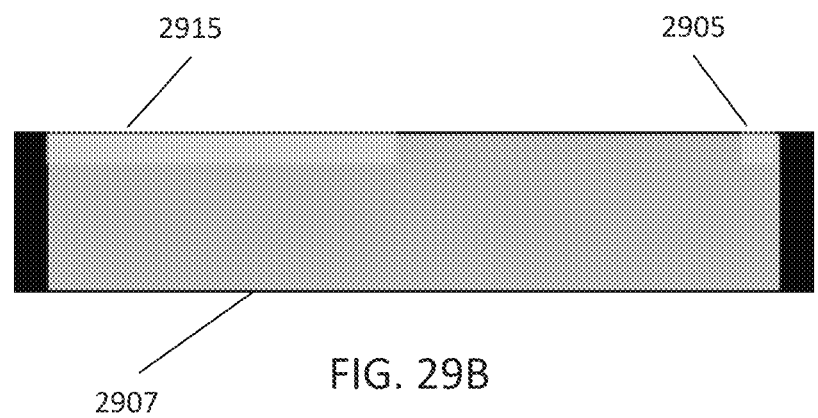
Figure 29C:
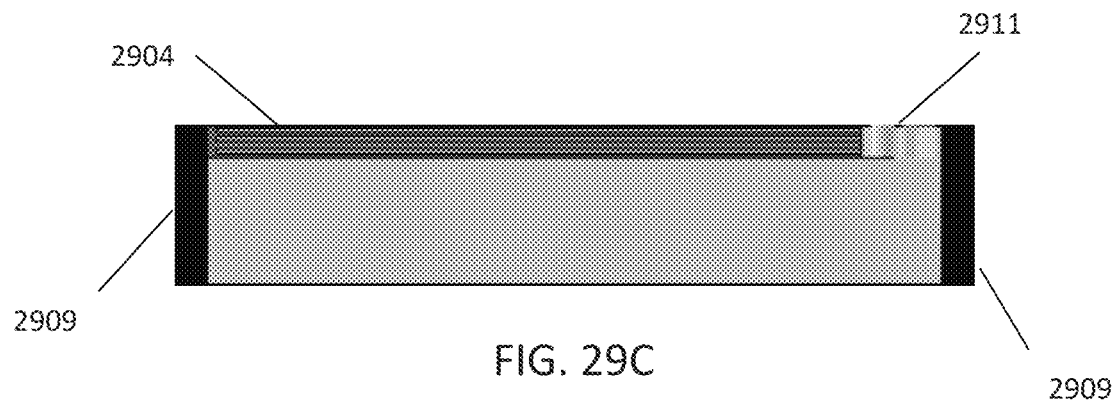

In many embodiments, a reflector is used to implement the contacts for a PV cell. For example, FIGS. 29A-29C depict utilizing a reflector to implement the contacts for a photovoltaic material in accordance with an embodiment of the invention. In particular, FIG. 29A illustrates the reflector side of a Venetian Blind structure. More specifically, it is illustrated that the reflector has been bifurcated into two electrically isolated sides, 2905 and 2915. In particular, the underlying KAPTON Polyimide structure 2907 serves to electrically isolate the two sides 2905 and 2915. FIG. 29B illustrates the opposing side of the Venetian Blind structure without the photovoltaic material 2904 and the tape bond 2911 to make clear that the photovoltaic material can be electrically connected with each of the two reflective sides 2905 and 2915. FIG. 29C illustrates the structure of FIG. 29B, except that it further includes the photovoltaic material 2904 and the tape bond 2911. More specifically, the underside of the photovoltaic material 2904 is directly connected to a first side 2915, while the opposing side of the photovoltaic material 2904 is tape bonded to the second side 2905 of the reflective surface. Thus, it is illustrated that a reflective surface can serve a secondary purpose by functioning as the contacts for a PV cell.

Figure 30:
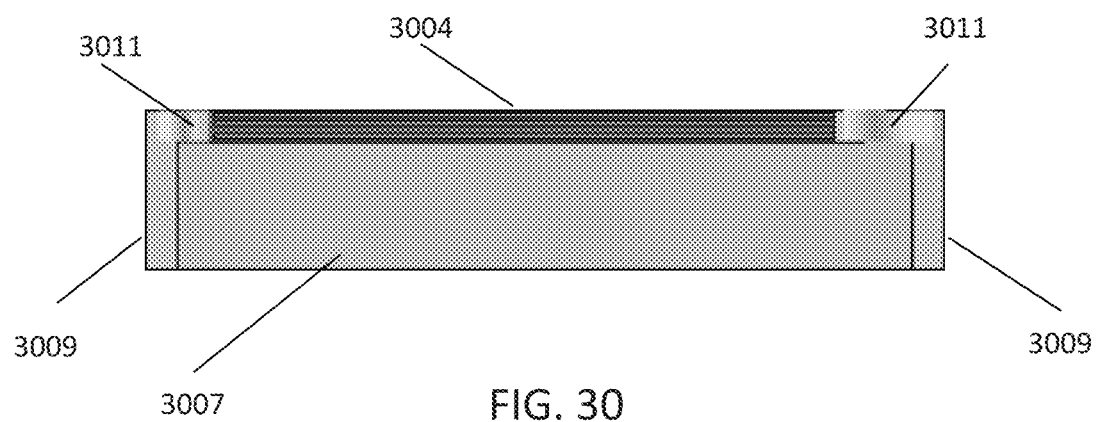
FIG. 30 illustrates using carbon springs as the contacts for a photovoltaic material in accordance with certain embodiments of the invention.

In numerous embodiments, carbon springs within a power generation tile act as the contacts for a PV cell. For example, FIG. 30 illustrates how the carbon springs within a Venetian Blind structure can act as the contacts for a corresponding photovoltaic material. In particular, FIG. 30 illustrates a Venetian Blind structure including a photovoltaic material 3004, a KAPTON polyimide substrate 3007, carbon springs 3009, and tape bonding 3011 (the opposing reflective surface is not depicted). In particular opposing surfaces are of the photovoltaic material 3004 are electrically connected to respective carbon springs 3009 using respective tape bonds 3011, which can thereby function as electrical contacts for the associated photovoltaic material. While several examples of utilizing already existing hardware as electrical contacts for PV cells, it should be clear that the discussed examples are illustrative and are not meant to be comprehensive. For example, while the discussed examples have regarded Venetian Blind configurations, in many embodiments, Cassegrain configurations and/or Parabolic Trough configurations utilize existing conductive structures to act as electrical contacts. Already existing conductive structures can function as PV cell contacts in any of a variety of ways in accordance with embodiments of the invention. Moreover, as can be appreciated, while the implementation of several materials has been discussed, it should be clear that any of a variety of suitable materials can be implemented to construct the described structures. Embodiments of the invention are not limited to the implementations described above.

Figure 31:
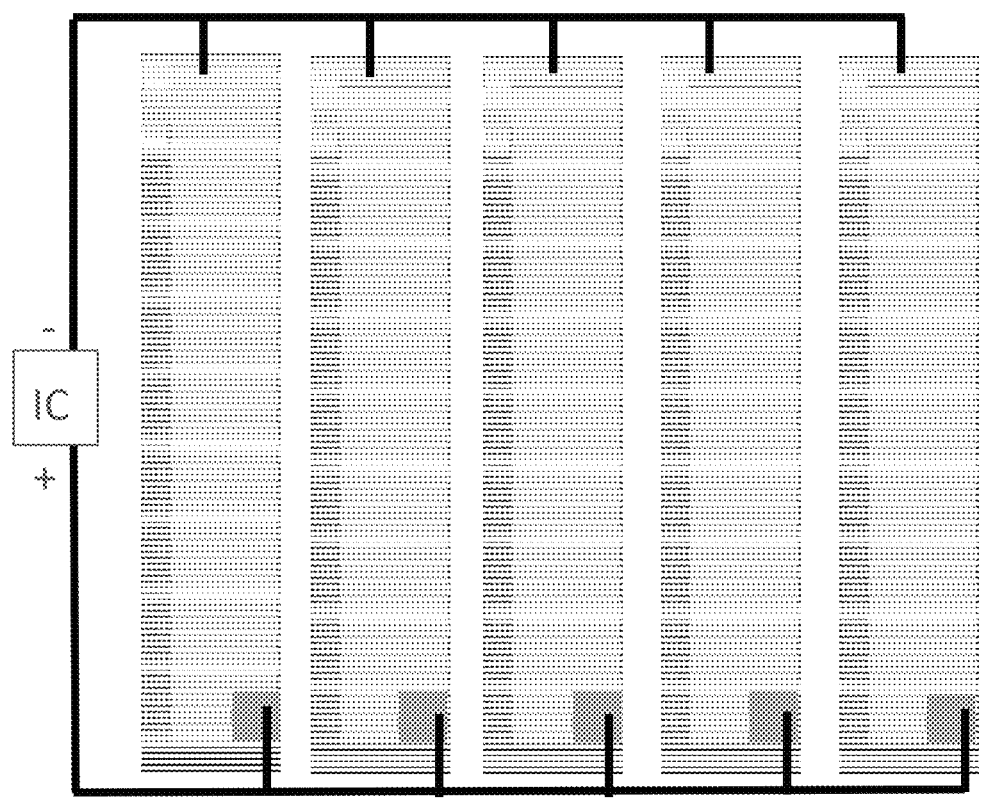
FIG. 31 illustrates photovoltaic materials electrically connected in parallel in accordance with certain embodiments of the invention.

To provide context, FIG. 31 illustrates how the photovoltaic materials may be interconnected in generating electrical energy in accordance with certain embodiments of the invention. In particular, FIG. 31 illustrates how a plurality of Venetian Blind structures can be electrically connected in parallel. Of course, it should be clear that the photovoltaic materials can be adjoined in any suitable way in accordance with embodiments of the invention. For example, in many embodiments, the photovoltaic materials are connected in series.

While particular embodiments and applications of the present invention have been illustrated and described herein, it is to be understood that the invention is not limited to the precise construction and components disclosed herein and that various modifications, changes, and variations may be made in the arrangement, operation, and details of the methods and apparatuses of the present invention without departing from the spirit and scope of the invention as it is defined in the appended claims.

What is claimed is:

1. An efficient power generation tile comprising; at least a first and a second solar concentrators where each of the first and second solar concentrators comprises an external reflective surface and an external non-reflective surface disposed opposite the reflective surface; at least one photovoltaic material with a solar receptive surface and a non-solar receptive surface disposed on the external non-reflective surface of the second solar concentrator such that the reflective surface of the first solar concentrator redirects incident solar radiation towards the at least one photovoltaic material such that the at least one photovoltaic material experiences a greater solar flux relative to the case where the first photovoltaic material experiences unaltered solar radiation; and microscale structures independently disposed upon the external non-reflective surface of the first and second solar concentrators such that the independently disposed microscale structures are exposed to the outer environment, wherein the maximum dimensions of each of the independent microscale structures is between approximately 1 µm and approximately 100 µm, wherein each of the microscale structures exposed to the outer environment increase the thermal emissivity of the first and second solar concentrators, respectively.

2. The efficient power generation tile of claim 1, wherein the first and second solar concentrators comprises a reflector and a substrate.

3. The efficient power generation tile of claim 2, wherein the reflector comprises one of: aluminum, silver, a dielectric material, and combinations thereof.

4. The efficient power generation tile of claim 3, wherein the substrate comprises KAPTON polyimide.

5. The efficient power generation tile of claim 4, wherein the thickness of the reflector is between approximately 2 µm and approximately 10 µm.

6. The efficient power generation tile of claim 5, wherein the thickness of the KAPTON polyimide substrate is approximately 10 µm.

7. The efficient power generation tile of claim 1, wherein the at least one photovoltaic material further comprises microscale structures disposed on the non-solar receptive surface of the at least one photovoltaic material.

8. The efficient power generation tile of claim 2, wherein at least one of the first and second solar concentrators comprises a reflector disposed on a substrate, and further comprises a spring.

9. The efficient power generation tile of claim 8, wherein the reflector and the spring are conductive.

10. The efficient power generation tile of claim 9, wherein at least one photovoltaic material is electrically connected to the conductive spring and to the conductive reflector and can thereby use them as electrical contacts.

11. The efficient power generation tile of claim 1, wherein at least one of the first and second solar concentrators comprises a reflector that comprises two conductive portions that are electrically isolated except that they are each connected to a photovoltaic material such that the photovoltaic material can use the conductive portions as electrical contacts.

12. The efficient power generation tile of claim 1, wherein at least one of the first and second solar concentrators comprises two conductive springs, and wherein the at least one photovoltaic material is coupled with each of the two conductive springs such that it can use them as electrical contacts.

13. The efficient power generation tile of claim 1, wherein the first and second solar concentrators comprises a primary reflector and a secondary reflector, wherein the primary reflector redirects incident solar radiation onto the secondary reflector, and wherein the secondary reflector redirects incident solar radiation onto the photovoltaic material.

14. The efficient power generation tile of claim 13, wherein the photovoltaic material is in thermal communication with the primary reflector.

15. The efficient power generation tile of claim 14, wherein the primary reflector conforms to a parabolic shape and the secondary reflector conforms to a hyperbolic shape.

16. The efficient power generation tile of claim 15, further comprising a radiative heat sink in thermal communication with the photovoltaic material.

17. The efficient power generation tile of claim 1, wherein each of the first and second solar concentrators are parabolic in shape.

18. The efficient power generation tile of claim 17, wherein each of the first and second solar concentrators comprises a reflector that comprises one of: aluminum, silver, a dielectric material, and combinations thereof.

* * * * *